US012593404B2

(12) United States Patent
Na et al.

(10) Patent No.: US 12,593,404 B2
(45) Date of Patent: Mar. 31, 2026

(54) CIRCUIT BOARD AND SEMICONDUCTOR PACKAGE COMPRISING SAME

(71) Applicant: LG INNOTEK CO., LTD., Seoul (KR)

(72) Inventors: Se Woong Na, Seoul (KR); Sang Il Kim, Seoul (KR); Kee Han Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 122 days.

(21) Appl. No.: 18/692,538

(22) PCT Filed: Sep. 14, 2022

(86) PCT No.: PCT/KR2022/013714
§ 371 (c)(1),
(2) Date: Mar. 15, 2024

(87) PCT Pub. No.: WO2023/043183
PCT Pub. Date: Mar. 23, 2023

(65) Prior Publication Data
US 2024/0381530 A1 Nov. 14, 2024

(30) Foreign Application Priority Data

Sep. 16, 2021 (KR) ........................ 10-2021-0124369

(51) Int. Cl.
*H05K 1/11* (2006.01)
*H01L 23/498* (2006.01)
(Continued)

(52) U.S. Cl.
CPC ........ *H05K 1/111* (2013.01); *H01L 23/49822* (2013.01); *H01L 23/49838* (2013.01); *H05K 3/3452* (2013.01); *H05K 3/429* (2013.01)

(58) Field of Classification Search
CPC ...... H05K 1/111; H05K 3/3452; H05K 3/429; H01L 23/49822; H01L 23/49838
(Continued)

(56) References Cited

U.S. PATENT DOCUMENTS 11,362,053 B2 6/2022 Jeong et al.
11,393,767 B2 7/2022 Bae et al.
(Continued)

FOREIGN PATENT DOCUMENTS

JP 2004-327743 11/2004
JP 2015-179730 10/2015
(Continued)

OTHER PUBLICATIONS

International Search Report dated Dec. 16, 2022 issued in Application No. PCT/KR2022/013714.
(Continued)

*Primary Examiner* — Andargie M Aychillhum
(74) *Attorney, Agent, or Firm* — KED & ASSOCIATES, LLP

(57) ABSTRACT

A circuit board according to an embodiment includes an insulating layer; a circuit pattern layer including a first metal layer disposed on the insulating layer; a protective layer disposed on the insulating layer, vertically overlapping the first metal layer, and including a recess portion having a step in a horizontal direction; and a second metal layer disposed in the recess portion of the protective layer, wherein the recess portion includes a portion having a width greater than a width of the first metal layer, and wherein the second metal layer is disposed in the portion of the recess portion with a width greater than the width of the first metal layer.

20 Claims, 35 Drawing Sheets

(51) Int. Cl.
   *H05K 3/3452*          (2026.01)
   *H05K 3/42*            (2006.01)
(58) Field of Classification Search
   USPC ....................................................... 174/262
   See application file for complete search history.

(56)                References Cited

U.S. PATENT DOCUMENTS

|              |     |         |                              |
| ------------ | --- | ------- | ---------------------------- |
| 11,676,923   | B2  | 6/2023  | Park et al.                  |
| 2004/0212969 | A1  | 10/2004 | Imamura et al.               |
| 2004/0253804 | A1  | 12/2004 | Beica et al.                 |
| 2007/0200249 | A1  | 8/2007  | Tanida et al.                |
| 2010/0065307 | A1* | 3/2010  | Nagase .............. H05K 1/021 |
|              |     |         |                     174/260   |
| 2012/0247822 | A1* | 10/2012 | Fuller, Jr. ......... H05K 3/4602 |
|              |     |         |                      29/829   |
| 2014/0037862 | A1  | 2/2014  | Lee et al.                   |
| 2017/0186677 | A1  | 6/2017  | Imafuji et al.               |

FOREIGN PATENT DOCUMENTS

| JP | 2017-118067    | 6/2017  |
| KR | 10-2004-0087883 | 10/2004 |
| KR | 10-2005-0083059 | 8/2005  |
| KR | 10-2007-0057704 | 6/2007  |
| KR | 10-2014-0018016 | 2/2014  |
| KR | 10-2021-0024849 | 3/2021  |
| KR | 10-2021-0042212 | 4/2021  |
| KR | 10-2021-0051536 | 5/2021  |
| KR | 10-2021-0094329 | 7/2021  |

OTHER PUBLICATIONS

Korean Office Action dated Jun. 12, 2025, issued in Application No. 10-2021-0124369.

* cited by examiner

【FIG. 1A】
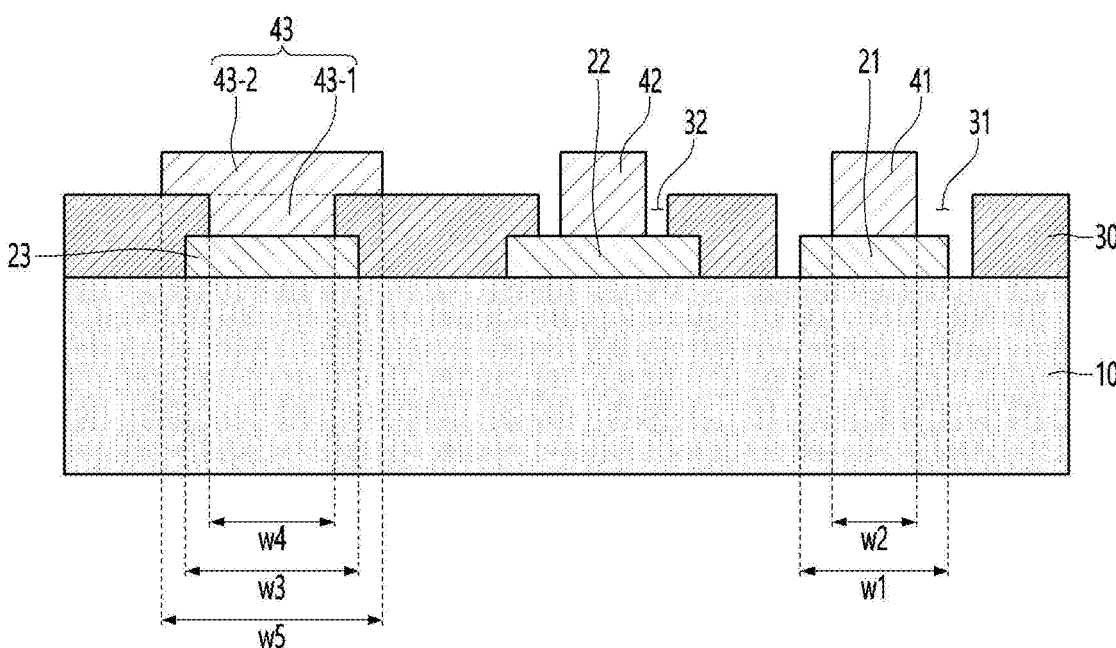

【FIG. 1B】
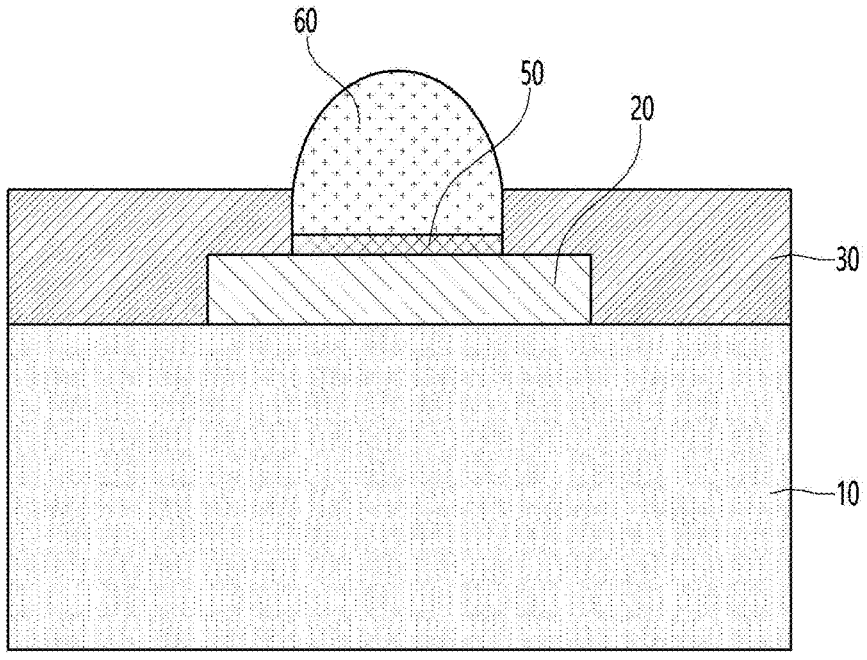
【FIG. 1C】
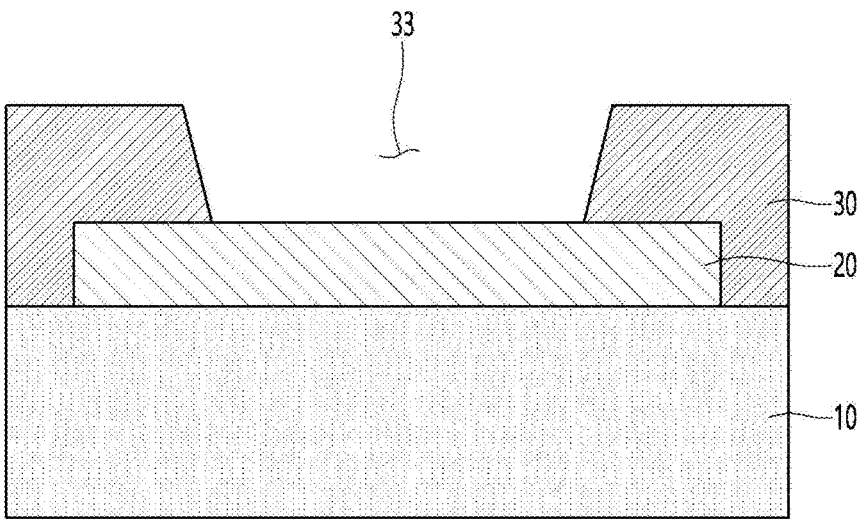

【FIG. 1D】
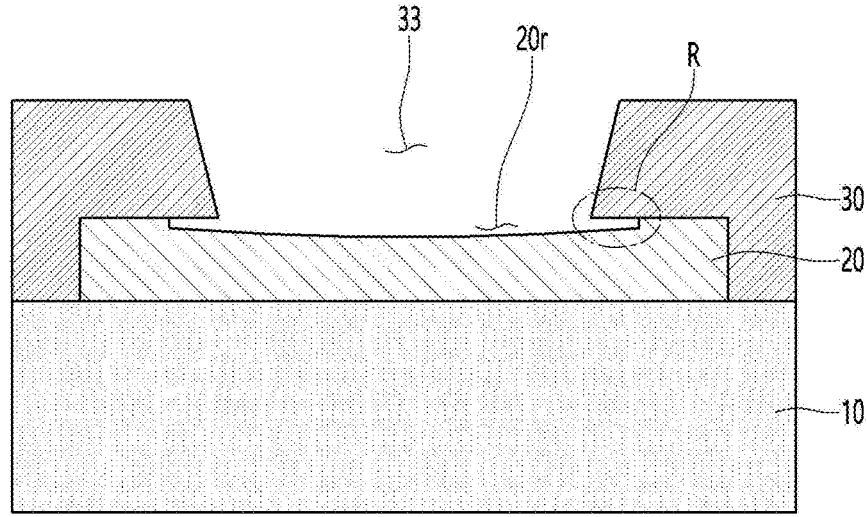
【FIG. 1E】
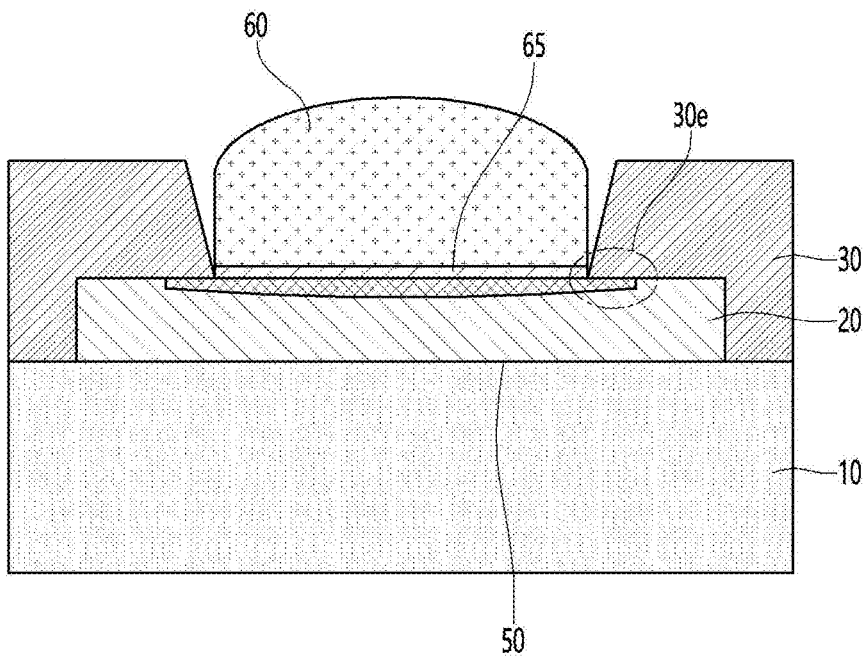

【FIG. 2A】
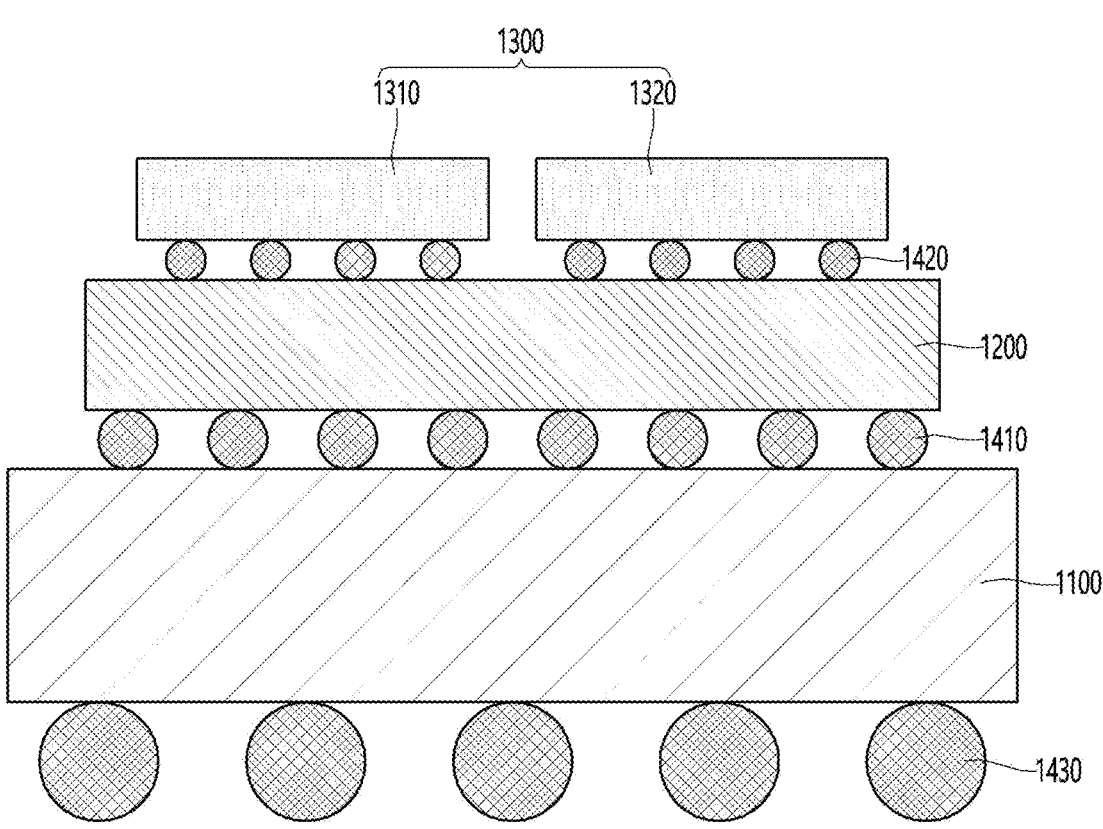

【FIG. 2B】
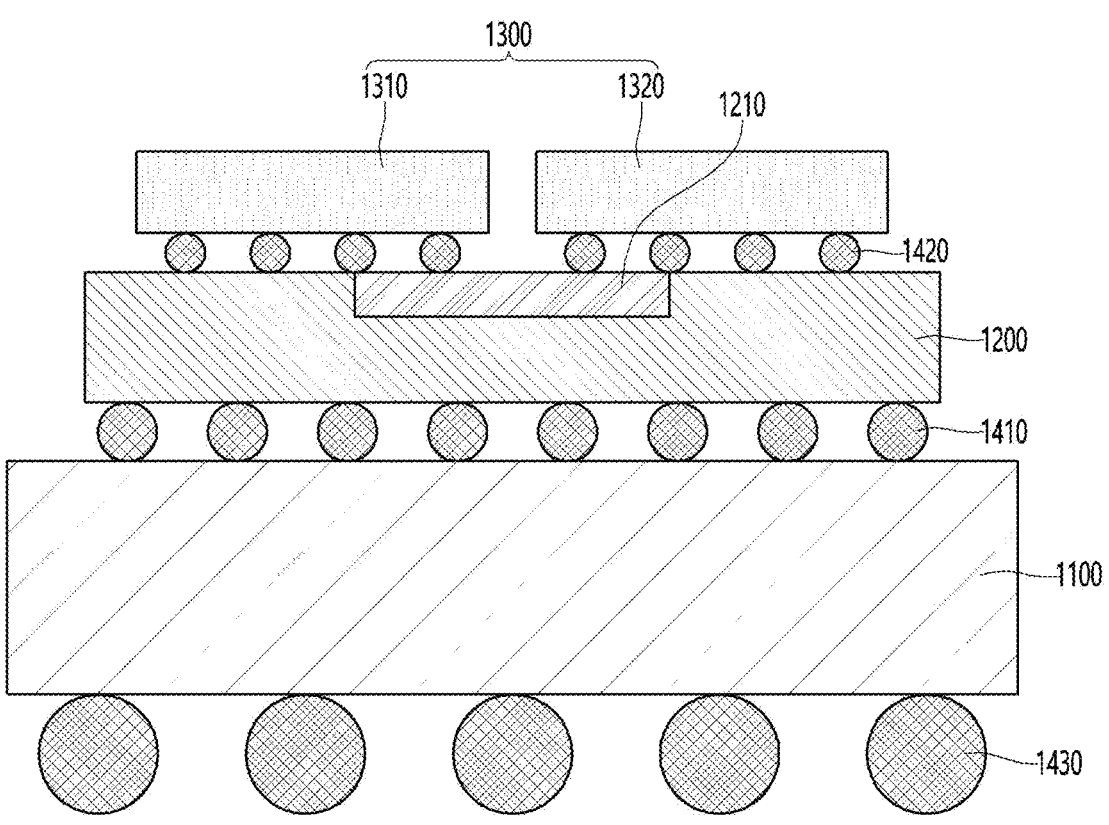

【FIG. 2C】
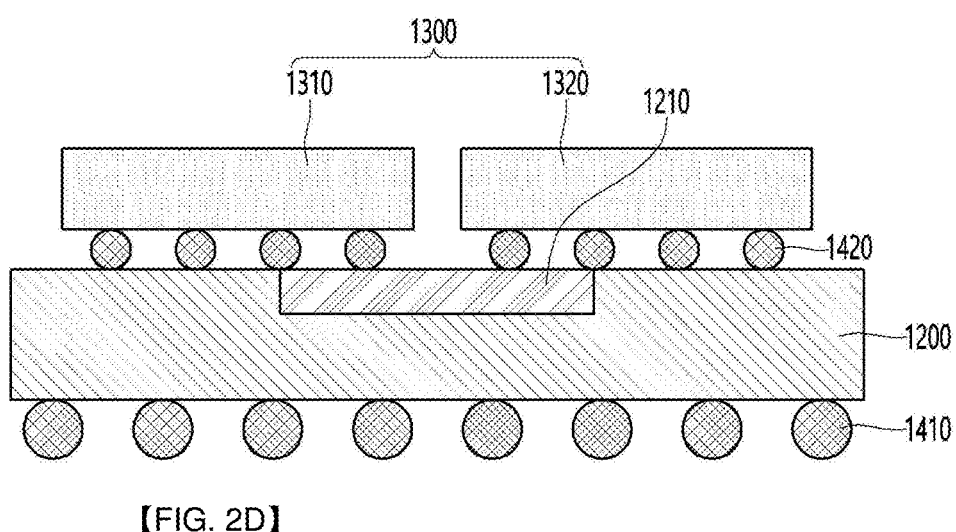
【FIG. 2D】
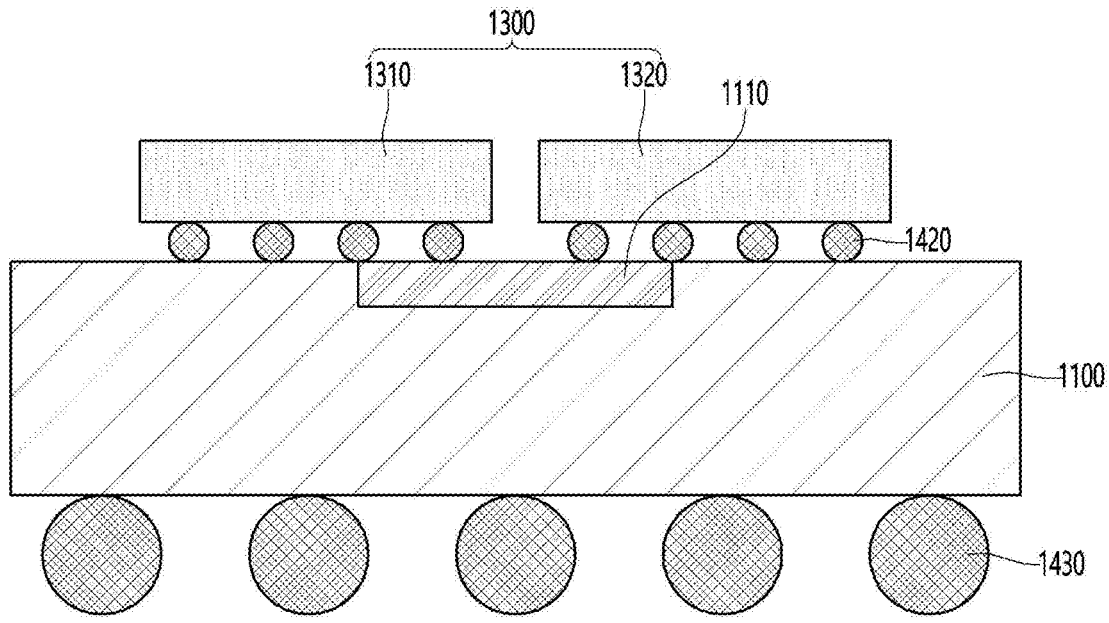

【FIG. 2E】
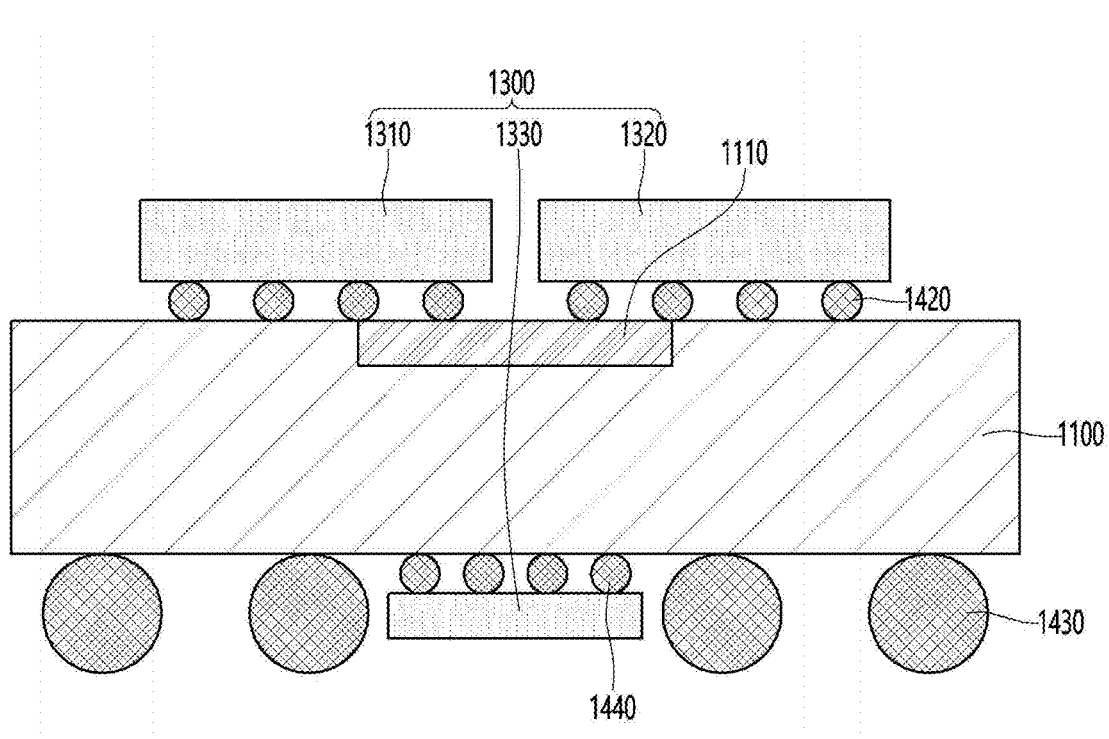

【FIG. 2F】
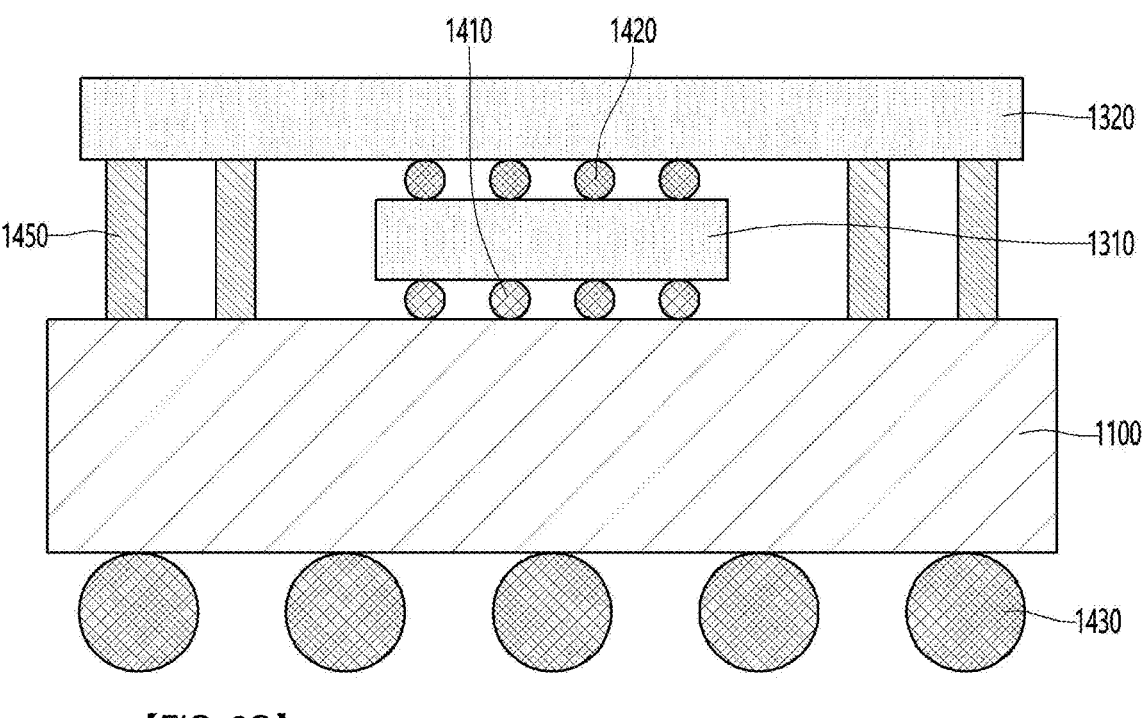
【FIG. 2G】
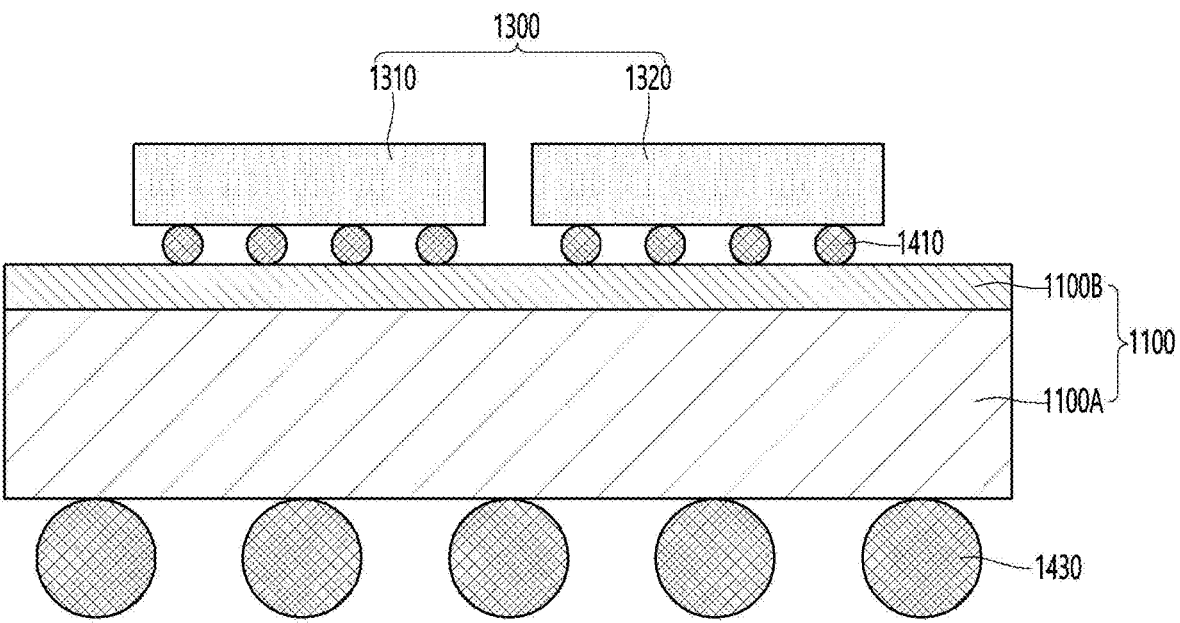

[FIG. 3A]
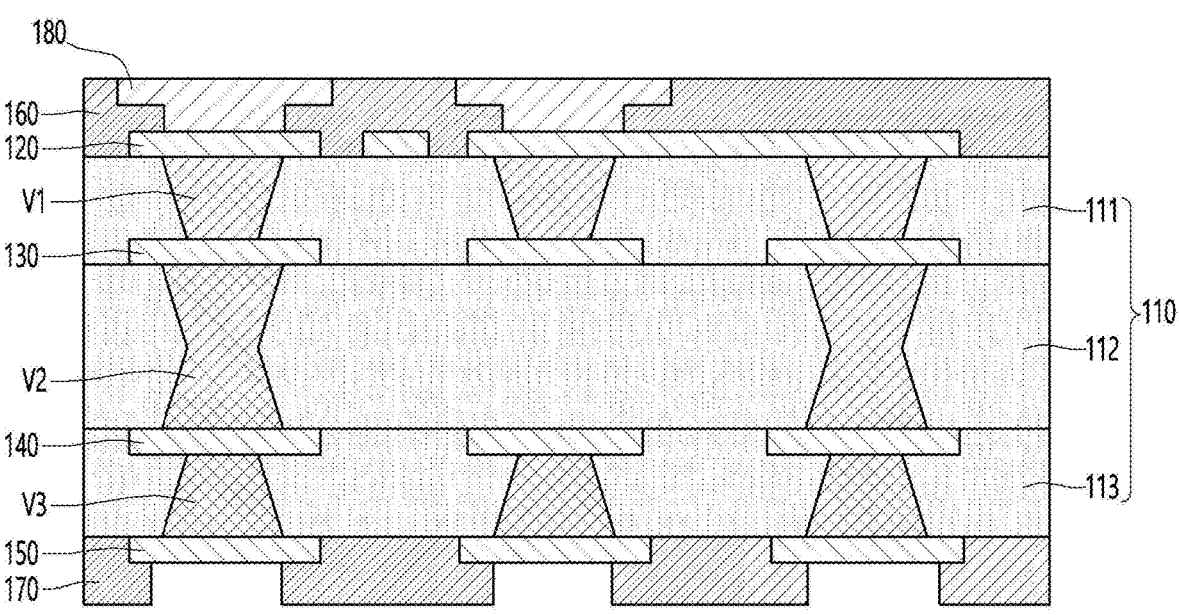

【FIG. 3B】
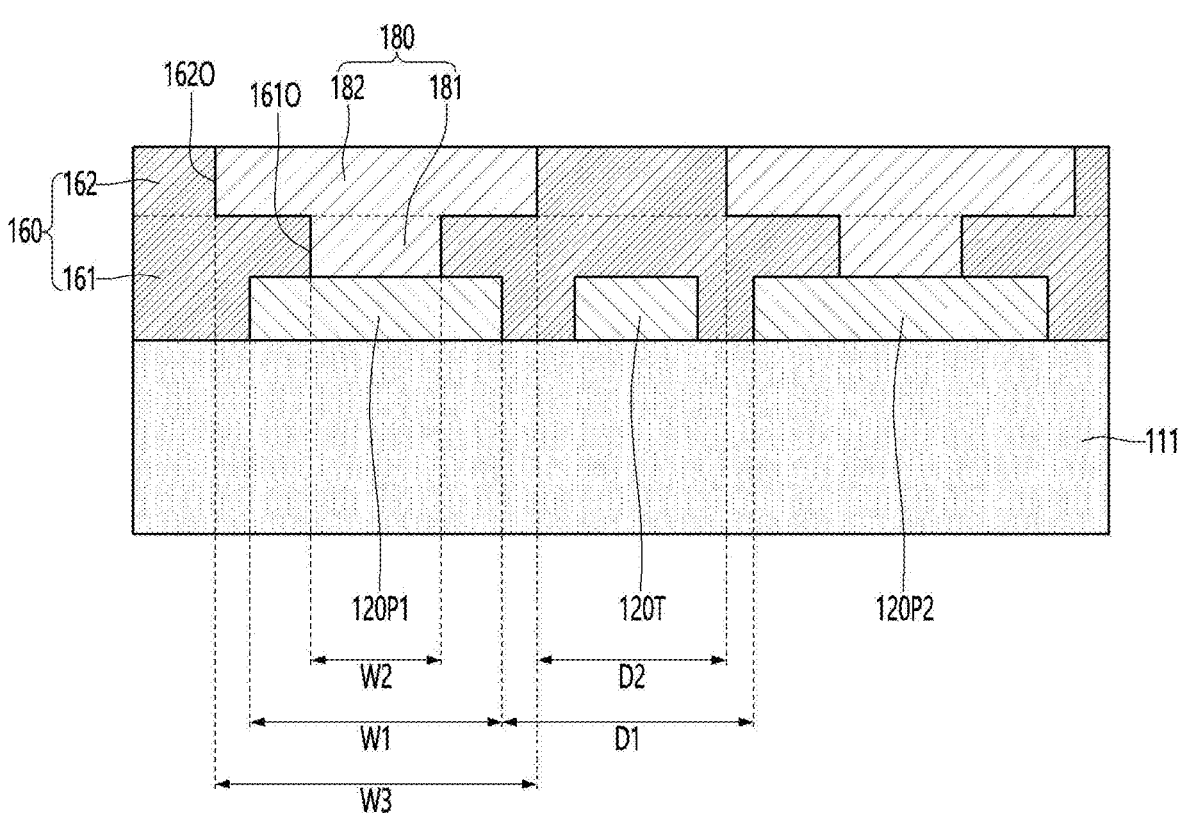

【FIG. 3C】
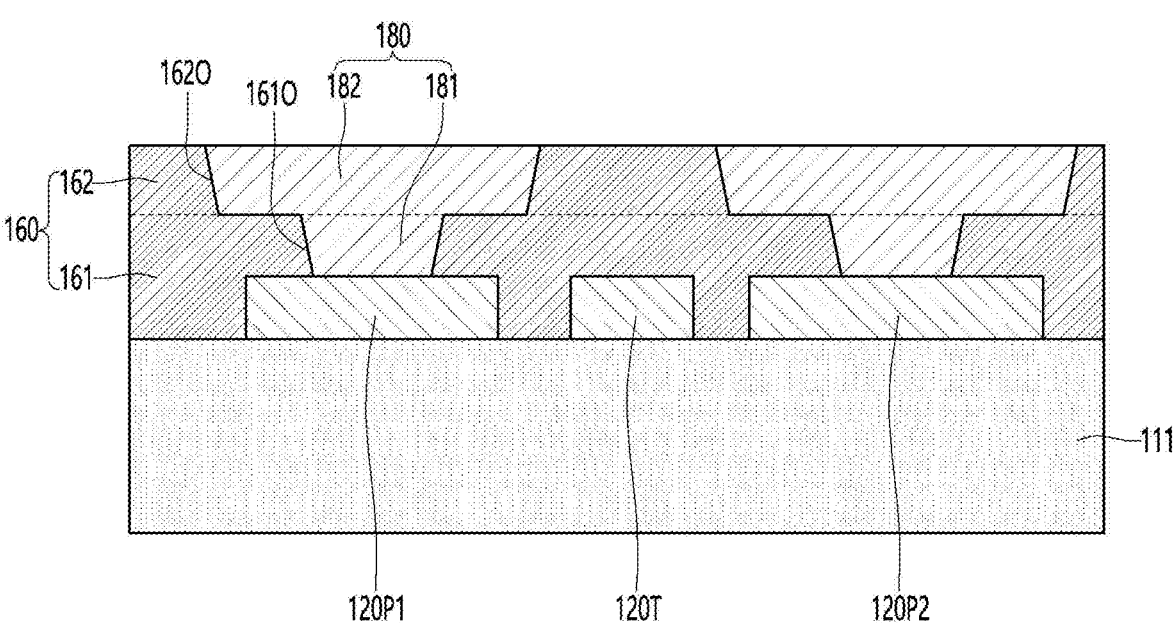

【FIG. 3D】
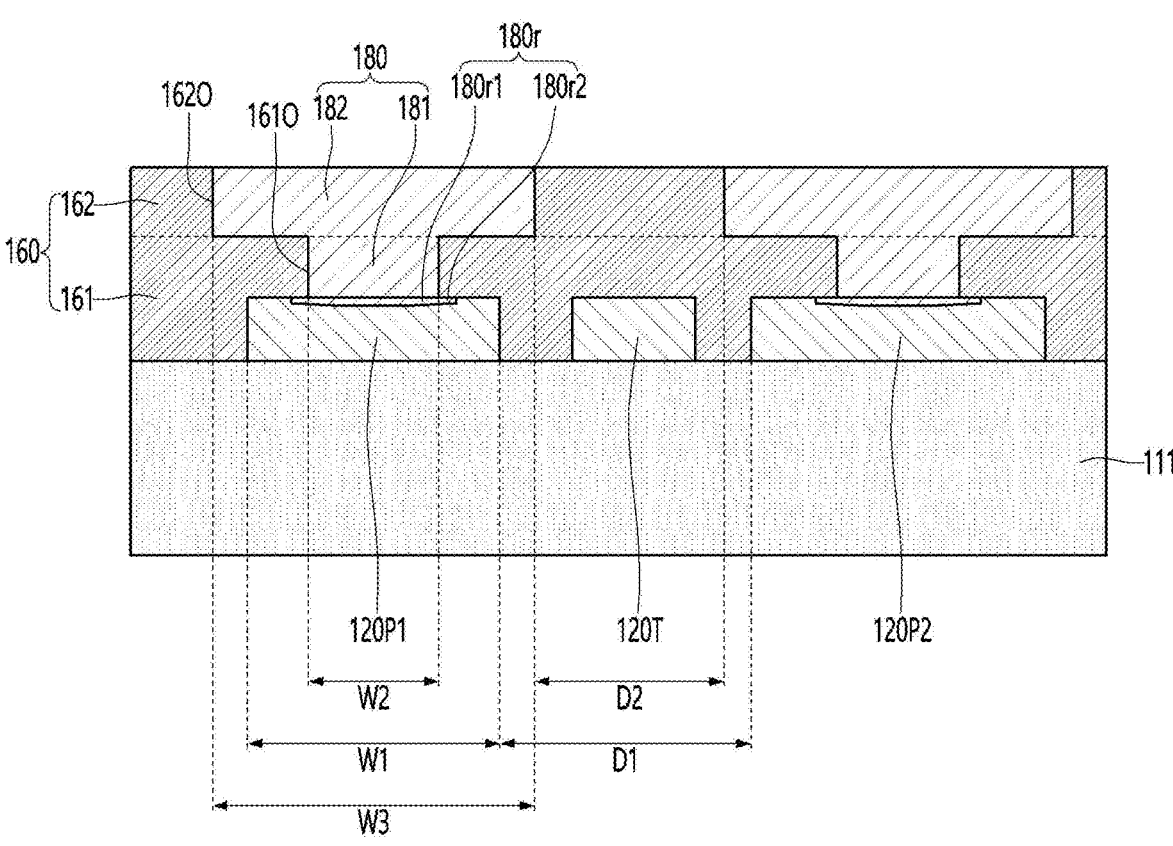

【FIG. 3E】
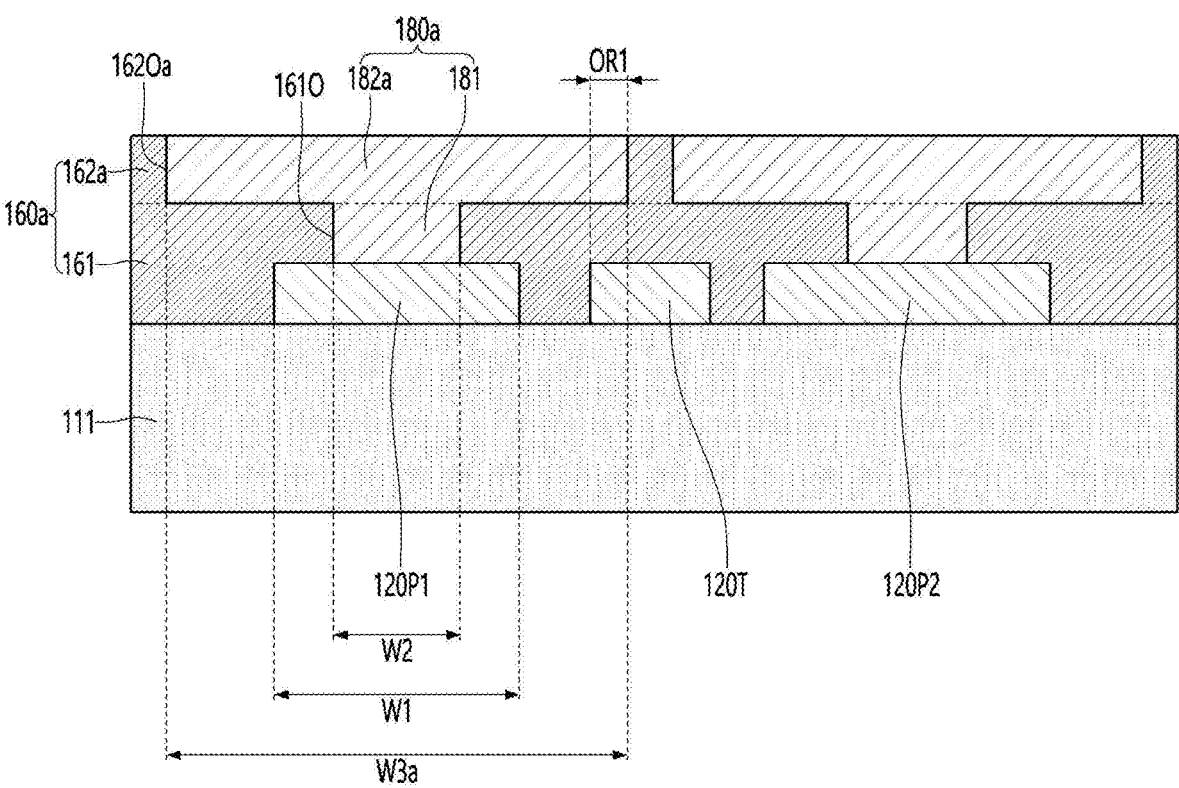

【FIG. 3F】
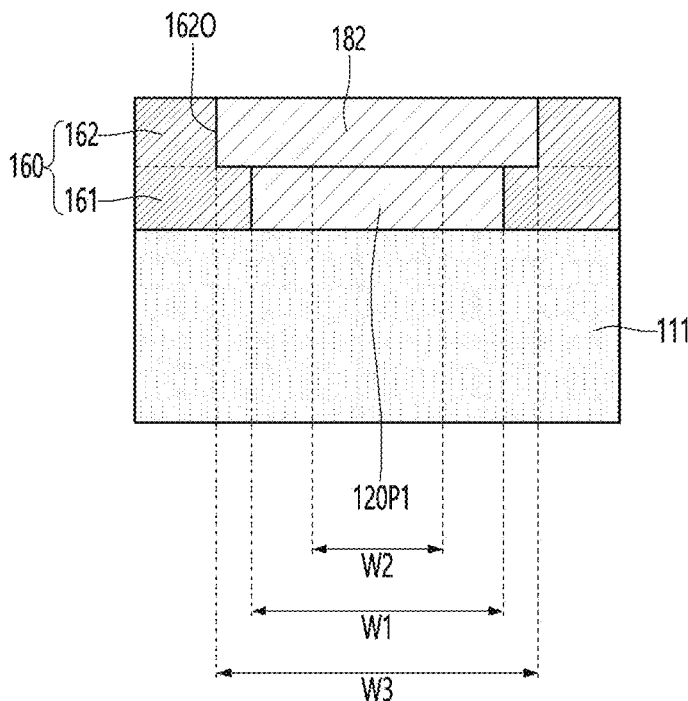

【FIG. 4A】
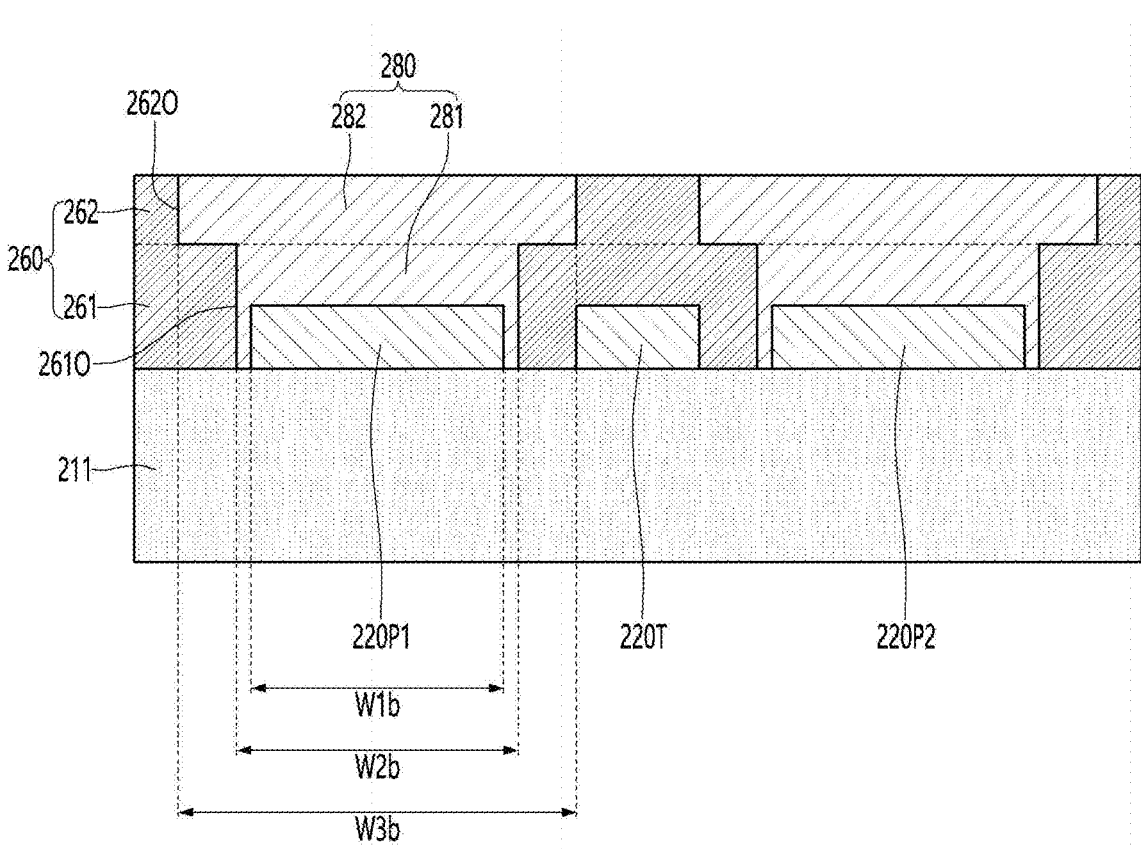

【FIG. 4B】
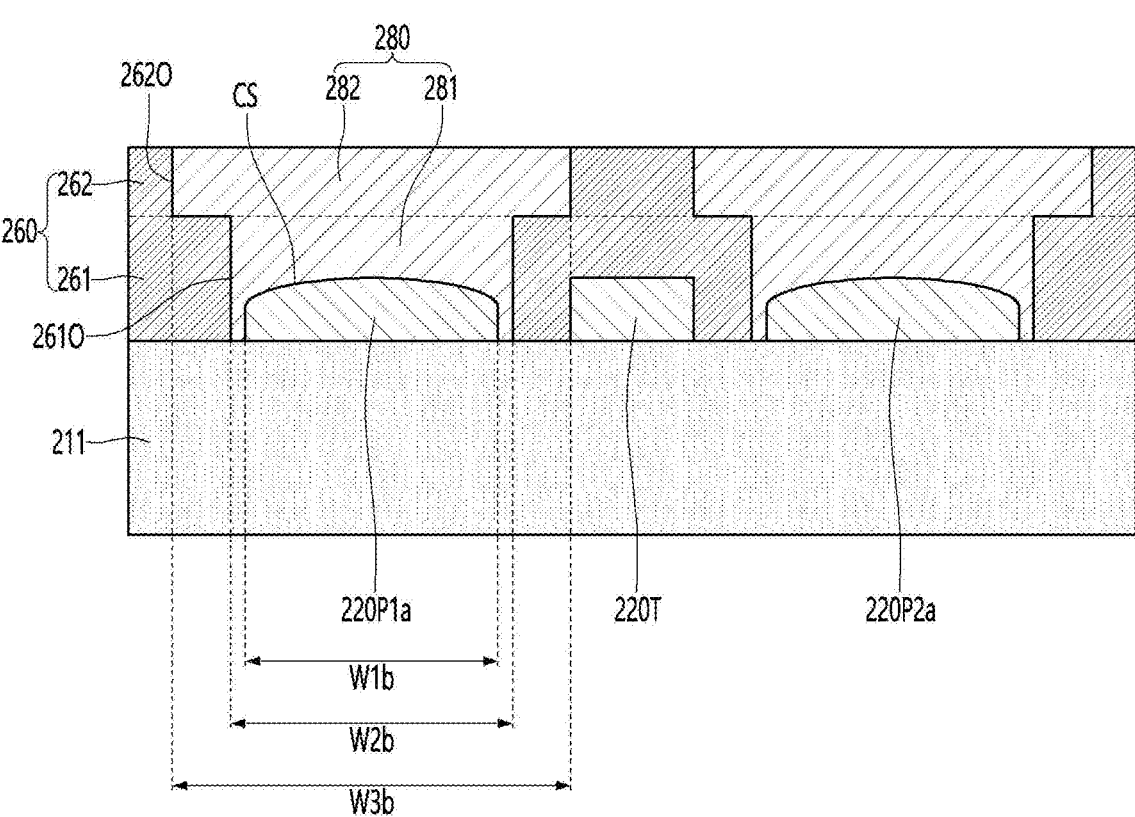

【FIG. 5】
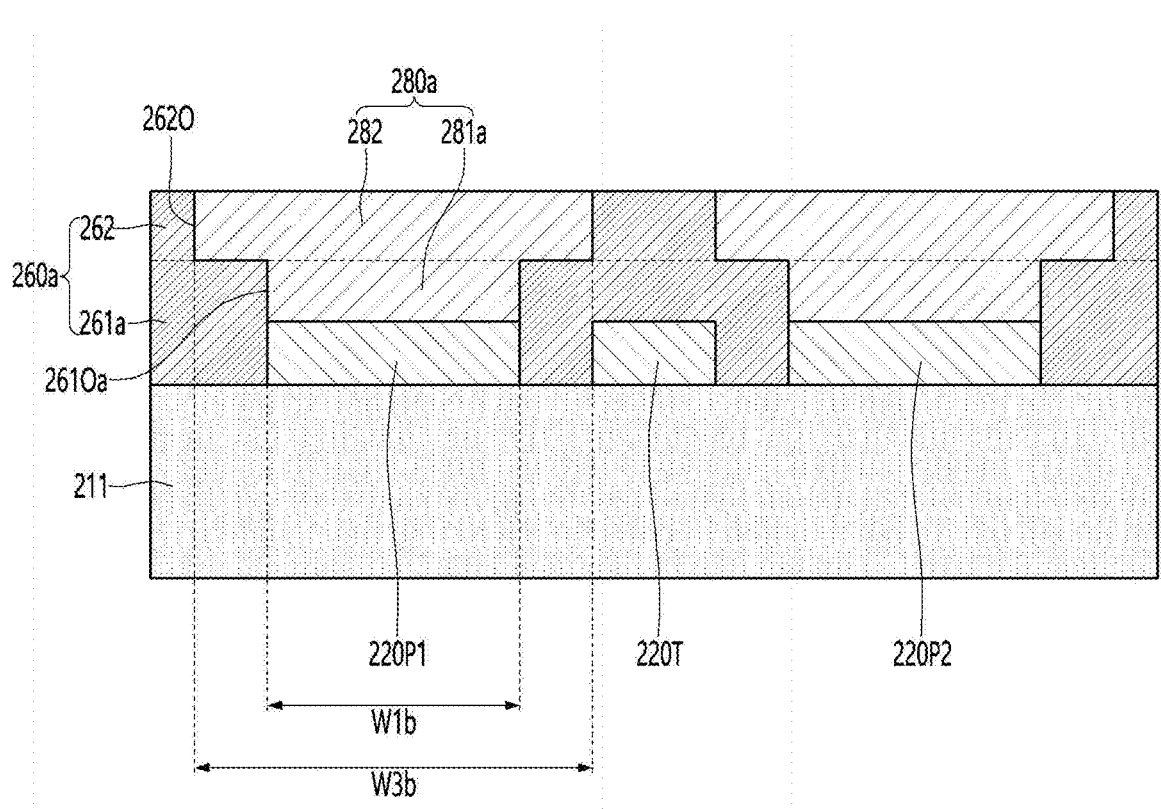

【FIG. 6】
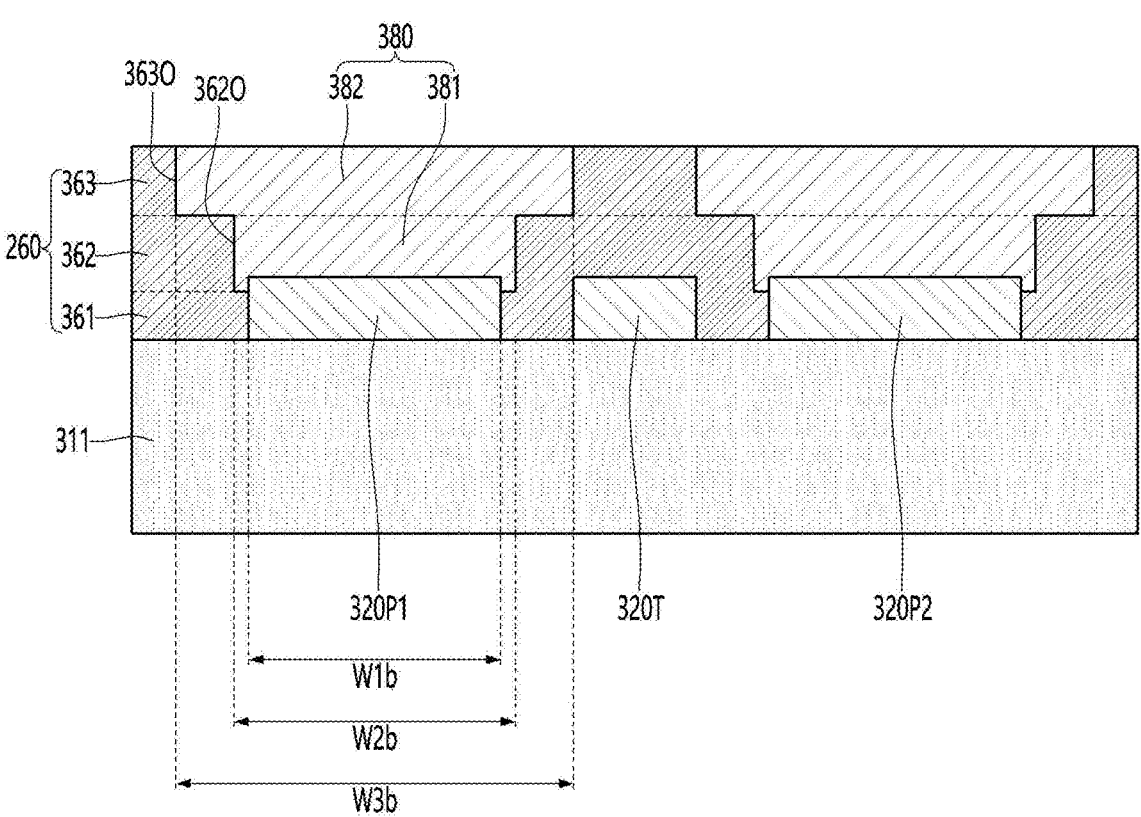

【FIG. 7A】
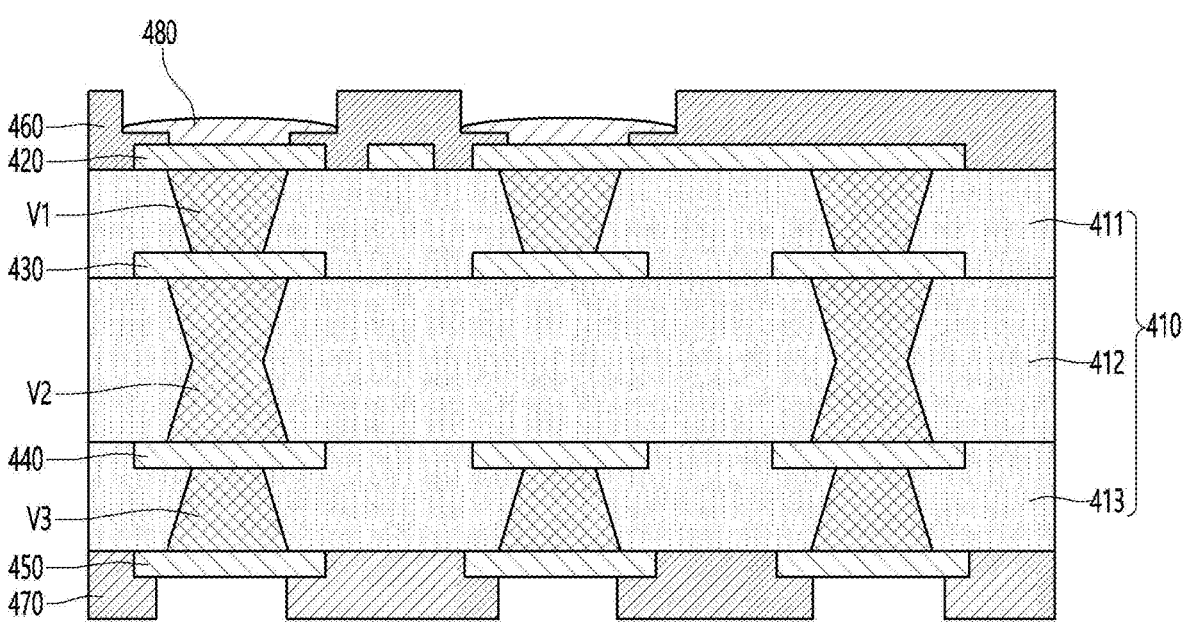

【FIG. 7B】
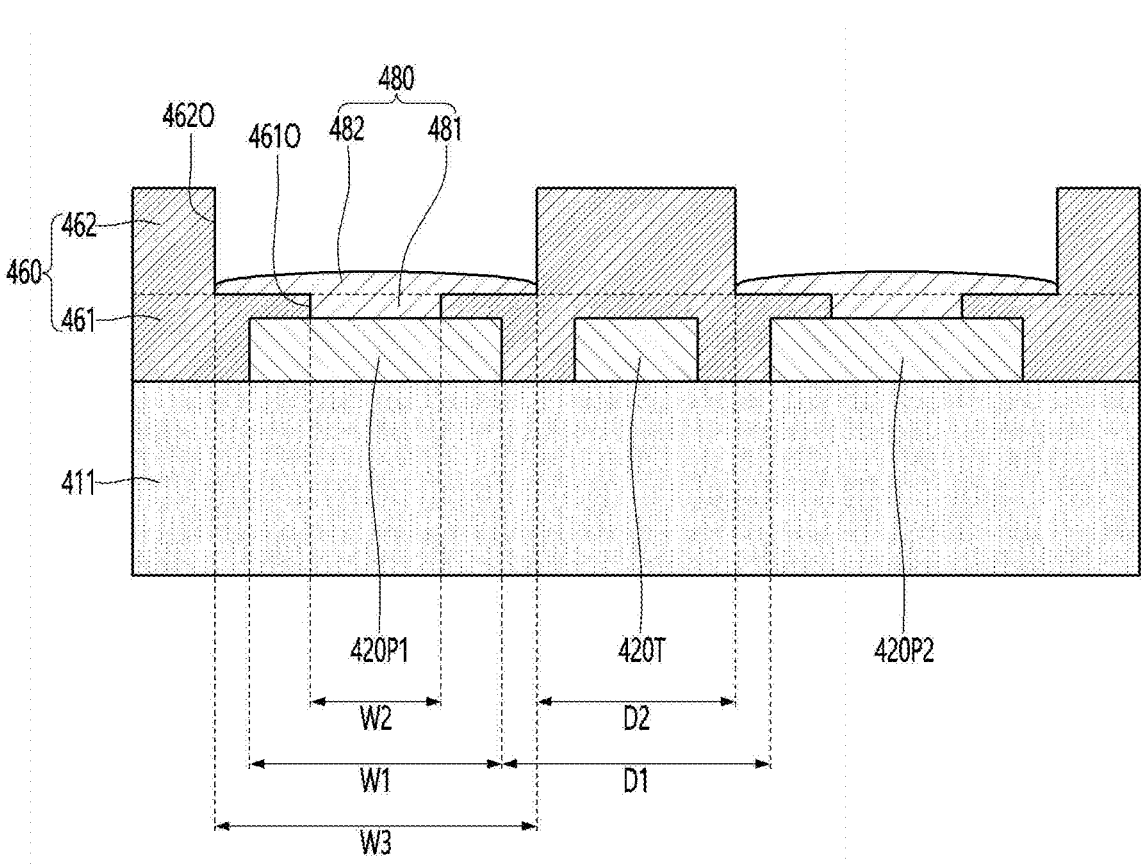

【FIG. 7C】
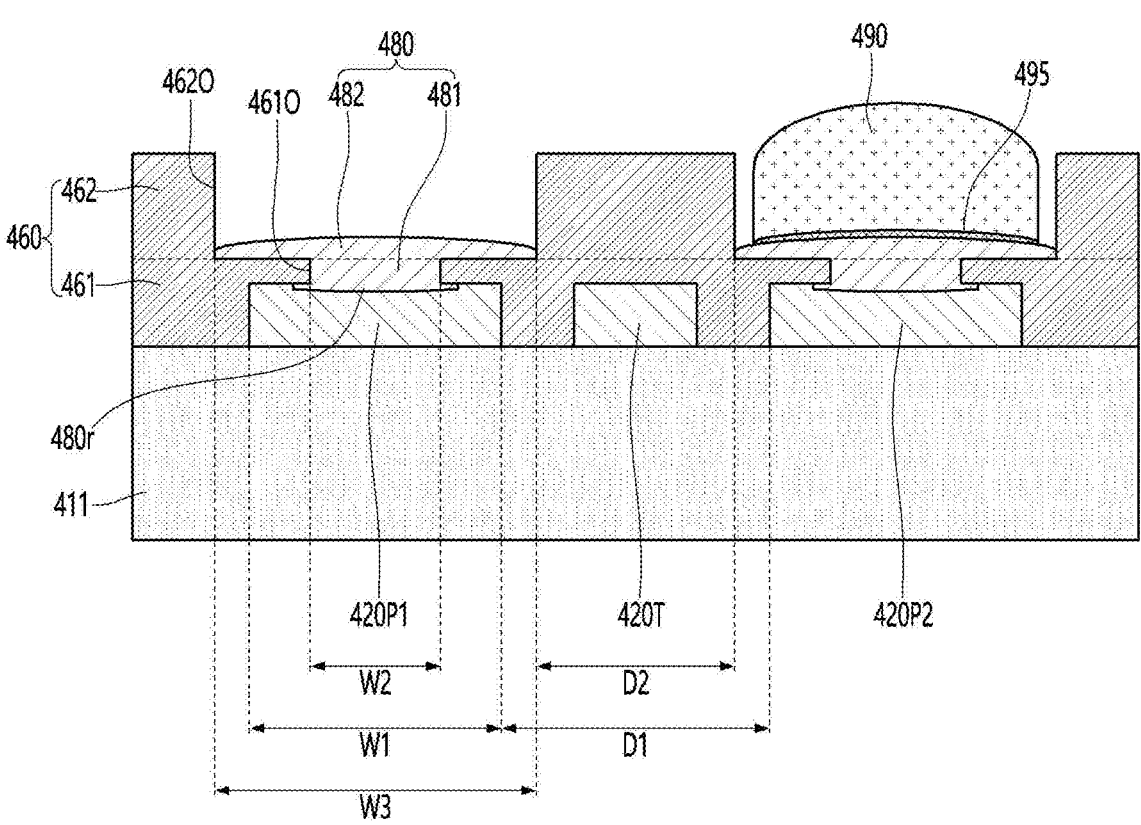

【FIG. 8】
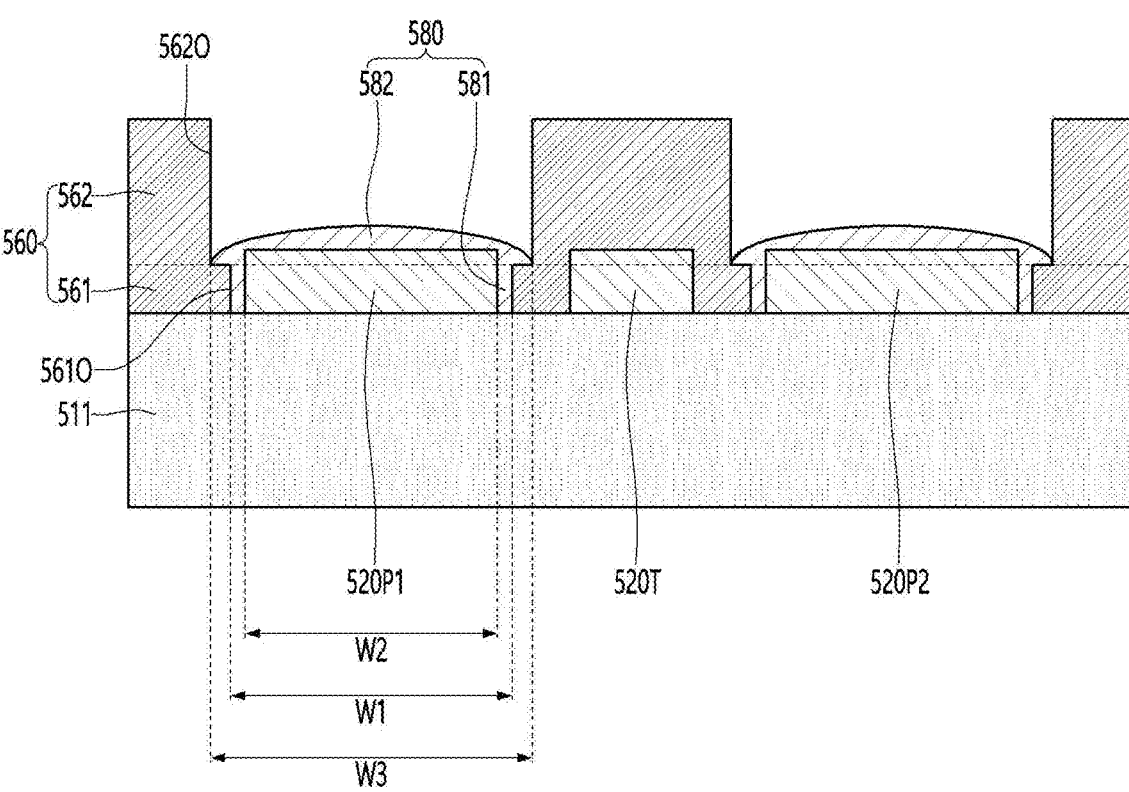

【FIG. 9A】
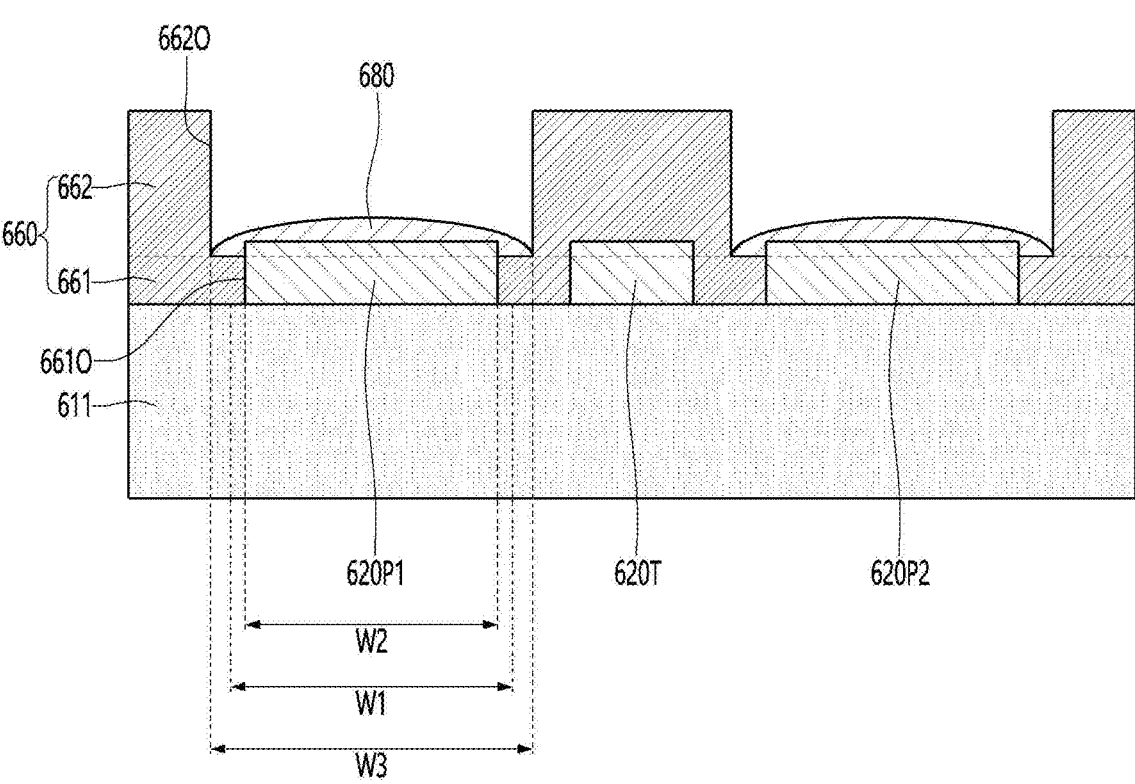

【FIG. 9B】
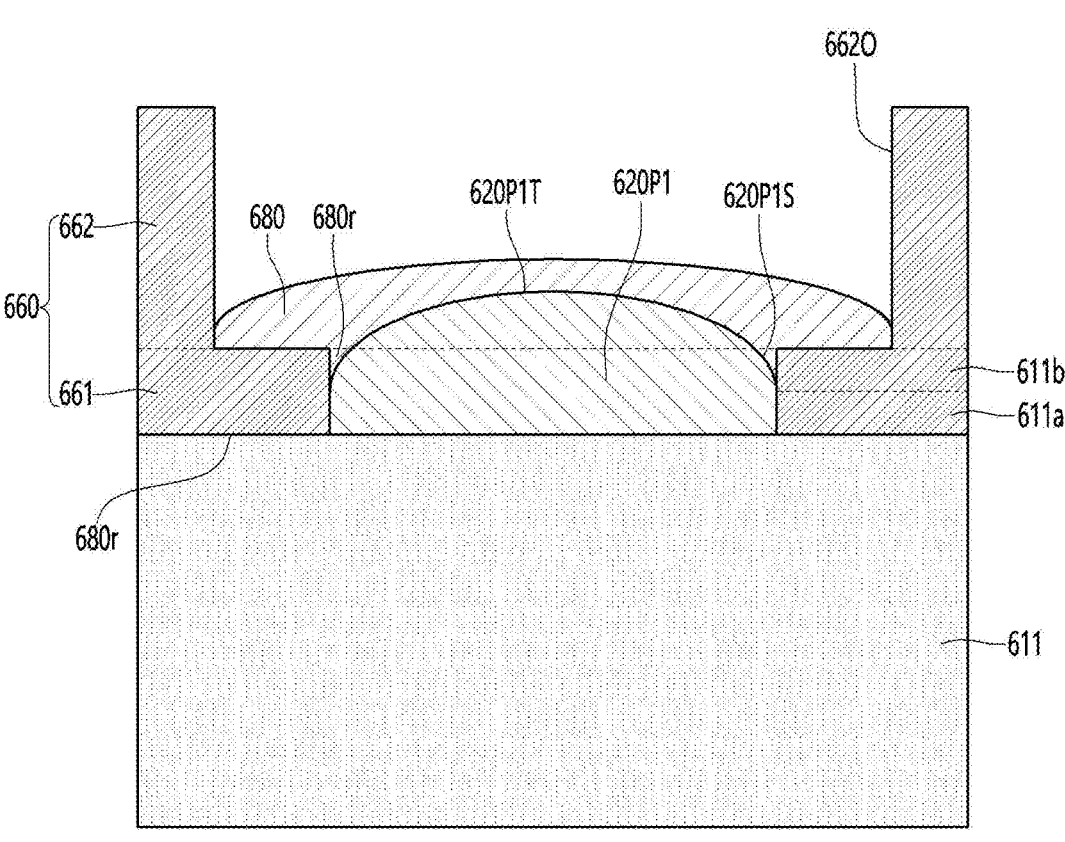

【FIG. 9C】
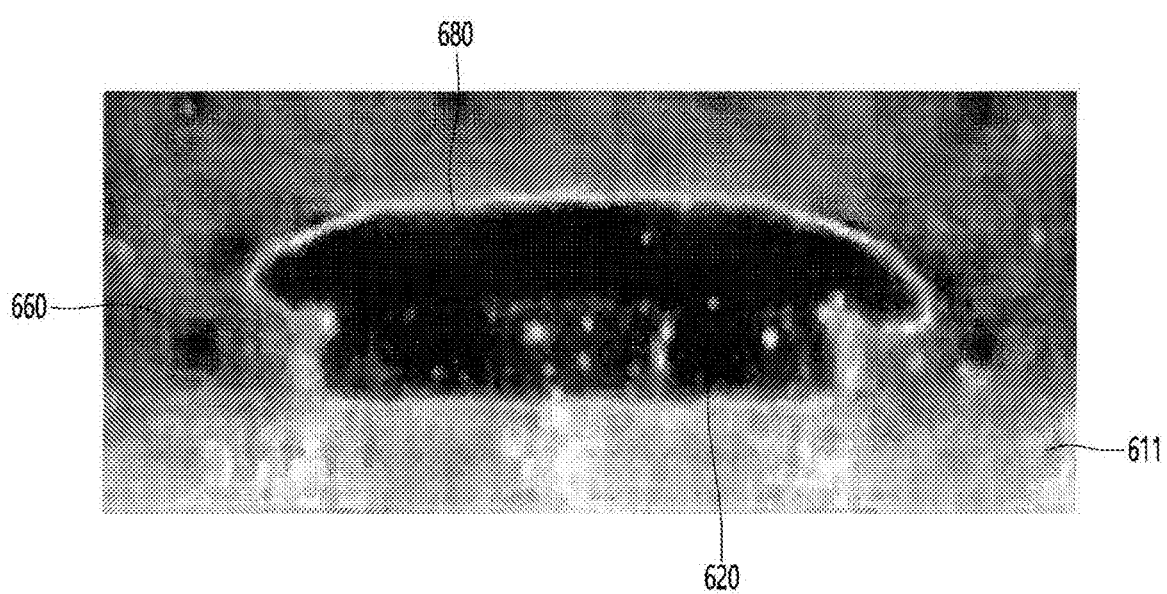

【FIG. 10】
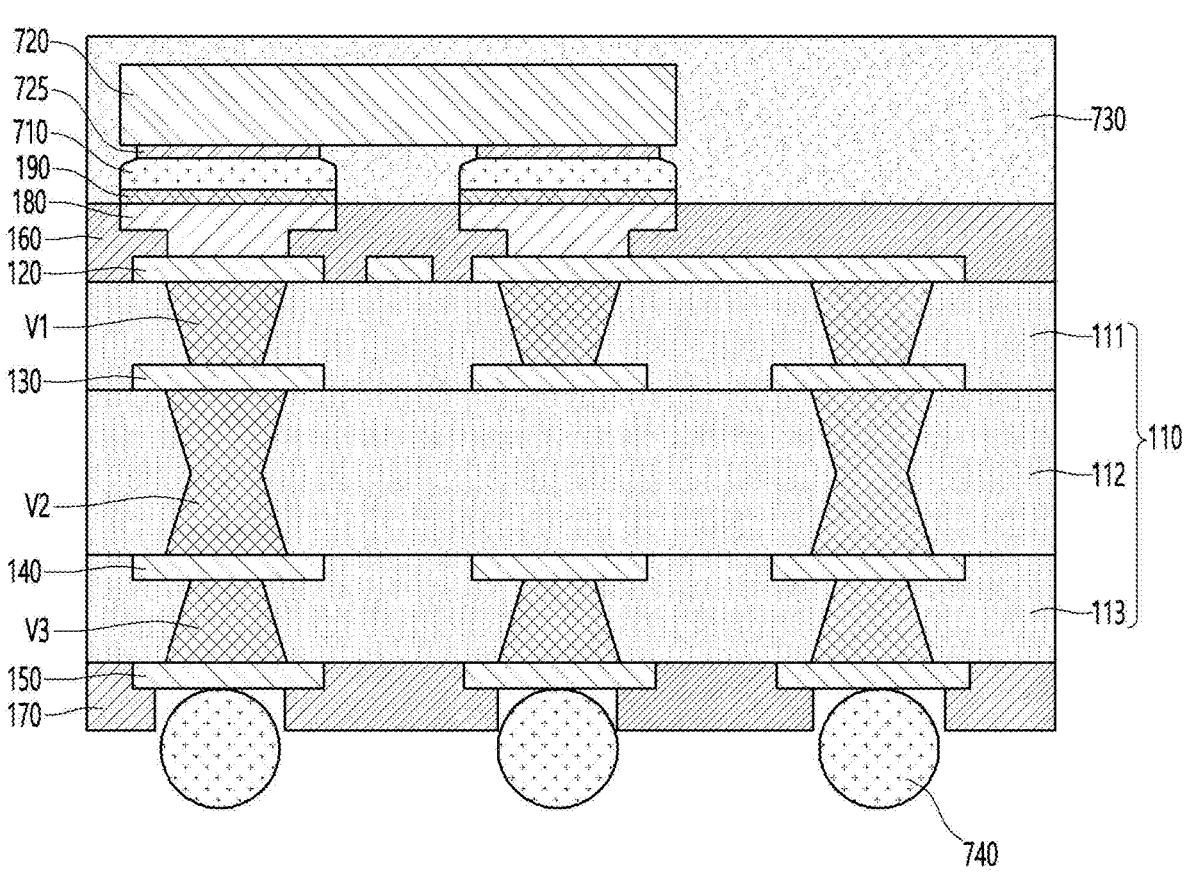

【FIG. 11】
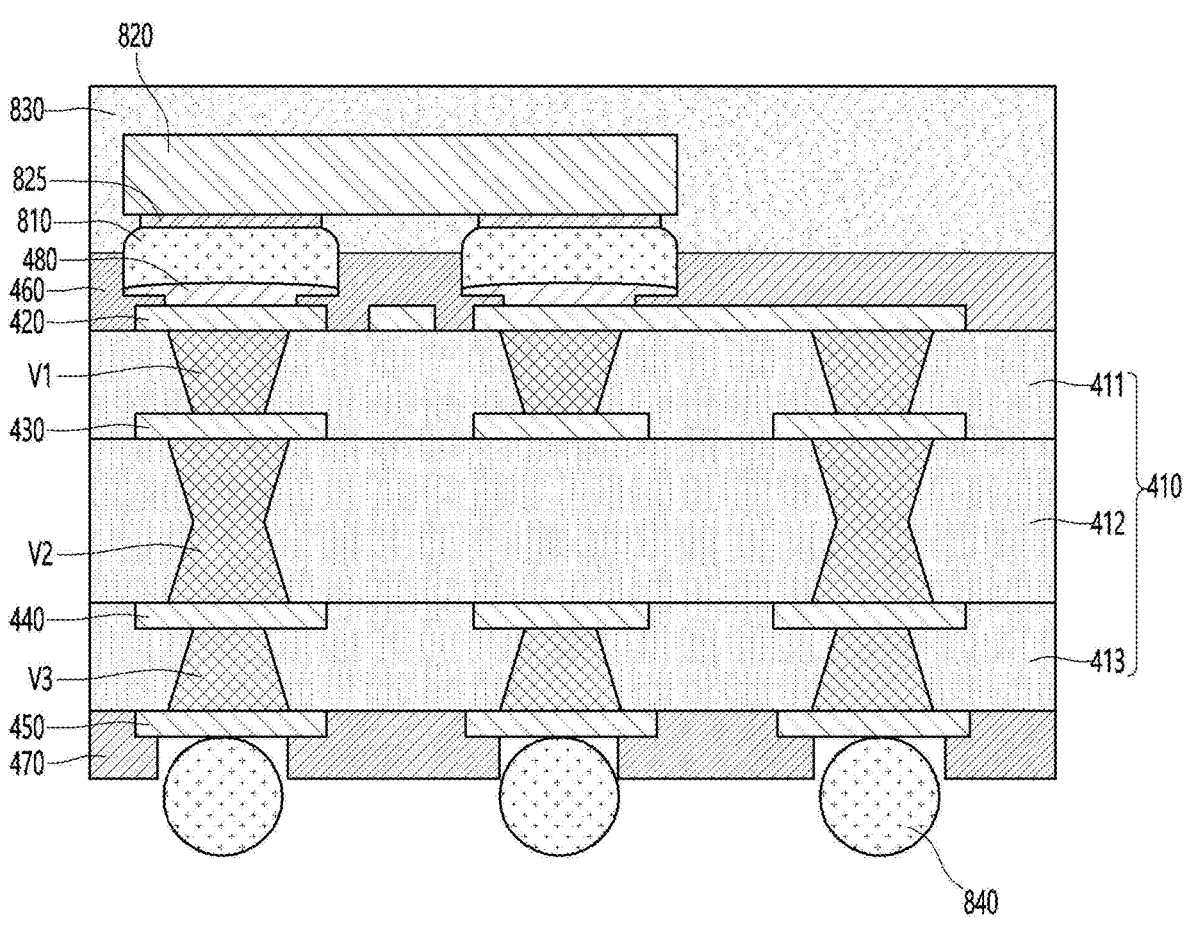

【FIG. 12A】
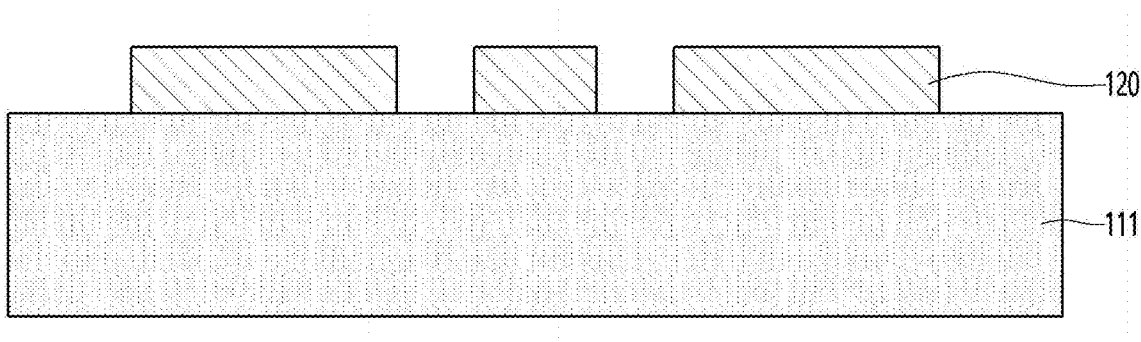
【FIG. 12B】
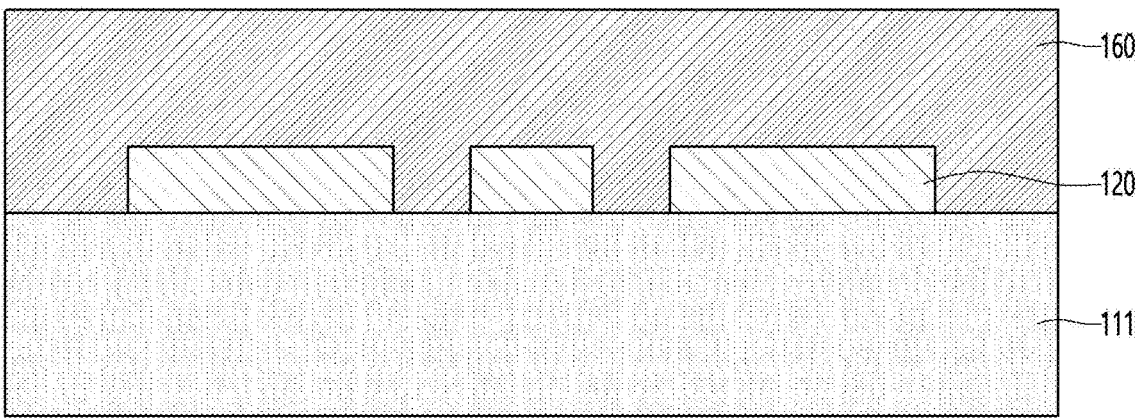

【FIG. 12C】
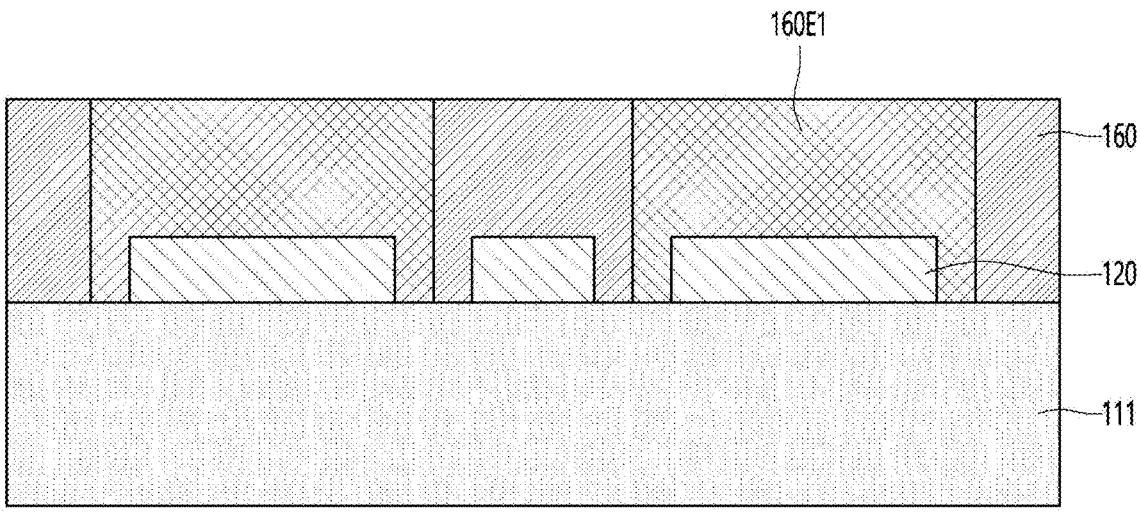
【FIG. 12D】
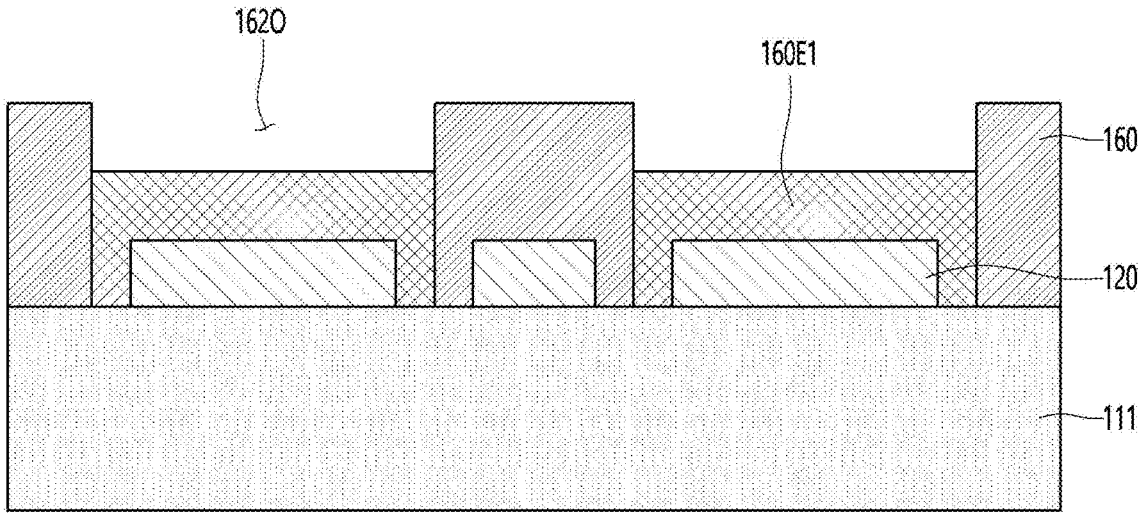

【FIG. 12E】
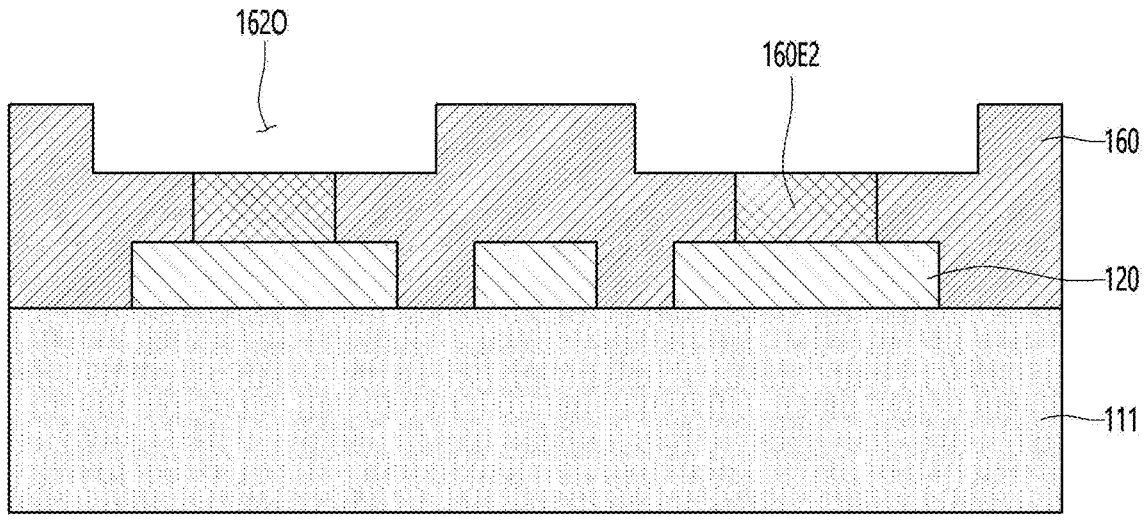
【FIG. 12F】
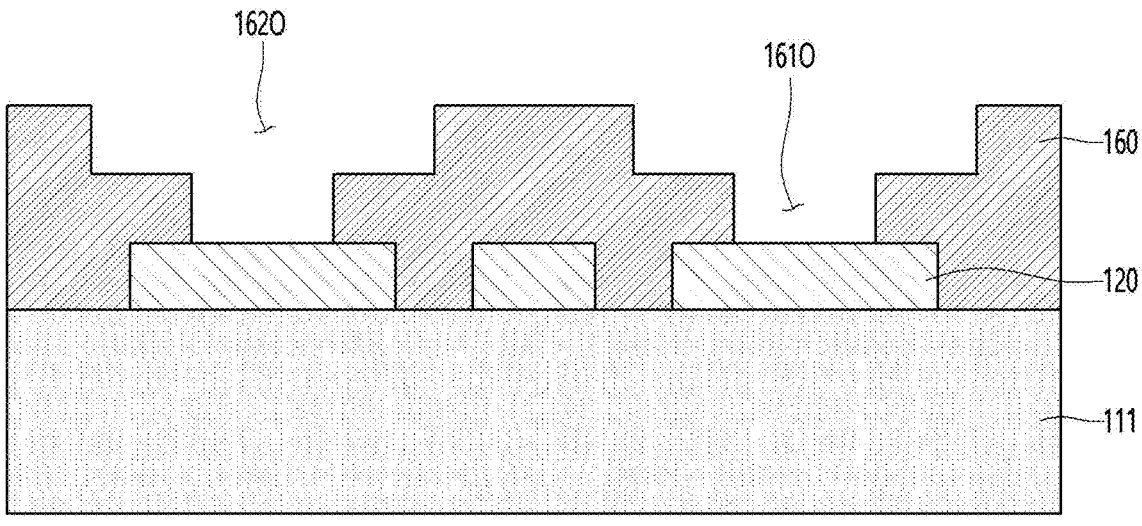

【FIG. 12G】
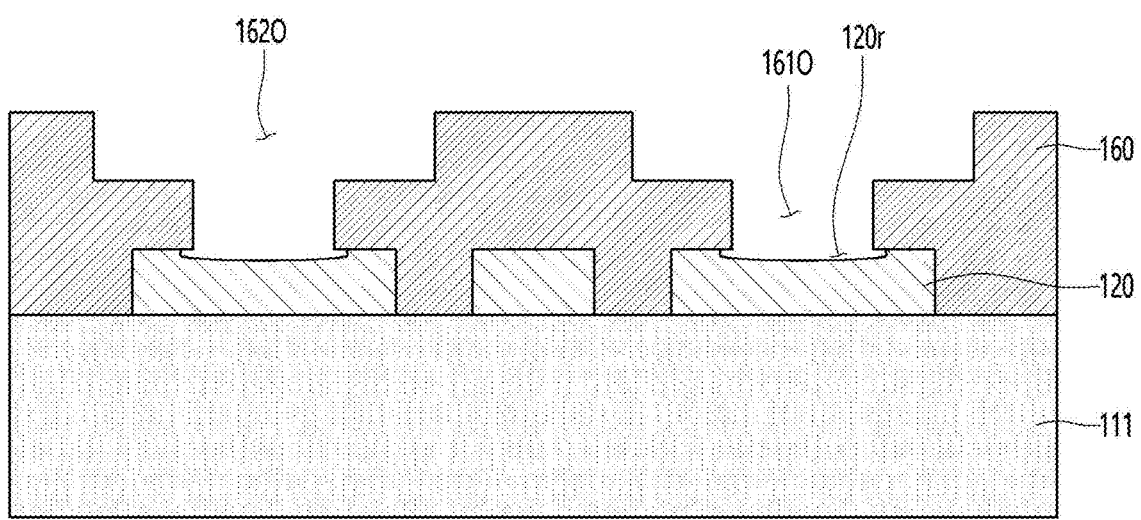
【FIG. 12H】
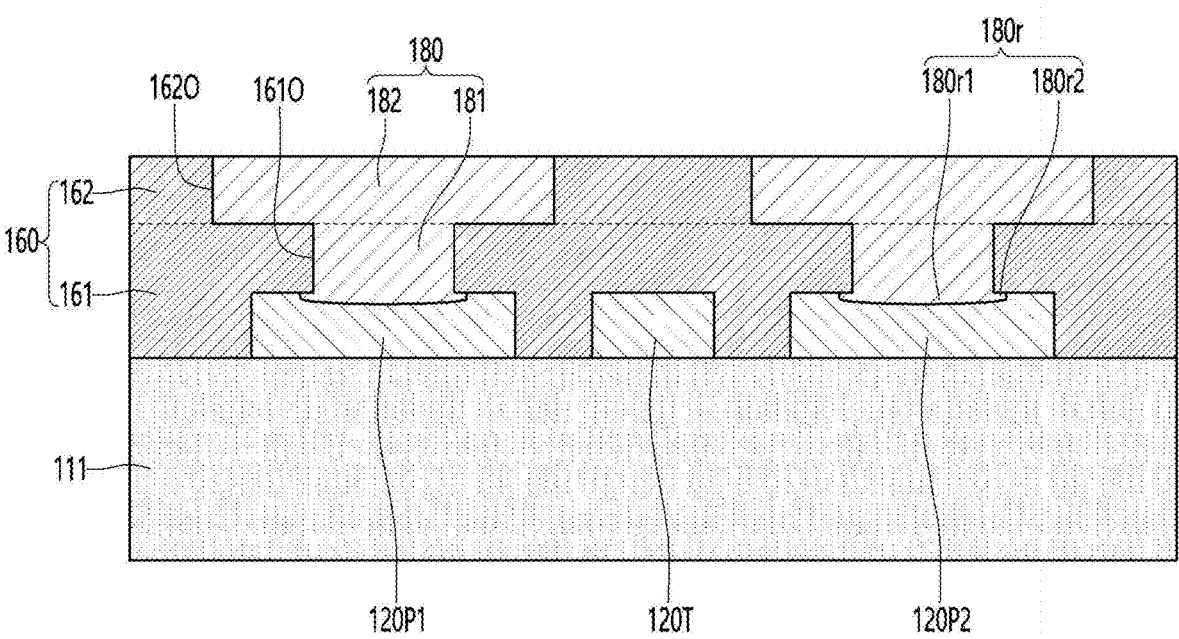

【FIG. 12I】
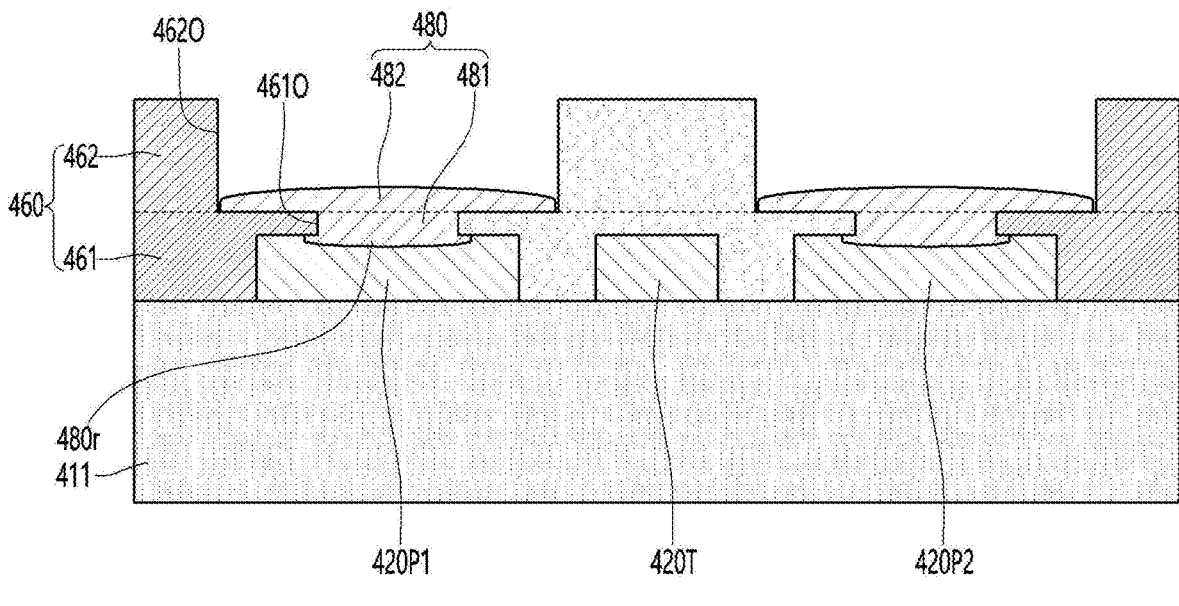
【FIG. 13A】
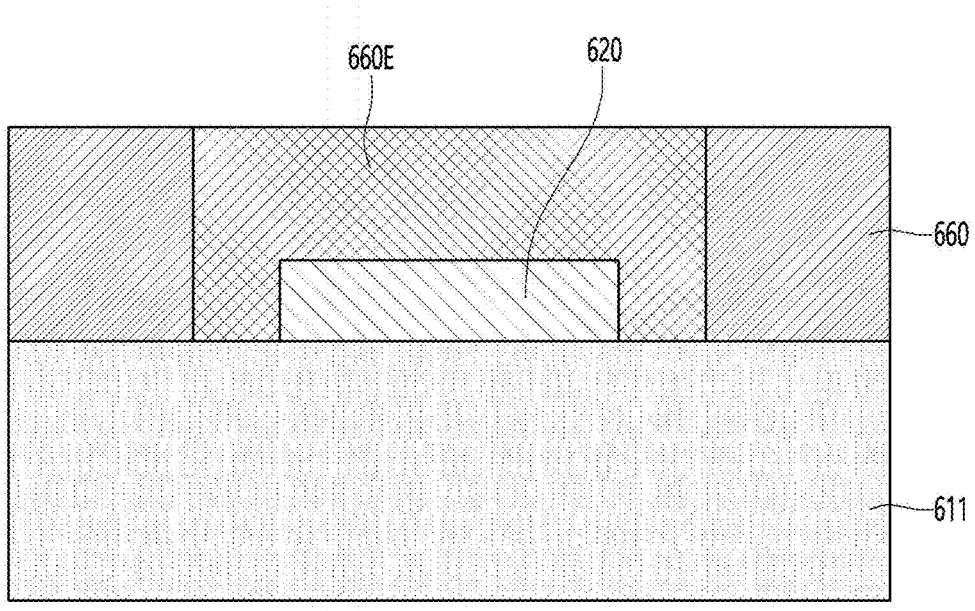

【FIG. 13B】
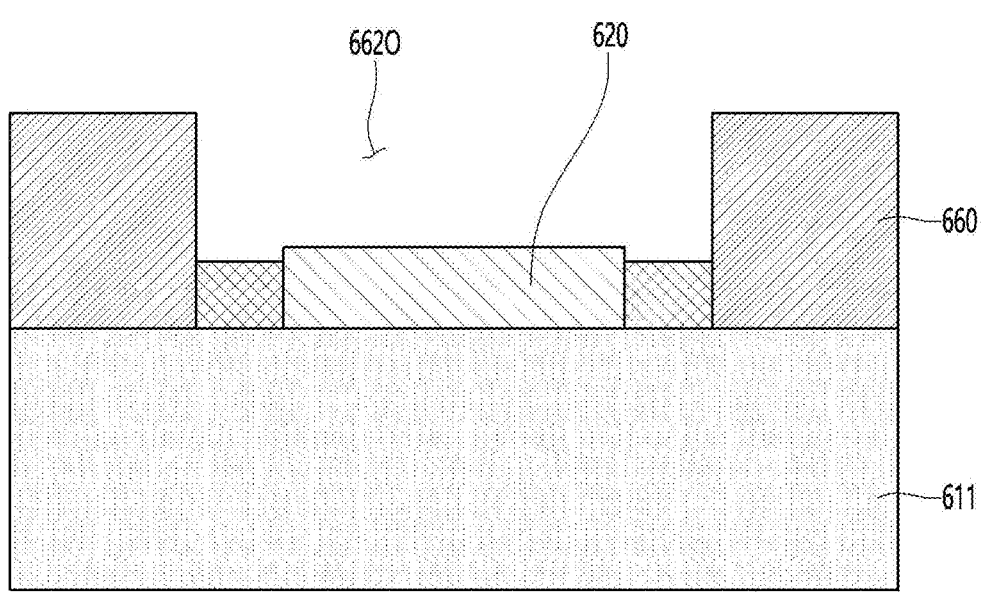

【FIG. 13C】
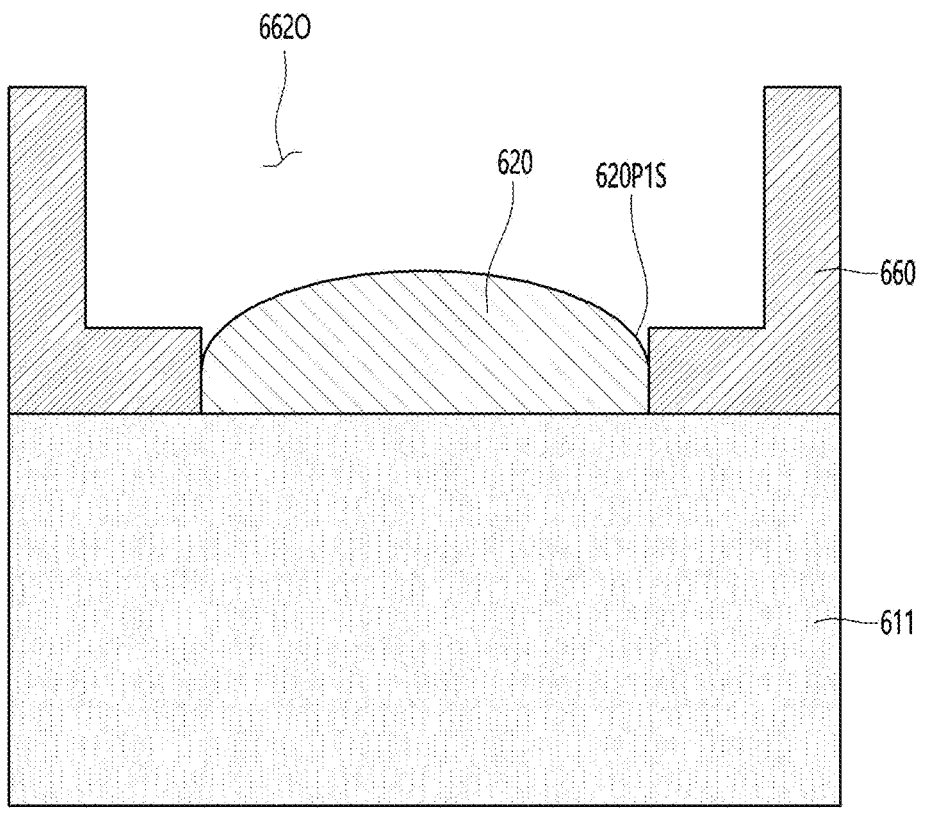

【FIG. 13D】
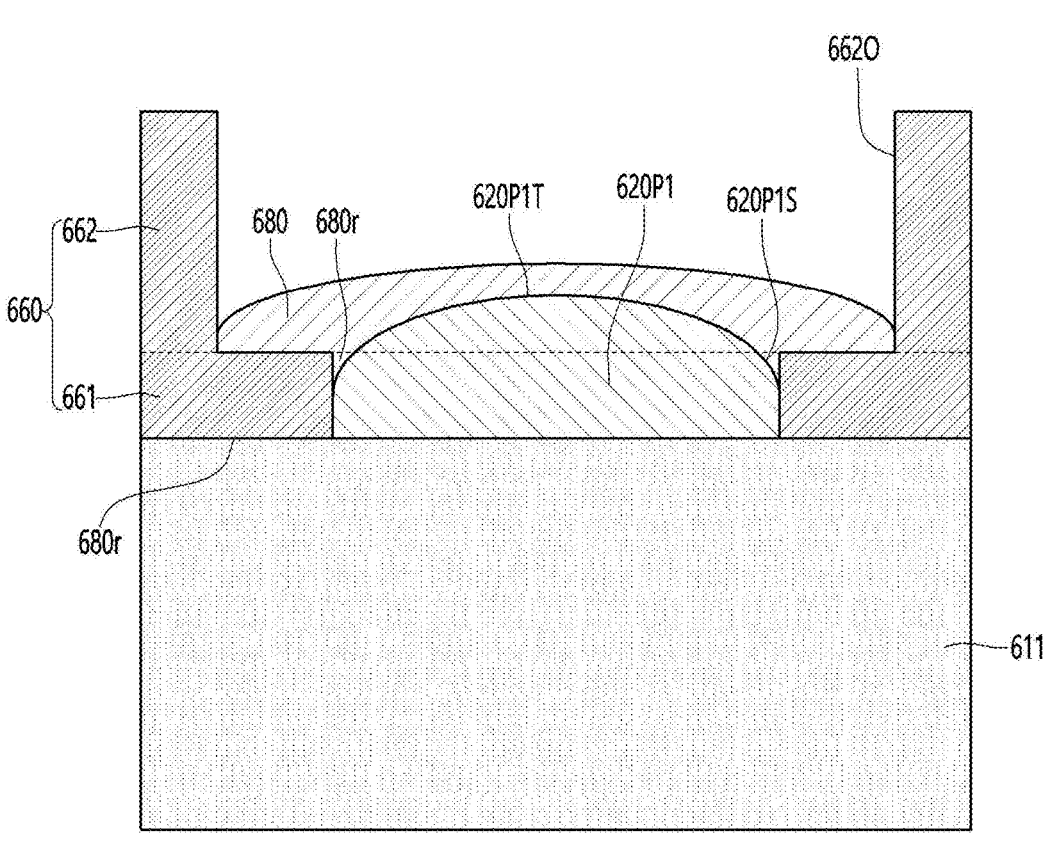

CIRCUIT BOARD AND SEMICONDUCTOR PACKAGE COMPRISING SAME

CROSS-REFERENCE TO RELATED PATENT APPLICATIONS

This application is a U.S. National Stage Application under 35 U.S.C. § 371 of PCT Application No. PCT/KR2022/013714, filed Sep. 14, 2022, which claims priority to Korean Patent Application No. 10-2021-0124369, filed Sep. 16, 2021, whose entire disclosures are hereby incorporated by reference.

TECHNICAL FIELD

The embodiment relates to a circuit board, and particularly to a circuit board and a semiconductor package including the same.

BACKGROUND ART

Generally, a printed circuit board (PCB) is a laminated structure in which insulating layers and conductor layers are alternately laminated, and the conductor layers may be provided with a circuit pattern by patterning.

Such printed circuit board includes a solder resist SR that protects the circuit pattern formed on an outermost side of the laminate structure, prevents oxidation of the conductor layer, and serves as an insulator when electrically connected to a chip mounted on a printed circuit board or another board.

A typical solder resist includes an opening region (SRO: Solder Resist Opening) where connection means such as solder or bumps are combined to form an electrical connection path. The opening region of the solder resist is required as the I/O (Input/Output) performance improves as the high performance and density of printed circuit boards increase, thereby a small bump pitch of the opening region is required. At this time, the bump pitch of the opening region refers to a center distance between adjacent opening regions.

Meanwhile, the opening region SRO of the solder resist includes a Solder Mask Defined (SMD) type and a Non-Solder Mask Defined (NSMD) type.

The SMD type is characterized in that a width of the opening region SRO is smaller than a width of the pad exposed through the opening region SRO, and accordingly, in the SMD type, at least a portion of an upper surface of the pad is covered by the solder resist.

In addition, the NSMD type is characterized in that a width of the opening region SRO is larger than a width of the pad exposed through the opening region SRO, and accordingly, the solder resist in the NSMD type is spaced apart from the pad at a certain interval and has a structure in which both the upper and side surfaces of the pad are exposed.

Meanwhile, a plating layer is disposed on the pad that overlaps vertically with the opening region (SRO) of the solder resist as described above. The plating layer may be a surface treatment layer to improve adhesion to a solder. Additionally, a bump may be additionally disposed between the pad and the plating layer depending on a product type.

However, the surface treatment layer or bump on the circuit board according to a prior art has various physical and electrical reliability problems.

Accordingly, a circuit board including a surface treatment layer and/or bumps of a new structure is required.

Problems with a metal layer (surface treatment layer or bump) of the circuit board according to the prior art (or comparative example) will be described in detail with reference to FIGS. 1A to 1E below.

DISCLOSURE

Technical Problem

An embodiment provides a circuit board with a new structure and a semiconductor package including the same.

Additionally, the embodiment provides a circuit board that can increase a contact area between a solder and a bump without affecting product thickness, and a semiconductor package including the same.

Additionally, the embodiment provides a circuit board that can increase a contact area between a solder and a surface treatment layer without affecting product thickness, and a semiconductor package including the same.

Additionally, the embodiment provides a circuit board and semiconductor package that can improve the physical and electrical reliability of a metal contact layer (IMC: Inter Metallic Contact) formed between a pad and a solder.

Technical problems to be solved by the proposed embodiments are not limited to the above-mentioned technical problems, and other technical problems not mentioned may be clearly understood by those skilled in the art to which the embodiments proposed from the following descriptions belong.

Technical Solution

A circuit board according to an embodiment comprises an insulating layer; a circuit pattern layer including a first metal layer disposed on the insulating layer; a protective layer disposed on the insulating layer, vertically overlapping the first metal layer, and including a recess portion having a step in a horizontal direction; and a second metal layer disposed in the recess portion of the protective layer, wherein the recess portion includes a portion having a width greater than a width of the first metal layer, and wherein the second metal layer is disposed in the portion of the recess portion with a width greater than the width of the first metal layer.

In addition, the recess portion includes a first recess portion located adjacent to the first metal layer and having a first width, and a second recess portion disposed on the first recess portion and having a width greater than the first width and the width of the first metal layer, and wherein the second metal layer includes a first part disposed in the first recess portion, and a second part disposed in the second recess portion and having a width greater than widths of the first part and the first metal layer.

In addition, the first recess portion has a width equal to or smaller than the width of the first metal layer.

In addition, the first metal layer includes a depression vertically overlapping the recess portion and concave toward the insulating layer, and wherein the second metal layer includes a third part disposed in the depression of the first metal layer.

In addition, the third part of the second metal layer includes a third-first part vertically overlapping a region exposed through the recess portion of the first metal layer; and a third-second part vertically non-overlapping with a region exposed through the recess portion of the first metal layer.

In addition, the first metal layer is a pad, wherein the first circuit pattern layer includes a trace disposed adjacent to the pad, and wherein the second part of the second metal layer includes an overlapping region that vertically overlaps the trace.

In addition, the first recess portion includes a bottom surface having a width greater than the width of the first metal layer and positioned lower than an upper surface of the first metal layer, wherein the protective layer is spaced apart from the first metal layer, and wherein the first part of the second metal layer contacts at least a portion of a side surface of the first metal layer.

In addition, the bottom surface of the first recess portion is positioned higher than an upper surface of the insulating layer.

In addition, the first metal layer is a pad, and wherein the second metal layer is a bump or surface treatment layer disposed on the pad.

Meanwhile, a circuit board according to an embodiment comprises an insulating layer; a first circuit pattern layer including a pad disposed on the insulating layer; a protective layer disposed on the insulating layer and including a recess portion that vertically overlaps the pad and has a step; and a surface treatment layer disposed in the recess portion of the protective layer, wherein the surface treatment layer includes a region whose height decreases from a center of the recess portion toward an edge of the recess portion.

In addition, the surface treatment layer has a width greater than the width of the pad, and the surface treatment layer includes an overlapping region that vertically overlaps the pad and a non-overlapping region that does not vertically overlap the pad.

In addition, the protective layer includes a first portion that vertically overlaps the pad and has a first recess portion; and a second portion disposed on the first portion, vertically overlapping the first recess portion and the pad, and having a second recess portion with a width greater than the width of the first recess portion; wherein the surface treatment layer includes a first part disposed in the first recess portion, and a second part disposed in the second recess portion and having a width greater than that of the first part.

In addition, the first recess portion has a width smaller than a width of the pad, and wherein the second recess portion has a width greater than the width of each of the first recess portion and the pad.

In addition, the pad includes a depression that overlaps vertically with the first recess portion and is concave toward the insulating layer, and wherein the surface treatment layer includes a third part disposed in the depression of the pad.

In addition, the third part of the surface treatment layer includes a third-first part vertically overlapping with the first part; and a third-second part vertically non-overlapping with the first part.

In addition, the first recess portion has a width greater than the width of the pad, the first portion of the protective layer is spaced apart from the pad, and the first part of the surface treatment layer contacts at least a portion of a side surface of the pad.

In addition, an upper surface of the first portion of the protective layer is located lower than an upper surface of the pad, the first recess portion has a width equal to the width of the pad, the pad includes a depression horizontally overlapping the first recess portion and formed in an inner direction of the pad, and the first part of the surface treatment layer is disposed in the depression.

In addition, the surface treatment layer has a thickness of 4 μm or more and at least a portion of an upper surface of the surface treatment layer includes a curved surface, and wherein the thickness of the surface treatment layer is at least one of a minimum thickness, maximum thickness, and average thickness in the overlapping region of the surface treatment layer.

Meanwhile, the semiconductor package according to the embodiment comprises an insulating layer; a first circuit pattern layer including a pad disposed on the insulating layer; a protective layer disposed on the insulating layer and including a recess portion that vertically overlaps the pad and has a step; a metal layer disposed in the recess portion of the protective layer and having a step corresponding to the step of the recess portion; a connection part disposed on the metal layer; a chip mounted on the connection part; and a molding layer for molding the chip, wherein the recess portion includes a first recess portion vertically overlapping the pad and having a first width; and a second recess portion vertically overlapping the first recess portion and having a second width greater than the first width, and wherein the metal layer one of a bump and a surface treatment layer including a first part disposed in the first recess portion and a second part disposed in the second recess portion.

In addition, the chip includes a first chip and a second chip that are spaced apart from each other in a width direction or arranged in a vertical direction.

Advantageous Effects

The circuit board according to the embodiment includes a first protective layer having a recess portion including a step, and a second metal layer disposed in the recess portion. For example, the recess portion includes a first recess portion that vertically overlaps the pad, which is the first metal layer, and has a first width, and a second recess portion formed on the first recess portion and having a second width greater than the first width. At this time, the second metal layer may be a bump or, alternatively, may be a surface treatment layer. In addition, the second metal layer includes a first part disposed in the first recess portion and a second part disposed in the second recess portion. At this time, the second part has a width greater than a width of the first part. Accordingly, the embodiment may form a metal layer including the first part and the second part as described above using the recess portion of the first protective layer having the step. According to the embodiment, the recess portion may include only a second recess portion, and the second metal layer may include only the second part disposed in the second recess portion. Through this, the embodiment can increase a bonding area with a solder for bonding to a chip or an external board, and thus improve bonding properties. Specifically, the first protective layer in the comparative example does not include a step and therefore includes only the first recess portion. Accordingly, the second metal layer (e.g., bump) in the comparative example includes only the first part having a width corresponding to the first recess portion, as a result, the bonding area with the solder decreases, causing a problem in that bonding properties deteriorate. On the other hand, compared to the comparative example, the embodiment can improve the bonding area with the solder by the difference in width between the first part and the second part, and thus improve bonding properties.

Meanwhile, a comparative example has a structure in which the second metal layer includes the second part. However, the second part of the comparative example has a structure that protrudes on an upper surface of the first protective layer. That is, the second part of the second metal layer in the comparative example has a structure disposed on the upper surface of the first protective layer. Accordingly, when the second metal layer includes a second part, the comparative example has a problem in that the overall thickness of the circuit board increases by the thickness corresponding to the second part. In contrast, the embodiment may use a first protective layer having a step to form the second part of the second metal layer within the first protective layer. Accordingly, the embodiment can improve adhesion with the solder without affecting the overall thickness of the circuit board, and thus improve product satisfaction.

Additionally, the embodiment allows various designs of the second metal layer through changes in the width of the first recess portion. For example, the first recess portion may be smaller, alternatively greater, or alternatively same as a width of the pad. Furthermore, the first recess portion may partially have a width equal to the width of the pad and partially have a width greater than the width of the pad. Accordingly, the embodiment can be applied to various types that the recess portion of the first protective layer must have, and thus the degree of freedom in product design can be improved.

Additionally, in an embodiment, a depression is formed on the pad. The depression may be formed in an etching process to remove debris on the pad after the recess portion of the first protective layer is formed. And, the second metal layer may be formed to fill the depression. Accordingly, the embodiment allows the second metal layer to be formed filling the depression, thus improving the electrical reliability of the pad, which is the first metal layer.

Meanwhile, when the metal layer is a surface treatment layer, the surface treatment layer has a thickness of at least 4 μm. For example, the surface treatment layer may have a plurality of layer structures (e.g., nickel-palladium-gold or nickel-gold) depending on a surface treatment method. In addition, a total thickness of the surface treatment layer having the plurality of layers may be 4 μm or more. Accordingly, the embodiment allows the surface treatment layer to stably fill the depression, thereby improving electrical reliability. Specifically, a depth of the depression is at the level of 3 μm. When the surface treatment layer has a thickness of 3 μm or less, a problem may occur in which the depression is not completely filled by the surface treatment layer, and as a result, problems may occur in the signal transmission characteristics of the pad. On the other hand, in the embodiment, the surface treatment layer has a thickness of 4 μm or more, so that the depression is completely filled by the surface treatment layer, thereby improving signal transmission characteristics.

Furthermore, in the embodiment, the surface treatment layer has a thickness of 4 μm or more, and accordingly, an interface between the first protective layer and the pad and an upper surface of the surface treatment layer can be spaced a certain distance apart. Through this, the embodiment can improve the electrical reliability and physical reliability of a metal contact layer formed as the solder is disposed on the surface treatment layer. Specifically, when the surface treatment layer has a thickness of 3 μm or less as in the comparative example, the upper surface of the surface treatment layer is formed at a height substantially equal as a height of the interface, and accordingly, the metal contact layer may also be located at a height equal as a height of the interface. At this time, in an environment in which the circuit board is used, expansion and contraction of the first protective layer may occur, and resulting stress may occur. At this time, in the comparative example, since the interface and the metal contact layer are formed at the same height, the stress is directly transmitted to the metal contact layer, and as a result, the physical and electrical reliability of the metal contact layer may deteriorate. In contrast, in the embodiment, the surface treatment layer is formed to have a thickness of 4 μm or more, so that the interface and the metal contact layer can be spaced a certain distance apart, and accordingly, the stress can be prevented from being transmitted to the metal contact layer. Through this, the embodiment can improve the electrical reliability and physical reliability of the metal contact layer, and further improve product reliability.

DESCRIPTION OF DRAWINGS

FIG. 1A is a diagram showing a circuit board according to a first comparative example.

FIG. 1B is a diagram showing a circuit board according to a second comparative example.

FIGS. 1C to 1E are diagrams for explaining a process of manufacturing the circuit board of the second comparative example of FIG. 1B.

FIG. 2A is a cross-sectional view illustrating a semiconductor package according to a first embodiment.

FIG. 2B is a cross-sectional view illustrating a semiconductor package according to a second embodiment.

FIG. 2C is a cross-sectional view illustrating a semiconductor package according to a third embodiment.

FIG. 2D is a cross-sectional view illustrating a semiconductor package according to a fourth embodiment.

FIG. 2E is a cross-sectional view illustrating a semiconductor package according to a fifth embodiment.

FIG. 2F is a cross-sectional view illustrating a semiconductor package according to a sixth embodiment.

FIG. 2G is a cross-sectional view illustrating a semiconductor package according to a seventh embodiment.

FIG. 3A is a diagram showing a circuit board according to a first embodiment.

FIG. 3B is an enlarged view of one region of the circuit board of FIG. 3A.

FIG. 3C is a diagram showing a first modified example of the circuit board of FIG. 3B.

FIG. 3D is a diagram showing a second modified example of the circuit board of FIG. 3B.

FIG. 3E is a diagram showing a third modified example of the circuit board of FIG. 3B.

FIG. 3F is a diagram showing a fourth modified example of the circuit board of FIG. 3B.

FIG. 4A is a diagram showing a circuit board according to a second embodiment.

FIG. 4B is a diagram showing a modified example of the circuit board of FIG. 4A.

FIG. 5 is a diagram showing a circuit board according to a third embodiment.

FIG. 6 is a diagram showing a circuit board according to a fourth embodiment.

FIG. 7A is a diagram showing a circuit board according to a fifth embodiment.

FIG. 7B is an enlarged view of one region of the circuit board of FIG. 7A.

FIG. 7C is a diagram showing a modified example of the circuit board of FIG. 7A.

FIG. 8 is a diagram showing a circuit board according to a sixth embodiment.

FIG. 9A is a diagram showing a circuit board according to a seventh embodiment.

FIG. 9B is a diagram specifically showing a shape of a first pad of FIG. 9A.

FIG. 9C is a diagram showing an optical micrograph of a shape of a first pad and a surface treatment layer according to FIG. 9B.

FIG. 10 is a diagram showing a package substrate according to a first embodiment.

FIG. 11 is a diagram showing a package substrate according to a second embodiment.

FIGS. 12A to 12I are diagrams showing a method of manufacturing a circuit board according to an embodiment in order of processes.

FIGS. 13A to 13D are diagrams showing a method of manufacturing a circuit board according to another embodiment in order of processes.

MODES OF THE INVENTION

Hereinafter, the embodiment disclosed in the present specification will be described in detail with reference to the accompanying drawings, but the same or similar components are designated by the same reference numerals regardless of drawing numbers, and repeated description thereof will be omitted. The component suffixes "module" and "part" used in the following description are given or mixed together only considering the ease of creating the specification, and have no meanings or roles that are distinguished from each other by themselves. In addition, in describing the embodiments disclosed in the present specification, when it is determined that detailed descriptions of a related well-known art unnecessarily obscure gist of the embodiments disclosed in the present specification, the detailed description thereof will be omitted. Further, the accompanying drawings are merely for facilitating understanding of the embodiments disclosed in the present specification, the technological scope disclosed in the present specification is not limited by the accompanying drawings, and it should be understood as including all modifications, equivalents and alternatives that fall within the spirit and scope of the present invention.

It will be understood that, although the terms "first," "second," etc. may be used herein to describe various elements, these elements should not be limited by these terms. These terms are only used to distinguish one element from another.

It will be understood that when an element is referred to as being "connected" or "coupled" to another element, it can be directly connected or coupled to the other element or intervening elements may be present. In contrast, when an element is referred to as being "directly connected" or "directly coupled" to another element, it will be understood that there are no intervening elements present.

As used herein, a singular expression includes a plural expression, unless the context clearly indicates otherwise.

It will be understood that the terms "comprise", "include", or "have" specify the presence of stated features, integers, steps, operations, elements, components and/or groups thereof disclosed in the present specification, but do not preclude the possibility of the presence or addition of one or more other features, integers, steps, operations, elements, components, and/or groups thereof.

Hereinafter, embodiments of the present invention will be described in detail with reference to the accompanying drawings.

Comparative Example

Before describing the embodiment, a comparative example compared to the circuit board of the embodiment of the present application will be described.

FIG. 1A is a diagram showing a circuit board according to a first comparative example, FIG. 1B is a diagram showing a circuit board according to a second comparative example, and FIGS. 1C to 1E are diagrams for explaining a process of manufacturing the circuit board of the second comparative example of FIG. 1B.

Referring to FIG. 1A, a circuit board according to a first comparative example includes an insulating layer 10, a circuit pattern layer, a protective layer 30, and a metal layer.

The circuit board according to the first comparative example of FIG. 1A has a structure in which a metal layer corresponding to a bump is disposed on a pad of a circuit pattern layer.

For example, the circuit board of the first comparative example includes a bump disposed on the circuit pattern layer for attaching a chip (not shown) or an external board (not shown). Specifically, the circuit board of the first comparative example further includes a surface treatment layer (not shown) disposed on the bump and a solder disposed on the surface treatment layer. Then, the chip or external board is bonded to the circuit board through the solder.

The circuit board of the first comparative example includes an insulating layer 10. At this time, the circuit board may have a plurality of layer structures based on the number of layers of the insulating layer. In addition, when the circuit board has a plurality of layer structure, the insulating layer 10 of FIG. 1A may represent an insulating layer disposed on at outermost (for example, uppermost) side among the plurality of insulating layers.

The circuit board of the first comparative example includes a circuit pattern layer disposed on the insulating layer 10. The circuit pattern layer includes pads and traces. The pad may refer to a pattern on which a solder is disposed for bonding to the chip or an external board among the circuit pattern layers. The trace may refer to a thin signal line connecting the plurality of pads.

Additionally, the circuit board of the first comparative example includes a protective layer 30 disposed on the insulating layer 10.

The protective layer 30 includes a plurality of recess portions. The plurality of recess portions may be classified according to type. For example, the protective layer 30 includes a first recess portion 31 of NSMD type. Additionally, the protective layer 30 includes a second recess portion 32 of SMD type. Meanwhile, the recess portion may be referred to as an opening depending on the embodiment.

And, the circuit pattern layer includes at least one of a first pad 21, a second pad 22, and a third pad 23.

The first pad 21 refers to a pattern that vertically overlaps the first recess portion 31 of the protective layer 30 among the circuit pattern layers.

In addition, the second pad 22 and the third pad 23 mean a pattern that vertically overlaps the second recess portion 32 of the protective layer 30 among the circuit pattern layers.

At this time, a width of the first recess portion 31 of the protective layer 30 is greater than a width of the first pad 21. Accordingly, an entire region of the upper surface of the first pad 21 vertically overlaps the first recess portion 31 of the protective layer 30.

Also, a width of the second recess portion 32 of the protective layer 30 is smaller than a width of the second pad 22 or the third pad 23. Accordingly, an upper surface of the second pad 22 includes an overlapping region vertically overlapping with the second recess portion 32 of the protective layer 30 and a non-overlapping region that does not vertically overlap the second recess portion 32. In addition, the upper surface of the third pad 23 includes an overlapping region that vertically overlaps the second recess portion 32 of the protective layer 30 and a non-overlapping region that does not vertically overlap the second recess portion 32.

Meanwhile, the circuit board of the first comparative example includes a first bump 41 disposed on the first pad 21. At this time, the first pad 21 has a first width w1. Additionally, the first bump 41 has a second width w2 that is smaller than the first width w1 and is disposed on the upper surface of the first pad 21. As such, in the circuit board of the first comparative example, the first bump 41 has a width smaller than the width of the first pad 21, and a bonding area between the solder (not shown) and the first bump 41 is may decrease. Accordingly, a reliability problem may occur in which the solder is separated from the first bump 41 due to stress occurring in various usage environments of the circuit board.

Additionally, the circuit board of the first comparative example includes a second bump 42 disposed on the second pad 22. At this time, the second bump 42 has a width smaller than the width of the second pad 22. Accordingly, in the circuit board of the first comparative example, a structure including the second bump 42 has a reliability problem due to a decrease in the bonding area between the solder and the second bump 42.

In addition, the circuit board in the first comparative example has bumps formed in a two-layer structure to ensure a bonding area between the solder and the bumps.

For example, the circuit board of the first comparative example includes a third bump 43 disposed on the third pad 23. At this time, the third bump 43 includes a first part 43-1 disposed in the second recess portion 32 of the protective layer 30 and a second part 43-2 disposed on the first part 43-1. At this time, the width w4 of the first part 43-1 of the third bump 43 is smaller than the width w3 of the third pad 23. In addition, the width w5 of the second part 43-2 of the third bump 43 is greater than the width w3 of the third pad 23 and the width w4 of the first part 43-1. Accordingly, in the first comparative example, the bonding area with the solder is improved by using the second part 43-2 of the third bump 43.

However, the second part 43-2 of the third bump 43 has a structure that protrudes above the upper surface of the protective layer 30. Specifically, in the first comparative example, a dry film (not shown) is placed on the protective layer 30, and the second part 43-2 of the third bump 43 is formed using the dry film. Accordingly, the second part 43-2 of the third bump 32 has a structure that protrudes above the upper surface of the protective layer 30. Accordingly, in the first comparative example, the structure including the third bump 43 increases the bonding area with the solder by using the second part 43-2 of the third bump 43. However, there is a problem that the thickness of the circuit board increases by a thickness corresponding to the second part 43-2.

Meanwhile, referring to FIG. 1B, a circuit board according to a second comparative example includes an insulating layer 10, a circuit pattern layer, a protective layer 30, and a metal layer.

The circuit board according to the second comparative example of FIG. 1B has a structure in which a metal layer corresponding to the surface treatment layer 50 is disposed on the pad of the circuit pattern layer. Additionally, the surface treatment layer 50 has a structure in which a solder 60 for bonding a chip (not shown) or an external board (not shown) is disposed.

However, the circuit board in the second comparative example has a problem in that the physical or electrical reliability of a metal contact layer 65 between the solder 60 and the surface treatment layer 50 is reduced.

For example, a structure of each component in a process of manufacturing the circuit board shown in FIG. 1*b* is as follows.

Referring to FIG. 1C, in the second comparative example, the protective layer 30 is formed with the circuit pattern layer 20 disposed on the insulating layer 10. At this time, the protective layer 30 is disposed to cover an upper surface of the circuit pattern layer 20. Thereafter, in the second comparative example, the protective layer 30 is exposed and developed to form a third recess portion 33 that vertically overlaps the circuit pattern layer 20. At this time, the third recess portion 33 has a shape whose width gradually decreases toward the circuit pattern layer 20 according to the exposure and development process.

At this time, referring to FIG. 1D, when the third recess portion 33 of the protective layer 30 is formed, the second comparative example proceeds with a process of etching the circuit pattern layer 20. Specifically, debris of the protective layer 30 may be present in a region of the upper surface of the circuit pattern layer 20 that vertically overlaps the third recess portion 33. Accordingly, a process of removing the debris is performed by etching a region of the upper surface of the circuit pattern layer 20 that vertically overlaps the third recess portion 33. At this time, a recess 20*r* is formed on an upper surface of the circuit pattern layer 20 as the process progresses. The recess 20*r* has a concave shape in a direction from an upper surface to a lower surface of the circuit pattern layer 20. At this time, the recess 20*r* is formed by etching the upper surface of the circuit pattern layer 20 that vertically overlaps the third recess portion 33. However, during the etching process, the etching solution penetrates into a region between the upper surface of the circuit pattern layer 20 and a lower surface of the protective layer 30. Additionally, due to the penetration of the etching solution as described above, an additional recess R is formed on the upper surface of the circuit pattern layer 20 that does not vertically overlap the third recess portion 33. At this time, a depth of the recess 20*r* and the additional recess R is about 2 μm to 3 μm.

Next, referring to FIG. 1E, the second comparative example proceeds with a process of forming a surface treatment layer 50 on the upper surface of the circuit pattern layer 20. And, the second comparative example proceeds with a process of forming solder 60 on the surface treatment layer 50.

At this time, a thickness of the surface treatment layer 50 in the second comparative example is 3 μm or less. For example, the surface treatment layer 50 includes a plurality of plating layers according to a surface treatment method. And, the sum of thicknesses of the plurality of plating layers is 3 μm or less. For example, the surface treatment layer 50 includes a nickel (Ni) plating layer and a gold (Au) plating layer, or includes a nickel (Ni) plating layer, a palladium (Pd) plating layer, and a gold (Au) plating layer. And, a total thickness of the plurality of plating layers having the above layer structure is 3 μm or less. Accordingly, the surface treatment layer 50 in the second comparative example is formed to fill the recess 20*r* and the additional recess R of the circuit pattern layer 20.

Meanwhile, when forming the solder 60 on the surface treatment layer 50, the surface treatment layer 50 and the solder 60 are composed of different materials, and accordingly, a metal contact layer 65 is formed at the interface between the solder 60 and the surface treatment layer 50. At this time, the surface treatment layer 50 in the second comparative example has a thickness of 3 μm or less, and accordingly, the metal contact layer 65 is disposed at a height substantially equal to the height of the lower surface of the corner region 30e of the third recess portion 33. For example, the metal contact layer 65 in the second comparative example has the same height as the height of the interface between the upper surface of the circuit pattern layer 20 and the lower surface of the protective layer 30.

At this time, the protective layer 30 shrinks and expands depending on thermal characteristics, etc. in the environment in which the circuit board is used. At this time, stress due to contraction and expansion of the protective layer 30 is transmitted to the interface between the lower surface of the protective layer 30 and the upper surface of the circuit pattern layer 20. Here, in the second comparative example, the metal contact layer 65 is formed adjacent to the interface between the lower surface of the protective layer 30 and the upper surface of the circuit pattern layer 20. Accordingly, in the second comparative example, there is a problem in that stress occurring at the interface between the lower surface of the protective layer 30 and the upper surface of the circuit pattern layer 20 is directly transmitted to the metal contact layer 65. In addition, the metal contact layer 65 in the second comparative example may have physical reliability problems such as cracks due to the transmitted stress. Accordingly, in the second comparative example, a problem may occur in which the solder 60 is separated from the circuit pattern layer 20 due to a decrease in physical reliability of the metal contact layer 65 depending on the usage environment of the circuit board.

The embodiment solves the problems of the first and second comparative examples as described above. Specifically, the embodiment allow for increasing the bond area between the bump and solder without increasing the thickness of the circuit board. Through this, the embodiment allows to improve adhesion between the bump and solder. Additionally, the embodiment allows to increase the bonding area between the surface treatment layer and the solder without increasing the thickness of the circuit board. Through this, the embodiment allows to improve adhesion between the surface treatment layer and solder. Additionally, the embodiment makes it possible to improve the physical reliability of the metal contact layer formed between the solder and the surface treatment layer. For this purpose, the embodiment allows to increase the separation distance between the corner ends of the protective layer and the metal contact layer, and accordingly, stress resulting from contraction and expansion of the protective layer is prevented from being directly transmitted to the metal contact layer. To this end, the embodiment allows to improve the physical reliability of the metal contact layer.

—Electronic Device—

Before describing the embodiment, an electronic device to which the semiconductor package of the embodiment is applied will be briefly described. The electronic device includes a main board (not shown). The main board may be physically and/or electrically connected to various components. For example, the main board may be connected to the semiconductor package of the embodiment. Various semiconductor devices may be mounted on the semiconductor package.

The semiconductor device may include an active device and/or a passive device. The active device may be a semiconductor chip in the form of an integrated circuit (IC) in which hundreds to millions of devices are integrated in one chip. The semiconductor device may be a logic chip, a memory chip, or the like. The logic chip may be a central processor (CPU), a graphics processor (GPU), or the like. For example, the logic chip may be an application processor (AP) chip including at least one of a central processor (CPU), a graphics processor (GPU), a digital signal processor, a cryptographic processor, a microprocessor and a microcontroller, or an analog-digital converter, an application-specific IC (ASIC), or the like, or a chip set comprising a specific combination of those listed so far.

The memory chip may be a stack memory such as HBM. The memory chip may also include a memory chip such as volatile memory (e.g., DRAM), non-volatile memory (e.g., ROM), flash memory, and the like.

On the other hand, a product group to which the semiconductor package of the embodiment is applied may be any one of CSP (Chip Scale Package), FC-CSP (Flip Chip-Chip Scale Package), FC-BGA (Flip Chip Ball Grid Array), POP (Package on Package) and SIP (System in Package), but is not limited thereto.

In addition, the electronic device may be a smart phone, a personal digital assistant, a digital video camera, a digital still camera, a vehicle, a high-performance server, a network system, computer, monitor, tablet, laptop, netbook, television, video game, smart watch, automotive, or the like. However, the embodiment is not limited thereto, and may be any other electronic device that processes data in addition to these.

Hereinafter, a semiconductor package including a circuit board according to an embodiment will be described. The semiconductor package of the embodiment may have various package structures including a circuit board to be described later.

In addition, a circuit board in one embodiment may be a first board described below.

In addition, a circuit board in another embodiment may be a second board described below.

FIG. 2A is a cross-sectional view illustrating a semiconductor package according to a first embodiment, FIG. 2B is a cross-sectional view illustrating a semiconductor package according to a second embodiment, FIG. 2C is a cross-sectional view illustrating a semiconductor package according to a third embodiment, FIG. 2D is a cross-sectional view illustrating a semiconductor package according to a fourth embodiment, FIG. 2E is a cross-sectional view illustrating a semiconductor package according to a fifth embodiment, FIG. 2F is a cross-sectional view illustrating a semiconductor package according to a sixth embodiment, and FIG. 2G is a cross-sectional view illustrating a semiconductor package according to a seventh embodiment.

Referring to FIG. 2A, the semiconductor package according to the first embodiment may include a first circuit board 1100, a second circuit board 1200, and a semiconductor device 1300.

The first circuit board 1100 may mean a package substrate.

For example, the first circuit board 1100 may provide a space to which at least one external substrate is coupled. The external substrate may refer to a second circuit board 1200 coupled to the first circuit board 1100. Also, the external substrate may refer to a main board included in an electronic device coupled to a lower portion of the first circuit board 1100.

Also, although not shown in the drawing, the first circuit board 1100 may provide a space in which at least one semiconductor device is mounted.

The first circuit board 1100 may include at least one insulating layer, and an electrode part disposed on the at least one insulating layer.

A second circuit board 1200 may be disposed on the first circuit board 1100.

The second circuit board 1200 may be an interposer. For example, the second circuit board 1200 may provide a space in which at least one semiconductor device is mounted. The second circuit board 1200 may be connected to the at least one semiconductor device 1300. For example, the second circuit board 1200 may provide a space in which the first semiconductor device 1310 and the second semiconductor device 1320 are mounted. The second circuit board 1200 may electrically connect the first and second semiconductor devices 1310 and 1320 and the first circuit board 1100 while electrically connecting the first semiconductor device 1310 and the second semiconductor device 1320. That is, the second circuit board 1200 may perform a horizontal connection function between a plurality of semiconductor devices and a vertical connection function between the semiconductor devices and the package substrate.

FIG. 2A illustrates that the first and second semiconductor devices 1310 and 1320 are disposed on the second circuit board 1200, but is not limited thereto. For example, one semiconductor device may be disposed on the second circuit board 1200, or alternatively, three or more semiconductor devices may be disposed.

The second circuit board 1200 may be disposed between at least one of the semiconductor device 1300 and the first circuit board 1100.

In one embodiment, the second circuit board 1200 may be an active interposer that functions as a semiconductor device. When the second circuit board 1200 functions as a semiconductor device, the semiconductor package of the embodiment may have a vertical stack structure on the first circuit board 1100 and function as a plurality of logic chips. Being able to have the functions of a logic chip may mean having the functions of an active device and a passive device. In the case of active devices, unlike passive devices, current and voltage characteristics may not be linear, and in the case of an active interposer, it can have the function of an active device. Additionally, the active interposer may function as a corresponding logic chip and perform a signal transmission function between the first circuit board 1100 and a second logic chip disposed on an upper portion of the active interposer.

According to another embodiment, the second circuit board 1200 may be a passive interposer. For example, the second circuit board 1200 may function as a signal relay between the semiconductor device 1300 and the first circuit board 1100, and may have passive device functions such as a resistor, capacitor, and inductor. For example, a number of terminals of the semiconductor device 1300 is gradually increasing due to 5G, Internet of Things (IoT), increased image quality, and increased communication speed. That is, the number of terminals provided in the semiconductor device 1300 increases, thereby reducing the width of the terminals or an interval between the plurality of terminals. In this case, the first circuit board 1100 may be connected to the main board of the electronic device. There is a problem in that the thickness of the first circuit board 1100 increases or the layer structure of the first circuit board 1100 becomes complicated in order for the electrodes provided on the first circuit board 1100 to have a width and an interval to be respectively connected to the semiconductor device 1300 and the main board. Accordingly, in the first embodiment, the second circuit board 1200 may be disposed on the first circuit board 1100 and the semiconductor device 1300. In addition, the second circuit board 1200 may include electrodes having a fine width and an interval corresponding to the terminals of the semiconductor device 1300.

the semiconductor device 1300 may be an application processor (AP) chip including at least one of a central processor (CPU), a graphics processor (GPU), a digital signal processor, a cryptographic processor, a microprocessor and a microcontroller, or an analog-digital converter, an application-specific IC (ASIC), or the like, or a chip set comprising a specific combination of those listed so far. The memory chip may be a stack memory such as HBM. The memory chip may also include a memory chip such as volatile memory (e.g., DRAM), non-volatile memory (e.g., ROM), flash memory, and the like.

Meanwhile, the semiconductor package of the first embodiment may include a connection part.

For example, the semiconductor package may include a first connection part 1410 disposed between the first circuit board 1100 and the second circuit board 1200. The first connection part 1410 may electrically connect the second circuit board 1200 to the first circuit board 1100 while coupling them.

For example, the semiconductor package may include the second connection part 1420 disposed between the second circuit board 1200 and the semiconductor device 1300. The second connection part 1420 may electrically connect the semiconductor device 1300 to the second circuit board 1200 while coupling them.

The semiconductor package may include a third connection part 1430 disposed on a lower surface of the first circuit board 1100. The third connection part 1430 may electrically connect the first circuit board 1100 to the main board while coupling them.

At this time, the first connection part 1410, the second connection part 1420, and the third connection part 1430 may electrically connect between the plurality of components by using at least one bonding method of wire bonding, solder bonding and metal-to-metal direct bonding. That is, since the first connection part 1410, the second connection part 1420, and the third connection part 1430 have a function of electrically connecting a plurality of components, when the metal-to-metal direct bonding is used, the connection part of the semiconductor package may be understood as an electrically connected portion, not a solder or wire.

The wire bonding method may refer to electrically connecting a plurality of components using a conductive wire such as gold (Au). Also, the solder bonding method may electrically connect a plurality of components using a material containing at least one of Sn, Ag, and Cu. In addition, the metal-to-metal direct bonding method may refer to recrystallization by applying heat and pressure between a plurality of components without the presence of solder, wire, conductive adhesive, etc. and to directly bond between the plurality of components. In addition, the metal-to-metal direct bonding method may refer to a bonding method by the second connection part 1420. In this case, the second connection part 1420 may mean a metal layer formed between a plurality of components by the recrystallization.

Specifically, the first connection part 1410, the second connection part 1420, and the third connection part 1430 may couple a plurality of components to each other by a thermal compression (TC) bonding method. The TC bonding may refer to a method of directly coupling a plurality of components by applying heat and pressure to the first connection part 1410, the second connection part 1420, and the third connection part 1430.

In this case, at least one of the first circuit board 1100 and the second circuit board 1200 may include a protrusion provided on the electrode where the first connection part 1410, the second connection part 1420, and the third connection part 1430 are disposed, and protruding in an outward direction away from the insulating layer of the corresponding circuit board. The protrusion may protrude outward from the first circuit board 1100 or the second circuit board 1200.

The protrusion may be referred to as a bump. The protrusion may also be referred to as a post. The protrusion may also be referred to as a pillar. Preferably, the protrusion may refer to an electrode on which a second connection part 1420 for coupling with the semiconductor device 1300 is disposed among the electrodes of the second circuit board 1200. That is, the pitch of the terminals of the semiconductor device 1300 is becoming finer, as a result, a short circuit may occur between the plurality of second connection parts 1420 respectively connected to the plurality of terminals of the semiconductor device 1300 by a conductive adhesive such as solder. Accordingly, the embodiment may perform thermal compression bonding to reduce the volume of the second connection part 1420. Accordingly, the embodiment may include a protrusion in the electrode of the second circuit board 1200 on which the second connection part 1420 is disposed in order to secure position accuracy and diffusion prevention power to prevent the intermetallic compound (IMC) formed between a conductive adhesive such as solder and a protrusion from diffusing to the interposer and/or the circuit board.

Meanwhile, referring to FIG. 2B, the semiconductor package of the second embodiment may differ from the semiconductor package of the first embodiment in that the connecting member 1210 is disposed on the second circuit board 1200. The connecting member 1210 may be referred to as a bridge substrate. For example, the connecting member 1210 may include a redistribution layer. The connecting member 1210 may function to electrically connect a plurality of semiconductor devices to each other horizontally. For example, an area that a semiconductor device should have, is generally too large, and for this reason, the connecting member 1210 may include a redistribution layer. The semiconductor package and the semiconductor device have significant differences in a width and a spacing of their circuit patterns, and for this reason, a buffering role of the circuit pattern for electrical connection is necessary. The buffering role may mean having an intermediate size between the width or spacing of the circuit pattern of the semiconductor package and the width or spacing of the circuit pattern of the semiconductor device, and the redistribution layer may include a function that acts as a buffer.

In an embodiment, the connecting member 1210 may be a silicon bridge. That is, the connecting member 1210 may include a silicon substrate and a redistribution layer disposed on the silicon substrate.

In another embodiment, the connecting member 1210 may be an organic bridge. For example, the connecting member 1210 may include an organic material. For example, the connecting member 1210 may include an organic substrate including an organic material instead of the silicon substrate.

The connecting member 1210 may be embedded in the second circuit board 1200, but is not limited thereto. For example, the connecting member 1210 may be disposed on the second circuit board 1200 to have a protruding structure.

Also, the second circuit board 1200 may include a cavity, and the connecting member 1210 may be disposed in the cavity of the second circuit board 1200.

The connecting member 1210 may horizontally connect a plurality of semiconductor devices disposed on the second circuit board 1200.

Referring to FIG. 2C, the semiconductor package according to the third embodiment may include a second circuit board 1200 and a semiconductor device 1300. In this case, the semiconductor package of the third embodiment may have a structure in which the first circuit board 1100 is removed compared to the semiconductor package of the second embodiment.

That is, the second circuit board 1200 of the third embodiment may function as a package substrate while performing an interposer function.

The first connection part 1410 disposed on the lower surface of the second circuit board 1200 may couple the second circuit board 1200 to the main board of the electronic device.

Referring to FIG. 2D, the semiconductor package according to the fourth embodiment may include a first circuit board 1100 and a semiconductor device 1300.

In this case, the semiconductor package of the fourth embodiment may have a structure in which the second circuit board 1200 is omitted compared to the semiconductor package of the second embodiment.

That is, the first circuit board 1100 of the fourth embodiment may function as a connection between the semiconductor device 1300 and the main board while functioning as a package substrate. To this end, the first circuit board 1100 may include a connecting member 1110 for connecting the plurality of semiconductor devices. The connecting member 1110 may be a silicon bridge or an organic material bridge connecting a plurality of semiconductor devices.

Referring to FIG. 2E, the semiconductor package of the fifth embodiment may further include a third semiconductor device 1330 compared to the semiconductor package of the fourth embodiment.

To this end, a fourth connection part 1440 may be disposed on the lower surface of the first circuit board 1100.

In addition, a third semiconductor device 1330 may be disposed on the fourth connection part 1400. That is, the semiconductor package of the fifth embodiment may have a structure in which semiconductor devices are mounted on upper and lower sides, respectively.

In this case, the third semiconductor device 1330 may have a structure disposed on the lower surface of the second circuit board 1200 in the semiconductor package of FIG. 2C.

Referring to FIG. 2F, the semiconductor package according to the sixth embodiment may include a first circuit board 1100. A first semiconductor device 1310 may be disposed on the first circuit board 1100. To this end, a first connection part 1410 may be disposed between the first circuit board 1100 and the first semiconductor device 1310.

In addition, the first circuit board 1100 may include a conductive coupling portion 1450. The conductive coupling portion 1450 may further protrude from the first circuit board 1100 toward the second semiconductor device 1320. The conductive coupling portion 1450 may be referred to as a bump or, alternatively, may also be referred to as a post. The conductive coupling portion 1450 may be disposed to have a protruding structure on an electrode disposed on an uppermost side of the first circuit board 1100.

A second semiconductor device 1320 may be disposed on the conductive coupling portion 1450. In this case, the second semiconductor device 1320 may be connected to the first circuit board 1100 through the conductive coupling portion 1450. In addition, a second connection part 1420 may be disposed on the first semiconductor device 1310 and the second semiconductor device 1320.

Accordingly, the second semiconductor device 1320 may be electrically connected to the first semiconductor device 1310 through the second connection part 1420.

That is, the second semiconductor device 1320 may be connected to the first circuit board 1100 through the conductive coupling portion 1450, and may be also connected to the first semiconductor device 1310 through the second connection part 1420.

In this case, the second semiconductor device 1320 may receive a power signal and/or an electrical power through the conductive coupling portion 1450. Also, the second semiconductor device 1320 may transmit and receive a communication signal to and from the first semiconductor device 1310 through the second connection part 1420.

The semiconductor package according to the sixth embodiment provides a power signal and/or an electrical power to the second semiconductor device 1320 through the conductive coupling portion 1450, and it may be possible to provide sufficient power for driving the second semiconductor device 1320 or to smoothly control power supply operation.

Accordingly, the embodiment may improve the driving characteristics of the second semiconductor device 1320. That is, the embodiment may solve the problem of insufficient power provided to the second semiconductor device 1320. Furthermore, in the embodiment, at least one of the power signal, the electrical power and the communication signal of the second semiconductor device 1320 may be provided through different paths through the conductive coupling portion 1450 and the second connection part 1420. Through this, the embodiment can solve the problem that the communication signal is lost due to the power signal. For example, the embodiment may minimize mutual interference between communication signals of power signals.

Meanwhile, the second semiconductor device 1320 in the sixth embodiment may have a POP (Package On Package) structure in which a plurality of package substrates are stacked and may be disposed on the first substrate 1100. For example, the second semiconductor device 1320 may be a memory package including a memory chip. In addition, the memory package may be coupled on the conductive coupling portion 1450. In this case, the memory package may not be connected to the first semiconductor device 1310.

Referring to FIG. 2G, the semiconductor package according to the seventh embodiment may include a first circuit board 1100, a first connection part 1410, a first connection part 1410, a semiconductor device 1300, and a third connection part 1430.

In this case, the semiconductor package of the seventh embodiment is different from the semiconductor package of the fourth embodiment in that the first circuit board 1100 includes a plurality of substrate layers while the connecting member 1110 is removed.

The first circuit board 1100 includes a plurality of substrate layers. For example, the first circuit board 1100 may include a first substrate layer 1100A corresponding to a package substrate and a second substrate layer 1100B corresponding to the connecting member.

In other words, the semiconductor package of the seventh embodiment may include a first substrate layer 1100A and a second substrate layer 1100B in which the first circuit board (package substrate, 1100) and the second circuit board (interposer, 1200) shown in FIG. 2A are integrally formed. The material of the insulating layer of the second substrate layer 1100B may be different from the material of the insulating layer of the first substrate layer 1100A. For example, the material of the insulating layer of the second substrate layer 1100B may include a photocurable material. For example, the second substrate layer 1100B may be a photo imagable dielectric (PID). In addition, since the second substrate layer 1100B includes a photocurable material, it is possible to miniaturize the electrode. Accordingly, in the seventh embodiment, the second substrate layer 1100B may be formed by sequentially stacking an insulating layer of a photo-curable material on the first substrate layer 1100A and forming a miniaturized electrode on the insulating layer of the photo-curable material. Through this, the second circuit board 1100B may be a redistribution layer including a miniaturized electrode and include a function to horizontally connect a plurality of semiconductor devices 1310 and 1320.

Before describing the circuit board of the embodiment, a circuit board described below may refer to any one circuit board among a plurality of circuit boards included in a previous semiconductor package. For example, the circuit board described below may mean any one of the first circuit board 1100 and the second circuit board 1200 provided in the semiconductor package of the first to seventh embodiments.

—Circuit Board—

FIG. 3A is a diagram showing a circuit board according to a first embodiment, FIG. 3B is an enlarged view of one region of the circuit board of FIG. 3A, FIG. 3C is a diagram showing a first modified example of the circuit board of FIG. 3B, FIG. 3D is a diagram showing a second modified example of the circuit board of FIG. 3B, FIG. 3E is a diagram showing a third modified example of the circuit board of FIG. 3B, and FIG. 3F is a diagram showing a fourth modified example of the circuit board of FIG. 3B.

Hereinafter, the circuit board according to the first embodiment will be described in detail with reference to FIGS. 3A to 3F.

Referring to FIGS. 3A to 3F, the circuit board may include an insulating layer 110, a circuit pattern layer, a via, and a metal layer such as a bump. At this time, the circuit board in the first embodiment may have a structure in which a bump is disposed on a pad of a circuit pattern layer for bonding to chips or external boards. Accordingly, in a first embodiment, a first metal layer may refer to a pad, and a second metal layer may refer to a bump. Hereinafter, the first metal layer will be referred to as a pad, and the second metal layer will be referred to as a bump.

For example, an insulating layer 110 may include a first insulating layer 111, a second insulating layer 112, and a third insulating layer 113. At this time, the circuit board is shown in the drawing as having a three-layer structure based on the number of insulating layers, but it is not limited thereto. For example, the circuit board may have a structure (including single-layer structure) of two or less layers based on the number of insulating layers. For example, a circuit board may have a single-layer structure based on the number of insulating layers. For example, a circuit board may have a structure of four or more layers based on the number of insulating layers.

For example, the first insulating layer 111 may be a first outermost insulating layer disposed at an first outermost side in a multi-layer structure. For example, the first insulating layer 111 may be an insulating layer disposed at an uppermost side of the circuit board. The second insulating layer 112 may be an inner insulating layer disposed at an inside of a multi-layered circuit board. The third insulating layer 113 may be a second outermost insulating layer disposed at the second outermost side in a multi-layer structure. For example, the third insulating layer 113 may be an insulating layer disposed at a lowermost side of the circuit board. In addition, the inner insulating layer is shown as consisting of one layer, but if the circuit board has a layer structure of four or more layers, the inner insulating layer may have a layer structure of two or more layers.

The insulating layer 110 is a board equipped with an electric circuit whose wiring can be changed, and may include a print, a wiring board, and an insulating board made of an insulating material capable of forming circuit patterns on the surface.

For example, at least one of the insulating layer 110 may be rigid or flexible. For example, at least one of the insulating layer 110 may include glass or plastic. Specifically, the insulating layer 110 may include a chemically tempered/semi-tempered glass, such as soda lime glass, aluminosilicate glass, etc., a tempered or flexible plastic such as polyimide (PI), polyethylene terephthalate (PET), propylene glycol (PPG), polycarbonate (PC), etc., or sapphire.

In addition, at least one of the insulating layer 110 may include an optically isotropic film. For example, at least one of the insulating layer 110 may include cyclic olefin copolymer (COC), cyclic olefin polymer (COP), optically isotropic PC, optically isotropic polymethylmethacrylate (PMMA), or the like.

In addition, at least one of the insulating layer 110 may be formed of a material including an inorganic filler and an insulating resin. For example, at least one of the insulating layer 330 may be formed of a resin containing reinforcing materials such as inorganic fillers such as silica and alumina together with a thermosetting resin such as an epoxy resin or a thermoplastic resin such as polyimide, specifically Ajinomoto Build-up Film (ABF), FR-4, Bismaleimide Triazine (BT), Photo Imagable Dielectric resin (PID), BT, or the like.

In addition, at least one of the insulating layers 110 may have a partially curved surface and be curved. That is, at least one of the insulating layers 110 is partially flat, and at least one of the insulating layers 110 may have a partially curved surface and be bent. In detail, at least one end of the insulating layer 110 may have a curved surface and be bent, or at least one end of the insulating layer 110 has a surface with random curvature and may be curved or bent.

A circuit pattern layer may be disposed on a surface of the insulating layer 110.

For example, a first circuit pattern layer 120 may be disposed on a first or upper surface of the first insulating layer 111. For example, a second circuit pattern layer 130 may be disposed between a second surface or lower surface of the first insulating layer 111 and a first surface or upper surface of the second insulating layer 112. For example, a third circuit pattern layer 140 may be disposed between a second surface or lower surface of the second insulating layer 112 and a first surface or upper surface of the third insulating layer 113. For example, a fourth circuit pattern layer 150 may be disposed on a second or lower surface of the third insulating layer 113. A first circuit pattern layer 120 may be a circuit pattern layer disposed at a first outermost side or uppermost side of the circuit board. Additionally, the second circuit pattern layer 130 and the third circuit pattern layer 140 may be inner circuit pattern layers disposed inside the circuit board. Additionally, the fourth circuit pattern layer 150 may be a circuit pattern layer disposed at a second outermost side or lowermost side of the circuit board.

The first circuit pattern layer 120, the second circuit pattern layer 130, the third circuit pattern layer 140, and the fourth circuit pattern layer 150 is a wire that transmits electrical signals and may be formed of a metal material with high electrical conductivity. The first circuit pattern layer 120, the second circuit pattern layer 130, the third circuit pattern layer 140, and the fourth circuit pattern layer 150 may be formed of at least one metal material selected from among gold (Au), silver (Ag), platinum (Pt), titanium (Ti), tin (Sn), copper (Cu), and zinc (Zn). In addition, the first circuit pattern layer 120, the second circuit pattern layer 130, the third circuit pattern layer 140, and the fourth circuit pattern layer 150 may be formed of paste or solder paste including at least one metal material selected from among gold (Au), silver (Ag), platinum (Pt), titanium (Ti), tin (Sn), copper (Cu), and zinc (Zn), which are excellent in bonding force. Preferably, the first circuit pattern layer 120, the second circuit pattern layer 130, the third circuit pattern layer 140, and the fourth circuit pattern layer 150 may be formed of copper (Cu) having high electrical or thermal conductivity and a relatively low cost.

The first circuit pattern layer 120, the second circuit pattern layer 130, the third circuit pattern layer 140, and the fourth circuit pattern layer 150 can be formed using an additive process, a subtractive process, a modified semi additive process (MSAP) and a semi additive process (SAP), which is a typical circuit board manufacturing process, and a detailed description will be omitted here.

The first circuit pattern layer 120 may have a thickness ranging from 5 μm to 30 μm. For example, the first circuit pattern layer may have a thickness ranging from 6 μm to 25 μm. The first circuit pattern layer may have a thickness ranging from 7 μm to 20 μm. If the thickness of the first circuit pattern layer 120 is less than 5 μm, the resistance of the circuit pattern increases, and signal transmission efficiency may decrease accordingly. For example, if the thickness of the first circuit pattern layer 120 is less than 5 μm, signal transmission loss may increase. For example, if the thickness of the first circuit pattern layer 120 exceeds 30 μm, a line width of a trace 120T of the first circuit pattern layer 120 may increase, and thus an overall volume of the circuit board may increase.

The second circuit pattern layer 130, the third circuit pattern layer 140, and the fourth circuit pattern layer 150 may each have a thickness corresponding to the thickness of the first circuit pattern layer 120.

Meanwhile, each of the first to fourth circuit pattern layers 120, 130, 140, and 150 includes traces and pads.

The trace refers to a long line-shaped wiring that transmits electrical signals. Additionally, the pad may refer to a mounting pad on which components such as chips are mounted, a core pad or BGA pad for connection to an external board, or a via pad connected to a via.

A via may be formed in the insulating layer 110. The via is formed to pass through the insulating layer 110, and thus can electrically connect circuit pattern layers arranged in different layers.

For example, a first via V1 may be formed in the first insulating layer 111. The first via V1 passes through the first insulating layer 111, and thus can electrically connect the first circuit pattern layer 120 and the second circuit pattern layer 130.

For example, a second via V2 may be formed in the second insulating layer 112. The second via V2 passes through the second insulating layer 112, and thus can electrically connect the second circuit pattern layer 130 and the third circuit pattern layer 140. At this time, the second insulating layer 112 may be a core layer. And, when the second insulating layer 112 is a core layer, the second via V2 may have an hourglass shape. For example, when the circuit board of the embodiment is a coreless board, the second via V2 may have a same shape as the first via V1 or the third via V3.

For example, a third via V3 may be formed in the third insulating layer 113. The third via V3 passes through the third insulating layer 113, and thus can electrically connect the third circuit pattern layer 140 and the fourth circuit pattern layer 150.

The vias V1, V2 and V3 as described above may be formed by filling the inside of a through hole formed in each insulating layer with a metal material. The through hole may be formed by any one of mechanical, laser, and chemical processing. When the via hole is formed by mechanical processing, a method such as milling, drilling and routing may be used, when the via hole is formed by laser processing, a method of UV or $CO_2$ laser may be used, when the via hole is formed by chemical processing, a chemical including amino silane, ketones, or the like may be used. Accordingly, at least one insulating layer among the plurality of insulating layers may be opened.

When the through hole is formed, the vias V1, V2, and V3 may be formed by filling the inside of the through hole with a conductive material. The metal material forming the vias V1, V2, and V3 may be any one selected from among copper (Cu), silver (Ag), tin (Sn), gold (Au), nickel (Ni), and palladium (Pd). In addition, the conductive material may be filled by any one of electroless plating, electroplating, screen printing, sputtering, evaporation, ink jetting, and dispensing, or a combination thereof.

Meanwhile, a first protective layer 160 may be disposed on the first or upper surface of the first insulating layer 111. The first protective layer 160 may include solder resist. The first protective layer 160 may include a recess portion (described later) that vertically overlaps the first circuit pattern layer 120. For example, the first circuit pattern layer 120 may include a pad (e.g., a first metal layer) on which a bump 180 corresponding to the second metal layer of the first embodiment is disposed. Additionally, the first protective layer 160 may include a recess portion that vertically overlaps the pad of the first circuit pattern layer 120. At this time, embodiments of the circuit board of the present application can be classified according to a shape of the recess portion of the first protective layer of the circuit board. Additionally, embodiments of the circuit board of the present application may be classified according to a type of a second metal layer disposed in a recess portion of the first protective layer. For example, a recess portion of the first protective layer may be divided into first to third types. Additionally, a second metal layer disposed in the recess portion of the first protective layer may be divided into a bump and a surface treatment layer. This will be explained in more detail below. Meanwhile, a surface treatment layer can be referred to as an upper metal layer. Furthermore, the bump is shown as having a structure disposed on the third insulating layer 113, but the bump is not limited thereto. For example, at least part of the bump may be buried in the third insulating layer 113, and the remaining part of the bump may protrude on the bump.

Additionally, a second protective layer 170 may be disposed on the second surface of the third insulating layer 113. The second protective layer 170 may include solder resist. The second protective layer 170 may vertically overlap a pad (not shown) of the fourth circuit pattern layer 150.

Meanwhile, referring to FIG. 3B, the first protective layer 160 in the first embodiment may have a stepped structure. For example, the first protective layer 160 may include a first portion 161 disposed on an upper surface of the first insulating layer 111 and a second portion 162 disposed on the first portion 161.

The first portion 161 of the first protective layer 160 may contact the upper surface of the first insulating layer 111. Additionally, the first portion 161 of the first protective layer 160 may contact a portion of a side surface of the first circuit pattern layer 120. Additionally, the first portion 161 of the first protective layer 160 may contact the upper surface of the first circuit pattern layer 120.

Specifically, a thickness of the first portion 161 of the first protective layer 160 may be greater than a thickness of the first circuit pattern layer 120. Accordingly, an upper surface of the first portion 161 of the first protective layer 160 may be positioned higher than an upper surface of the first circuit pattern layer 120.

Accordingly, the first portion 161 of the first protective layer 160 may cover at least a portion of an upper surface of the first circuit pattern layer 120.

The second portion 162 of the first protective layer 160 may be disposed on the first portion 161 of the first protective layer 160. At this time, an area of the second portion 162 of the first protective layer 160 may be smaller than an area of the first portion 161 of the first protective layer 160. Accordingly, an upper surface of the first portion 161 of the first protective layer 160 may include an overlap region that vertically overlaps the second portion 162 of the first protective layer 160 and a non-overlapping region that does not vertically overlap the second portion 162 of the first protective layer 160.

The first portion 161 of the first protective layer 160 may include a first recess portion 161O. For example, the first portion 161 of the first protective layer 160 may include a first recess portion 161O that vertically overlaps the first circuit pattern layer 120. Specifically, the first circuit pattern layer 120 includes a pad. For example, the first circuit pattern layer 120 may include a first pad 120P1 and a second pad 120P2. In addition, the first portion 161 of the first protective layer 160 may include a first recess portion 161O that vertically overlaps the first pad 120P1 and the second pad 120P2 of the first circuit pattern layer 120, respectively. Hereinafter, a first recess portion 161O of the first portion 161 and a second recess portion 162O of the second portion 162 of the first protective layer 160 formed based on the first pad 120P1 will be explained. However, the first recess portion 161O and the second recess portion 162O formed based on the first pad 120P1 may also be formed on the second pad 120P2 of the first circuit pattern layer 120.

A width W2 of the first recess portion 161O of the first portion 161 of the first protective layer 160 can be smaller than a width W1 of the first pad 120P1 of the first circuit pattern layer 120. For example, a width W2 of the first recess portion 161O of the first portion 161 of the first protective layer 160 may satisfy a range of 15% to 95% of the width W1 of the first pad 120P1 of the first circuit pattern layer 120. For example, a width W2 of the first recess portion 161O of the first portion 161 of the first protective layer 160 may satisfy a range of 20% to 90% of the width W1 of the first pad 120P1 of the first circuit pattern layer 120. For example, a width W2 of the first recess portion 161O of the first portion 161 of the first protective layer 160 may satisfy a range of 25% to 85% of the width W1 of the first pad 120P1 of the first circuit pattern layer 120.

If the width W2 of the first recess portion 161O of the first portion 161 of the first protective layer 160 is less than 15% of the width W1 of the first pad 120P1 of the first circuit pattern layer 120, electrical connectivity between the first pad 120P1 and the bump 180 of the first circuit pattern layer 120 may be reduced. Specifically, the bump 180 may be disposed in the first recess portion 161O of the first portion 161 of the first protective layer 160. Accordingly, a lower surface of the bump 180 may have a width corresponding to the width W2 of the first recess portion 161O. At this time, the width W2 of the first recess portion 161O of the first portion 161 of the first protective layer 160 is less than 15% of the width W1 of the first pad 120P1 of the first circuit pattern layer 120, the contact area between the bump 180 and the first pad 120P1 of the first circuit pattern layer 120 decreases, and accordingly, a physical reliability problem may occur in which the bump 180 is separated from or delaminated from the first pad 120P1 of the first circuit pattern layer 120. In addition, if the width W2 of the first recess portion 161O of the first portion 161 of the first protective layer 160 is less than 15% of the width W1 of the first pad 120P1 of the first circuit pattern layer 120, the resistance of the signal transmitted between the bump 180 and the first pad 120P1 of the first circuit pattern layer 120 increases due to the difference in width between the bump 180 and the first pad 120P1 of the first circuit pattern layer 120, and as a result, signal loss may increase.

In addition, if the width W2 of the first recess portion 161O of the first portion 161 of the first protective layer 160 exceeds 95% of the width W1 of the first pad 120P1 of the first circuit pattern layer 120, reliability problems such as circuit shorts may occur. Specifically, the first recess portion 161O of the first portion 161 of the first protective layer 160 is formed through an exposure and development process. At this time, if the width W2 of the first recess portion 161O of the first portion 161 of the first protective layer 160 exceeds 95% of the width W1 of the first pad 120P1 of the first circuit pattern layer 120, a problem may occur in which the width of the first recess portion 161O becomes greater than the width W1 of the first pad 120P1 of the first circuit pattern layer 120 depending on the process deviation in the exposure and development process. Also, when the width of the first recess portion 161O becomes greater than the width W1 of the first pad 120P1 of the first circuit pattern layer 120, the first protective layer 160 of the SMD type according to the first embodiment may not be provided. Additionally, when the width of the first recess portion 161O is greater than the width W1 of the first pad 120P1 of the first circuit pattern layer 120, the bump 180 disposed in the first recess portion 161O contacts the trace 120T of the first circuit pattern layer 120 adjacent to the first pad 120P1, and as a result, electrical reliability problems such as circuit shorts may occur.

Accordingly, the width W2 of the first recess portion 161O of the first portion 161 of the first protective layer 160 can be satisfy a range of 15% to 95% of the width W1 of the first pad 120P1 of the first circuit pattern layer 120.

Meanwhile, a thickness of the first portion 161 of the first protective layer 160 is greater than a thickness of the first pad 120P1 of the first circuit pattern layer 120. For example, the thickness of the first portion 161 of the first protective layer 160 may range from 105% to 180% of the thickness of the first pad 120P1 of the first circuit pattern layer 120. For example, the thickness of the first portion 161 of the first protective layer 160 may range from 110% to 170% of the thickness of the first pad 120P1 of the first circuit pattern layer 120. For example, the thickness of the first portion 161 of the first protective layer 160 may range from 115% to 165% of the thickness of the first pad 120P1 of the first circuit pattern layer 120. The thickness of the first portion 161 of the first protective layer 160 may refer to a vertical distance between a lower surface and an upper surface of the first portion 161 of the first protective layer 160. For example, the thickness of the first portion 161 of the first protective layer 160 may refer to a vertical distance from the upper surface of the first insulating layer 111 to the upper surface of the first portion 161 of the first protective layer 160. For example, the thickness of the first portion 161 of the first protective layer 160 may refer to a vertical distance from the lower surface of the first circuit pattern layer 120 to the upper surface of the first portion 161 of the first protective layer 160. Additionally, the thickness of the first circuit pattern layer 120 may refer to the vertical distance from the lower surface to the upper surface of the first circuit pattern layer 120.

If the thickness of the first portion 161 of the first protective layer 160 is less than 105% of the thickness of the first pad 120P1 of the first circuit pattern layer 120, a distance between the lower surface of the second part 182 of the bump 180, which will be described below, and the trace 120T of the first circuit pattern layer 120 is reduced, and thus mutual signal interference may occur. For example, if the thickness of the first portion 161 of the first protective layer 160 is less than 105% of the thickness of the first pad 120P1 of the first circuit pattern layer 120, signal interference between the bump 180 and the trace 120T may cause problems in the operating performance of the chip mounted on the bump.

In addition, if the thickness of the first portion 161 of the first protective layer 160 exceeds 180% of the thickness of the first pad 120P1 of the first circuit pattern layer 120, the thickness of the bump 180 may increase corresponding to the thickness of the first portion 161 of the first protective layer 160, and thus the overall thickness of the circuit board may increase.

Accordingly, the thickness of the first portion 161 of the first protective layer 160 is set to range from 105% to 180% of the thickness of the first pad 120P1 of the first circuit pattern layer 120.

Meanwhile, the first portion 161 of the first protective layer 160 may be divided into a plurality of unit parts. For example, the first portion 161 of the first protective layer 160 may be divided into a first-first portion disposed on the first portion 161 and covering a side of the first circuit pattern layer 120, and a first-second portion disposed on the first-first portion and including the first recess portion 161O. Also, at least a portion of the first-second portion may be disposed on the first pad 120P1 of the first circuit pattern layer 120. Meanwhile, the first circuit pattern layer 120 may pass through the first-first portion of the first protective layer 160. For example, the first-first portion of the first protective layer 160 may include a recess portion (not shown) corresponding to a through hole through which the first circuit pattern layer 120 passes.

As described above, the first recess portion 161O of the first portion 161 of the first protective layer 160 has a width W2 that is smaller than the width W1 of the first pad 120P1 of the first circuit pattern layer 120. Accordingly, the first portion 161 of the first protective layer 160 may cover at least a portion of the upper surface of the first pad 120P1 of the first circuit pattern layer 120. For example, the first portion 161 of the first protective layer 160 may cover an edge region of the upper surface of the first pad 120P1 of the first circuit pattern layer 120, but is not limited thereto. Accordingly, the first portion 161 of the first protective layer 160 may include an overlapping region that vertically overlaps the first pad 120P1 of the first circuit pattern layer 120, and a non-overlapping region that does not vertically overlap the first pad 120P1 of the first circuit pattern layer 120.

Meanwhile, as described above, the first circuit pattern layer 120 includes a trace 120T in addition to the first pad 120P1 and the second pad 120P2. Also, the thickness of the first portion 161 of the first protective layer 160 is greater than the thickness of the first circuit pattern layer 120. Accordingly, the trace 120T of the first circuit pattern layer 120 may be covered with the first portion 161 of the first protective layer 160 disposed on the upper surface of the first insulating layer 111.

The first protective layer 160 includes a second portion 162 disposed on the first portion 161.

The second portion 162 of the first protective layer 160 includes a second recess portion 162O. The second recess portion 162O of the second portion 162 of the first protective layer 160 may vertically overlap the first pad 120P1 of the first circuit pattern layer 120. Additionally, the second recess portion 162O of the second portion 162 of the first protective layer 160 may vertically overlap the first recess portion 161O of the first portion 161.

At this time, the width W3 of the second recess portion 162O of the second portion 162 of the first protective layer 160 may be greater than the width W2 of the first recess portion 161O of the first portion 161 of the first protective layer 160. In addition, the width W3 of the second recess portion 162O of the second portion 162 of the first protective layer 160 may be greater than the width W1 of the first pad 120P1 of the first circuit pattern layer 120. However, the embodiment is not limited thereto. For example, the width W3 of the second recess portion 162O may be the same as the width W1 of the first pad 120P1. That is, in the structure of the protective layer including the recess portion of SMD type in the first comparative example, the width of the upper surface of the bump is inevitably smaller than the width of the pad. Differently, in the first embodiment, the width of the upper surface of the bump 180 may be increased to be at least equal to the width of the first pad 120P1, and furthermore, the width of the upper surface of the bump 180 can have a width greater than that of the first pad 120P1. However, the first embodiment provides a structure that can maximize the width of the upper surface of the first bump 180 without increasing the thickness of the circuit board and affecting the physical and electrical reliability of the circuit board. Accordingly, the width of the second recess portion 162O is greater than the width of the first pad 120P1. Through this, the width of the upper surface of the bump 180 in the embodiment may be greater than the width of the first pad 120P1.

For example, the width W3 of the second recess portion 162O may range from 102% to 130% of the width W1 of the first pad 120P1. For example, the width W3 of the second recess portion 162O may range from 105% to 130% of the width W1 of the first pad 120P1. The width W3 of the second recess portion 162O may range from 102% to 130% of the width W1 of the first pad 120P1. If the width W3 of the second recess portion 162O is less than 102% of the width of the first pad 120P1, the effect of increasing the contact area with solder resulting from increasing the width of the upper surface of the bump 180 according to the first embodiment may be insignificant. Additionally, if the width W3 of the second recess portion 162O exceeds 130% of the width W1 of the first pad 120P1, physical reliability problems may occur, or the size of the circuit board in the width or length direction may increase. For example, the bump 180 is disposed within the second recess portion 162O. Accordingly, the bump 180 may include a first bump disposed on the first pad 120P1 a second bump disposed on the second pad 120P2. At this time, the first pad 120P1 may be placed adjacent to the second pad 120P1. Accordingly, the first bump may also be disposed adjacent to the second bump. And, if the width W3 of the second recess portion 162O exceeds 130% of the width W1 of the first pad 120P1, a distance between the first and second bumps disposed in the second recess portion 162O may be too close, and thus, signal interference may occur between them. Additionally, if the width W3 of the second recess portion 162O exceeds 130% of the width W1 of the first pad 120P1, the first bump and the second bump may be connected to each other depending on a pitch between the first bump and the second bump, which may cause electrical reliability problems such as a circuit short. Additionally, if the width W3 of the second recess portion 162O exceeds 130% of the width W1 of the first pad 120P1, in order to solve the circuit short circuit problem between the first bump and the second bump as described above, the pitch between the first bump and the second bump must be increased, and thus the size of the circuit board can be increased.

As described above, in the first embodiment, a recess portion having a step is formed in the first protective layer 160. For example, the first protective layer 160 includes a first portion 161 and a second portion 162. And, the first portion 161 of the first protective layer 160 includes a first recess portion 161O. Additionally, the second portion 162 of the first protective layer 160 includes a second recess portion 162O having a width greater than a width of the first recess portion 161O.

Meanwhile, the circuit board of the first embodiment includes a bump 180 disposed in the recess portion of the first protective layer 160. The bump 180 may be formed to fill the recess portion of the first protective layer 160. A lower surface of the bump 180 may contact the first pad 120P1 of the first circuit pattern layer 120. Additionally, an upper surface of the bump 180 vertically overlaps the recess portion of the first protective layer 160, and thus may be exposed to an upper side of the circuit board. For example, the second portion 162 of the first protective layer 160 may not vertically overlap the bump 180. Accordingly, the upper surface of the bump 180 is exposed to the upper side of the circuit board, and thus can be used as a mounting part where a chip is mounted, or as a terminal part where an external board is bonded.

The bump 180 may have a 'T' shape. For example, the bump 180 includes a first part 181 disposed in the first recess portion 161O of the first portion 161 of the first protective layer 160. Additionally, the bump 180 includes a second part 182 disposed in the second recess portion 162O of the second portion 162 of the first protective layer 160.

The first part 181 of the bump 180 may have a width corresponding to the width W2 of the first recess portion 161O. For example, the first part 181 of the bump 180 may have a width smaller than the width W1 of the first pad 120P1 of the first circuit pattern layer 120. Accordingly, the first part 181 may vertically overlap a portion of the first pad 120P1. For example, the first pad 120P1 The first pad 120P1 may include an overlapping region that vertically overlaps the first part 181 of the bump 180 and a non-overlapping region that does not vertically overlap the first part 181 of the bump 180.

The second part 182 of the bump 180 may be disposed on the first part 181 of the bump 180. At this time, the first part 181 and the second part 182 of the bump 180 are differentiated for convenience of explanation, but may actually be formed as one piece.

The second part 182 of the bump 180 may have a width corresponding to the width W3 of the second recess portion 162O. For example, the second part 182 of the bump 180 may have a width greater than a width of the first part 181 of the bump 180. Accordingly, the second part 182 of the bump 180 may include an overlapping region that vertically overlaps the first part 181 of the bump 180 and a non-overlapping region that does not vertically overlap the first part 181 of the bump 180. Additionally, the second part 182 of the bump 180 may have a greater width than the first pad 120P1 of the first circuit pattern layer 120. Accordingly, the second part 182 of the bump 180 may include an overlapping region that vertically overlaps the first pad 120P1 and a non-overlapping region that does not vertically overlap the first pad 120P1.

Accordingly, a distance D2 between a plurality of neighboring bumps may be smaller than a distance D1 between a plurality of neighboring pads.

For example, the first circuit pattern layer 120 includes a first pad 120P1 and a second pad 120P2 that are adjacent to each other. Additionally, the bump 180 includes a first bump disposed on the first pad 120P1 and a second bump disposed on the second pad 120P2.

At this time, the distance D1 between the neighboring first pad 120P1 and the second pad 120P2 may be greater than the distance D2 between the first bump and the second bump. For example, the distance D2 between the second part of the first bump and the second part of the second bump may be greater than the distance D1 between the first pad 120P1 and the second pad 120P2.

Here, the pitch between the first bump and the second bump corresponds to the pitch between the first pad 120P1 and the second pad 120P2. For example, the width W3 of the second part 182 of the bump 180 in the first embodiment may increase compared to the comparative example within a range that does not affect the pitch between the first pad 120P1 and the second pad 120P2 of the first circuit pattern layer 120. Through this, the embodiment can increase the bonding area with the solder using the bump 180, and thus improve the bonding strength with the solder. For example, in the embodiment, the bonding area with the solder can be increased by using the second part 182 of the bump 180 having a width greater than the width of the first pad 120P1, and as a result, the bonding strength can be improved. At this time, the second part 182 of the bump 180 in the embodiment does not protrude above the top surface of the first protective layer 160, and has a structure disposed in the first recess portion 161O and the second recess portion 162O of the first protective layer 160. Accordingly, the embodiment can increase a contact area between the bump and solder without increasing the thickness of the circuit board.

Meanwhile, although not shown in FIG. 3B, the first part 181 and the second part 182 of the bump 180 may each have a multiple layer structure. For example, the bump 180 may include a seed layer (not shown) formed by electroless plating on the inner walls of the first recess portion 161O and the second recess portion 162O of the first protective layer 160, and an electrolytic plating layer formed by performing electrolytic plating using the seed layer. For example, the seed layer may be formed on the inner wall of the first recess portion 161O and the inner wall of the second recess portion 162O. Additionally, the electrolytic plating layer may be formed on the seed layer, filling the first recess portion 161O and the second recess portion 162O.

Meanwhile, vertical cross-sectional shapes of the first recess portion 161O and the second recess portion 162O of the first protective layer 160 each had a square shape. For example, the vertical cross sections of the first recess portion 161O and the second recess portion 162O of the first protective layer 160 in FIG. 3B have a rectangular shape with the upper and lower widths being the same. For example, the first recess portion 161O and the second recess portion 162O of the first protective layer 160 in FIG. 3B each have a pillar shape with the same upper and lower widths.

At this time, the first recess portion 161O and the second recess portion 162O are formed through an exposure process and a development process of the first protective layer 160.

Accordingly, as shown in FIG. 3C, vertical cross sections of the first recess portion 161O and the second recess portion 162O may have a trapezoidal shape with different upper and lower widths. For example, the first recess portion 161O may have an inclination in which the width gradually decreases from an upper portion to a lower portion of the first portion 161 of the first protective layer 160. For example, the first recess portion 161O may have a trapezoidal shape with an upper width greater than a lower width. Additionally, the second recess portion 162O may have an inclination in which the width gradually decreases from an upper portion to a lower portion of the second portion 162 of the first protective layer 160. For example, the second recess portion 162O may have a trapezoidal shape with an upper width greater than a lower width. At this time, the slope of the second recess portion 162O may be the same as the slope of the first recess portion 161O, or may be different from the slope of the first recess portion.

Additionally, the bump 180 includes a first part 181 disposed in the first recess portion 161O and a second part 182 disposed in the second recess portion 162O. Accordingly, the first part 181 of the bump 180 may have a shape corresponding to the first recess portion 161O. For example, a vertical cross-sectional shape of the first part 181 of the bump 180 may have a trapezoidal shape where a width of an upper surface is greater than a width of a lower surface. For example, a vertical cross-sectional shape of the second part 182 of the bump 180 may have a trapezoidal shape where a width of an upper surface is greater than a width of a lower surface.

At this time, as shown in FIG. 3C, a width of the first recess portion 161O and a width of the first part 181 of the bump 180 may mean any one of a first width of a region with a maximum width among all regions, a second width of a region with a minimum width among all regions, and a first average width of all regions.

In addition, when the vertical cross-sectional shape of the second recess portion 162O and the second part 182 of the bump 180 has a trapezoidal shape, the width of the second recess portion 162O and the second part 182 of the bump 180 The width of part 2182 may mean any one of a third width of a region with a maximum width among all regions, a fourth width of a region with the minimum width among all regions, and a second average width of all regions.

Meanwhile, referring to FIG. 3D, a lowermost surface of the bump 180 may be located lower than an uppermost surface of the first pad 120P1.

For example, a process of forming the bump 180 includes a first process of forming a first circuit pattern layer 120 on the first insulating layer 111, a second process of forming a first protective layer 160 including a first portion 161 and a second portion 162 on the first circuit pattern layer 120, a third process of forming a second recess portion 162O in the second portion 162 of the first protective layer 160, a fourth process of forming a first recess portion 161O in the first portion 161 of the first protective layer 160, a fifth process of etching the upper surface of the first pad 120P1 vertically overlapping the first recess portion 161O, and a sixth process of forming bumps 180 that fill the first recess portion 161O and the second recess portion 162O.

At this time, debris of the first protective layer 160 may remain on an upper surface of the first pad 120P1 after the first recess portion 161O is formed, accordingly, the fifth process refers to a process of removing the debris by etching an upper surface of the first pad 120P1 that vertically overlaps the first recess portion 161O. At this time, a depression (see 120r in FIG. 12G) is formed on the upper surface of the first pad 120P1 after the fifth process is performed.

In one embodiment, the depression 120r is formed in a region that vertically overlaps a region exposed through a recess portion of the upper surface of the first pad 120P1. For example, when the first recess portion 161O is disposed on the upper surface of the first pad 120P1, the depression 120r is formed in a region that overlaps vertically with a region of the upper surface of the pad 120P1 exposed through the first recess portion 161O (for example, a region vertically overlapping with the first recess portion). That is, the depression 120r is formed in a region that vertically overlaps the first recess portion 161O of the upper surface of the first pad 120P1. Meanwhile, the embodiment is not limited thereto. For example, when the second recess portion 162O is placed directly on the upper surface of the first pad 120P1, the depression 120r is formed in a region that vertically overlaps the region exposed through the second recess portion 162O on the upper surface of the pad 120P1.

At this time, when the upper surface of the first pad 120P1 vertically overlapping the first recess portion 161O is etched using an etchant, the etchant may penetrate into the upper surface of the first pad 120P1 that does not vertically overlap the first recess portion 161O. For example, the etchant may penetrate into a region (For example, a region covered with the first portion of the first protective layer on the upper surface of the first pad) between the lower surface of the first portion 161 of the first protective layer 160 and the upper surface of the first pad 120P1. Accordingly, the depression 120r is formed in a region that does not vertically overlap with the region exposed through the recess portion (Based on the embodiment, the first recess portion 161O or the second recess portion 162O) of the upper surface of the first pad 120P1.

For example, the depression 120r may include a first depression portion formed in a region of the upper surface of the first pad 120P1 that vertically overlaps the first recess portion 161O, and a second depression portion connected to the first recess portion and formed in a region that does not vertically overlap the first recess portion 161O. Additionally, the upper surface of the first pad 120P1 and the lower surface of the first portion 161 of the first protective layer 160 may be spaced apart through the second depression portion of the depression 120r.

Meanwhile, the bump 180 may be formed to fill the depression 120r of the first pad 120P1. For example, the bump 180 may further include a third part 180r formed between the first part 181 and the first pad 120P1.

For example, the third part 180r of the bump 180 may be formed to fill a depression 120r, which is a concave portion on the upper surface of the first pad 120P1.

At this time, the third part 180r of the bump 180 may have a width greater than a width of the first part 181 of the bump 180. For example, the third part 180r of the bump 180 may include a third-first part 180r1 vertically overlapped with the first part 181 and a third-second part 180r2 that does not vertically overlap the first part 181. Also, the third-second part 180r2 may vertically overlap the second part 182 of the bump 180.

Meanwhile, referring to FIG. 3E, a width of the second part of the bump 180 can be further increased compared to the bump 180 of FIG. 3B. At this time, in the description of FIG. 3E, description of parts that are substantially the same as those of FIG. 3B will be omitted. The circuit board of FIG. 3E is different from the circuit board of FIG. 3B in the width of the second recess portion formed in the second portion of the first protective layer and the width of the second part of the bump that fills the second recess portion.

Referring to FIG. 3E, the second portion 162a of the first protective layer 160a may include a second recess portion 162Oa. Additionally, the second recess portion 162Oa may be greater than the second recess portion 162O of FIG. 3B.

Additionally, the bump 180a includes a second part 182a disposed in the second recess portion 162Oa of the second portion 162a. Additionally, the second part 182a may have a greater width than the second part 182 of FIG. 3B.

Meanwhile, the first circuit pattern layer 120 may include a first pad 120P1 and a second pad 120P2 disposed adjacent to each other, and a trace 120T disposed between the first pad 120P1 and the second pad 120P2.

At this time, in a structure of FIG. 3E, the width of the second part 182a of the bump 180a can be further increased, and accordingly, at least a portion of the bump 180a may have a structure that vertically overlaps the trace 120T of the first circuit pattern layer 120.

For example, the second part 182a of the bump 180a include an overlapping region that vertically overlaps the first pad 120P1 of the first circuit pattern layer 120 and a non-overlapping region that does not vertically overlap the first pad 120P1. In addition, the non-overlapping region of the second part 182a of the bump 180a may include an overlapping region OR1 that vertically overlaps the trace 120T disposed vertically adjacent to the first pad 120P1. As described above, the embodiment may increase the width of the second part 182a of the bump 180a to a region that vertically overlaps the trace 120T, and accordingly, the bonding area with the solder disposed on the second part 182a can be further increased.

For example, the trace 120T may be disposed between the first pad 120P1 and the second pad 120P2 at a predetermined distance from the first pad 120P1 and the second pad 120P2. Additionally, the second part 182a of the bump 180a may include an overlap region OR1 that vertically overlaps the trace 120T.

Meanwhile, referring to FIG. 3F, the embodiment can simplify the manufacturing process while increasing the width of the bump 180 to increase the bonding area with the solder.

At this time, a detailed description of parts that are substantially the same as the circuit board of FIG. 3B will be omitted.

Referring to FIG. 3F, the recess portion in the embodiment may be formed only in the second portion 162 of the first protective layer 160.

For example, the first recess portion 161O of the embodiment described in FIG. 3B may be omitted. Accordingly, the first part 181 of the bump 180 may also be omitted.

Accordingly, the first protective layer 160 includes a second recess portion 162O. The second recess portion 162O may have a width greater than the width of the pad 120P1. Additionally, a bottom surface of the second recess portion 162O may not be higher than an upper surface of the pad 120P1. For example, a bottom surface of the second recess portion 162O may be located on a same plane as the upper surface of the pad 120P1, or may be located lower than an upper surface of the pad 120P1.

Accordingly, the second part 182 of the bump 180 in the embodiment has a width greater than the width of the pad 120P1 and can be disposed directly on the pad 120P1. Through this, the embodiment only needs to form one recess portion in a process of forming a recess portion having a step in the first protective layer 160, thereby simplifying the manufacturing process. Furthermore, in the embodiment, since the bump 180 includes only the second part 182, a thickness of the bump 180 can be reduced, and further, an overall thickness of the circuit board can be reduced.

However, in a case of FIG. 3F, the second part 182 of the bump 180 may be located on the same plane as the upper surface of the trace adjacent to the pad, or may be located lower than the upper surface of the trace adjacent to the pad. Accordingly, a distance between the pad and the trace can be determined based on the width of the second part 182 of the bump 180.

Hereinafter, a second embodiment of the present application will be described. At this time, an overall structure of the circuit board of the second embodiment is the same as that of the circuit board of the first embodiment shown in FIG. 3A. Specifically, the circuit board of the second embodiment differs in a structure of the recess portion of the first protective layer disposed on an uppermost side of the circuit board and a structure of the bump disposed within the recess portion, compared to the circuit board of the first embodiment.

FIG. 4A is a diagram showing a circuit board according to a second embodiment, and FIG. 4B is a diagram showing a modified example of the circuit board of FIG. 4A.

Referring to FIG. 4A, the circuit board of the second embodiment includes a first insulating layer 211. The first insulating layer 211 is substantially the same as the first insulating layer 111 of FIG. 3A, and therefore detailed description thereof will be omitted.

Additionally, the circuit board of the second embodiment includes a first circuit pattern layer disposed on an upper surface of the first insulating layer 211. The first circuit pattern layer may include a first pad 220P1, a second pad 220P2, and a trace 220T.

Meanwhile, the circuit board of the second embodiment includes a first protective layer 260 disposed on an upper surface of the first insulating layer 211.

The first protective layer 260 includes a first portion disposed on the upper surface of the first insulating layer 211 including a first recess portion 261O that vertically overlaps the first pad 220P1 of the first circuit pattern layer. A bottom surface of the first recess portion 261O may be lower than the upper surface of the first pad 220P1.

In addition, the first protective layer 260 may include a second portion 262 disposed on the first portion 261 and including a second recess portion 262O that vertically overlaps the first recess portion 261O and the first pad 220P1.

The first portion 261 of the first protective layer 260 includes a first recess portion 261O having a width W2b greater than the width W1b of the first pad 220P1. Accordingly, the first recess portion 261O of the first portion 261 of the first protective layer 260 may include an overlapping region that vertically overlaps the first pad 220P1 and a non-overlapping region that does not vertically overlap the first pad 220P1. Additionally, a region of the upper surface of the first insulating layer 211 that vertically overlaps the first recess portion 261O without vertically overlapping the first pad 220P1 may be exposed through the first recess portion 261O.

At this time, a width W1b of the first pad 220P1 in the second embodiment may be smaller than a width W1 of the first pad 120P1 in the first embodiment. Also, a width W2b of the first recess portion 261O in the second embodiment may correspond to the width W1 of the first pad 120P1 in the first embodiment.

Meanwhile, the first protective layer 260 includes a second portion 262 including the second recess portion 262O. A width W3b of the second recess portion 262O of the second portion 262 may be greater than the width W1b of the first pad 220P1 and the width W2b of the first recess portion 261O. For example, the width W3b of the second recess portion 262O of the second portion 262 may correspond to the width W3 of the second recess portion 162O in the first embodiment, but is not limited thereto.

The bump 280 is formed to fill the first recess portion 261O and the second recess portion 262O of the first protective layer 260. For example, the bump 280 includes a first part 281 disposed in the first recess portion 261O of the first protective layer 260 and a second part 282 disposed in the second recess portion 262O of the first protective layer 260.

At this time, the first recess portion 261O has a width greater than the width of the first pad 220P1.

Accordingly, the width of the first part 281 of the bump 280 may be greater than the width of the first pad 220P1. For example, the first part 281 of the bump 280 may include a first-first part surrounding a side surface of the first pad 220P1 and a first-second part disposed on the first-first part and the first pad 220P1.

As described above, according to the second embodiment, the first protective layer 260 includes a first recess portion 261O and a second recess portion 262O of the NSMD type. In addition, the first part 281 and the second part 282 of the bump 280 may be disposed in the first recess portion 261O and the second recess portion 262O of the NSMD type, respectively.

According to the second embodiment as described above, the first pad 220P1 may be formed to have a smaller width than the first pad of the first embodiment, and accordingly, it is possible to secure design freedom of the first circuit pattern layer disposed on the upper surface of the first insulating layer. In addition, a portion where the width of the first pad 220P1 of the second embodiment is reduced compared to the first pad of the first embodiment can be covered by the first part 281 of the bump 280, and accordingly, the design freedom of the first circuit pattern layer can be improved without affecting the electrical and physical reliability of the circuit board.

Meanwhile, in FIG. 4A, the first pad 220P1, the second pad 220P2, and the trace 220T of the first circuit pattern layer are shown to have the same cross-sectional shape, but the present invention is not limited thereto.

For example, referring to FIG. 4B, the pad of the first circuit pattern layer may have a cross-sectional shape different from that of the trace. For example, the first circuit pattern layer includes a first pad 220P1a, a second pad 220P2a, and a trace 220T.

The trace 220T of FIG. 4B may have the same cross-sectional shape as the trace of FIG. 4A. For example, the vertical cross-sectional shape of the trace 220T of FIG. 4B may have a square shape.

For example, the trace 220T of FIG. 4B is formed through electrolytic plating and may not vertically overlap the recess portion of the first protective layer 260. Accordingly, the trace 220T may not be removed in an etching process to remove debris after the recess portion of the first protective layer 260 is formed.

The first pad 220P1*a* and the second pad 220P2*a* of the first circuit pattern layer vertically overlap the first recess portion 261O and the second recess portion 262O of the first protective layer 260.

For example, an entire region of the first pad 220P1*a* and the second pad 220P2*a* vertically overlaps the first recess portion 261O and the second recess portion 262O.

And, when performing a process to remove debris of the first protective layer 260 on the first pad 220P1*a* and the second pad 220P2*a* after the first recess portion 261O and the second recess portion 262O are formed, etching may be performed not only on the upper surfaces of the first pad 220P1*a* and the second pad 220P2*a*, but also on the side surfaces of the first pad 220P1*a* and the second pad 220P2*a*.

Accordingly, at least a portion of the upper surfaces of the first pad 220P1*a* and the second pad 220P2*a* may have a curved surface CS. In addition, at least a portion of the side surfaces of the first pad 220P1*a* and the second pad 220P2*a* may also have a curved surface that is etched by the etching process. For example, a boundary region between the upper and side surfaces of the first pad 220P1*a* and the second pad 220P2*a* may have a curved surface as it is etched in the etching process.

As described above, the circuit board according to the second embodiment can form the recess portion of the first protective layer as an NSMD type, and accordingly may include a bump including a first part and a second part disposed within the NSMD type recess portion. And, according to the second embodiment, in addition to the effects of the first embodiment, the degree of freedom in design of the first circuit pattern layer can be further improved, and thus product satisfaction can be improved.

FIG. 5 is a diagram showing a circuit board according to a third embodiment.

A basic structure of FIG. 5 is the same as the basic structure of the circuit board of FIG. 4A, and differs in a width of the first recess portion formed in the first portion of the first protective layer and the first part of the bump disposed in the first recess portion.

For example, the first protective layer 260*a* may include a first portion 261*a* including a first recess portion 261O*a*.

Additionally, the bump 280*a* may include a first part 281*a* that fills the first recess portion 261O*a* of the first protective layer 260*a*.

At this time, the first recess portion 261O*a* of the first portion 261*a* of the first protective I20ayer 260 may have a width W1*b* equal to the width of the first pad 220P1*a*. Accordingly, a side surface of the first pad 220P1*a* may be covered with the first portion 261*a* of the first protective layer 260.

FIG. 6 is a diagram showing a circuit board according to a fourth embodiment.

Referring to FIG. 6, the circuit board according to the fourth embodiment has a difference in a depth of the first recess portion compared to the circuit board according to the second embodiment.

For example, a depth of the first recess portion in the second embodiment corresponds to a thickness of the first portion of the first protective layer.

Differently, a depth of the first recess portion in the fourth embodiment may have a depth smaller than a thickness of the first portion of the first protective layer 260. That is, a bottom surface of the first recess portion may be lower than the upper surface of the first pad 320P1, but may be higher than the upper surface of the insulating layer 311.

Accordingly, in the second embodiment, an entire side surface of the first pad of the first circuit pattern layer was exposed through the first recess portion of the first protective layer.

Differently, in the fourth embodiment, a portion of the side surface of the first pad may be covered with the first protective layer, and the remaining portion may be exposed through the first recess portion of the first protective layer.

For example, the first protective layer 360 includes a first portion 361 and 362 and a second portion 363 disposed on the first portion 361 and 362.

The first portions 361 and 362 of the first protective layer 360 include a first recess portion 362O having a width greater than the width of the first pad 320P1 of the first circuit pattern layer. At this time, the first recess portion 362O may be formed by opening a portion of the first portion 361 and 362 of the first protective layer 360.

Accordingly, the first portion 361 and 362 may be divided into a region including the first recess portion 362O and a region not including the first recess portion 362O.

For example, the first portions 361 and 362 may include a first-first portion 361 disposed on the first insulating layer 311. The first-first portion 361 may be formed to surround a side surface of the first pad 320P1. For example, the first-first portion 361 may be formed to cover a portion of the side surface of the first pad 320P1. At this time, the upper surface of the first-first portion 361 may be located lower than the upper surface of the first pad 320P1. Accordingly, the side surface of the first pad 320P1 may include a first side surface that overlaps the first-first portion 361 in the horizontal direction and a second side surface other than the first side surface. Also, the first side surface of the first pad 320P1 may be covered with the first-first portion 361. At this time, the first-first portion 361 of the first protective layer 360 may include a through hole 3610 through which the first pad 320P1 passes. At this time, the through hole 3610 of the first-first portion 361 may also be expressed as a recess portion. The through hole 3610 of the first-first portion 361 may have a width equal to the width of the first pad 320P1. Accordingly, the first-first portion 361 may be formed to surround the first side surface of the first pad 320P1.

The first portion 361 and 362 of the first protective layer 360 include a first-second portion 362 disposed on the first-first portion 361. And, the first-second portion 362 includes a first recess portion 362O. For example, the first-second portion 362 includes a first recess portion 362O having a width greater than the width of the pad 320P1. A lower surface of the first-second portion 362 may be located lower than the upper surface of the first pad 320P1. For example, A bottom portion of the first recess portion 362O of the first-second portion 362 may be located lower than the upper surface of the first pad 320P1. Accordingly, the second side surface of the first pad 320P1 may overlap the first recess portion 362O of the first-second portion 362 in the horizontal direction. Accordingly, the second side surface of the first pad 320P1 may be spaced apart from an inner wall of the first recess portion 362O of the first-second portion 362 by a certain distance.

The second portion 363 of the first protective layer 360 is disposed on the first-second portion 362 of the first protective layer 360. The second portion 363 includes a second recess portion 363O having a width greater than the width of the first recess portion 362O.

As above, according to the fourth embodiment, the first recess portion 362O of the first protective layer 360 is formed to pass through only a portion (first-second portion 362) of the first portion 361 and 362 of the first protective layer 360, not the entire portion. Accordingly, the first side surface, which is portion of the side surface of the first pad 320P1, is covered with the first-first portion 361, and the second side surface, which is the remaining portion of the side of the first pad 320P1, may be exposed through the first recess portion 362O of the first-second portion 362.

The bump 380 may be disposed in the first recess portion 362O and the second recess portion 363O of the first protective layer 360.

For example, the bump 380 includes a first part 381 disposed in the first recess portion 362O of the first protective layer 360, and a second part 382 disposed in the second recess portion 363O.

At this time, the first part of the bump in the second embodiment was formed to completely surround the side surface of the first pad.

Alternatively, the first part 381 of the bump 380 in the fourth embodiment may be disposed to surround only the second side surface of the first pad 320P1. For example, the first part 381 of the bump 380 may be formed to surround the second side surface of the first pad 320P1 that horizontally overlaps the first recess portion 362O.

In the circuit board of the first to fourth embodiments described above, the first protective layer includes various types of recess portions, and thus has a structure in which a second metal layer corresponding to a bump is disposed within the recess portion. For example, the circuit boards of the first to fourth embodiments includes a bump including a first part disposed within a first recess portion of the first protective layer and a second part disposed within the second recess portion.

Meanwhile, in the circuit board of the embodiment, the bump is omitted, and accordingly, the second metal layer corresponding to the surface treatment layer can be directly disposed on the pad of the first circuit pattern layer. Hereinafter, a circuit board including a second metal layer corresponding to the surface treatment layer will be described.

FIG. 7A is a diagram showing a circuit board according to a fifth embodiment, FIG. 7B is an enlarged view of one region of the circuit board of FIG. 7A, and FIG. 7C is a diagram showing a modified example of the circuit board of FIG. 7A.

Hereinafter, a circuit board and modifications thereof according to the fifth embodiment will be described with reference to FIGS. 7A to 7C.

Referring to FIGS. 7A to 7C, the circuit board according to the fifth embodiment includes an insulating layer 410.

The insulating layer 410 includes a first insulating layer 411, a second insulating layer 412 under the first insulating layer 411, and a third insulating layer 413 under the second insulating layer 412.

A circuit pattern layer is disposed on a surface of the insulating layer 410.

For example, a first circuit pattern layer 420 is disposed on an upper surface of the first insulating layer 411. For example, a second circuit pattern layer 430 is disposed between a lower surface of the first insulating layer 411 and an upper surface of the second insulating layer 412. For example, a third circuit pattern layer 440 is disposed between a lower surface of the second insulating layer 412 and an upper surface of the third insulating layer 413. For example, a fourth circuit pattern layer 440 is disposed on a lower surface of the third insulating layer 413.

And, a via is disposed in the insulating layer 410.

For example, a first via V1 is disposed in the first insulating layer 411. For example, a second via V2 is disposed in the second insulating layer 412. For example, a third via V3 is disposed in the third insulating layer 413.

A first protective layer 460 is disposed on an upper surface of the first insulating layer 411. And, a second protective layer 470 is disposed on a lower surface of the third insulating layer 413.

Meanwhile, the basic structures of the insulating layer, circuit pattern layer, and via in the fifth embodiment are substantially the same as the second embodiment described in FIG. 3A, and therefore detailed description thereof is omitted.

The first protective layer 460 includes a first portion 461 and a second portion 462.

Since the first portion 461 and the second portion 462 of the first protective layer 460 have already been described with reference to FIG. 3B, detailed description thereof will be omitted.

The first portion 461 of the first protective layer 460 includes a first recess portion 461O. Additionally, the second portion 462 of the first protective layer 460 includes a second recess portion 462O. A width W2 of the first recess portion 461O of the first portion 461 may be smaller than a width W1 of the first pad 420P1 of the first circuit pattern layer.

A width W3 of the second portion 462 of the first protective layer 460 may be greater than the width W1 of the first pad 420P1 and the width W2 of the first recess portion 461O. Since this has already been described in the first embodiment, detailed description thereof will be omitted.

A surface treatment layer 480 is disposed on the first pad 420P1. For example, the surface treatment layer 480 may be disposed on the first pad 420P1 vertically overlapping the first recess portion 461O.

At this time, the bump in the previous embodiment was formed by entirely filling the first recess portion and the second recess portion of the first protective layer through electrolytic plating.

Unlike this, in the fifth embodiment, electroless plating is performed on the first pad 420P1 to form a surface treatment layer 480 that fills a portion of the recess portion of the first protective layer 460. For example, the surface treatment layer 480 may include a first part 481 disposed in the first recess portion 461O of the first portion 461 of the first protective layer 460. In addition, the surface treatment layer 480 includes a second part 482 disposed on the first part 481 to fill a portion of the second recess portion 462O of the second portion 462 of the first protective layer 460.

At this time, in the drawing, the second part 482 of the surface treatment layer 480 is shown as having a structure that fills a portion of the second recess portion 462O of the second portion 462 of the second protective layer 460. However, the embodiment is not limited thereto. For example, the first protective layer 460 in the fifth embodiment may have a thickness corresponding to the thickness of the surface treatment layer 480, and accordingly, the second part 482 of the surface treatment layer 480 may be formed to entirely fill the second recess portion 462O. And, when having this structure, the embodiment can reduce the thickness of the first protective layer 460, thereby reducing the overall thickness of the circuit board.

The second part 482 of the surface treatment layer 480 has a width corresponding to the width of the second recess portion 462O and may have a structure extending in the horizontal direction on the first part 481.

Meanwhile, in the first portion 461 of the first protective layer 460, the thickness of the overlapping region vertically overlapping the first pad 420P1 may be smaller than a total thickness of the surface treatment layer 480. Accordingly, the surface treatment layer 480 may include a second part 482 that expands to fill the first recess portion 461O and a portion of the second recess portion 462O. At this time, a thickness of the overlapping region that vertically overlaps the first pad 420P1 in the first portion 461 may refer to a vertical distance from the upper surface of the first pad 420P1 to the upper surface of the first portion 461. The thickness of the overlapping region of the first portion 461 may be within a range of 0.5 um to 4.0 um. For example, the thickness of the overlapping region of the first portion 461 may be within a range of 0.8 um to 3.5 um. For example, the thickness of the overlapping region of the first portion 461 may be within the range of 1.0 um to 3.0 um. If the thickness of the overlapping region of the first portion 461 is less than 0.5 um, a distance between the second part 482 of the surface treatment layer 480 and the trace 420T of the first circuit pattern layer is reduced, and as a result, electrical reliability problems such as circuit shorts or operational reliability problems due to signal interference may occur. Additionally, if the thickness of the overlapping region of the first portion 461 exceeds 4.0 um, the surface treatment layer 480 may have a structure that does not include the second part 482. For example, the surface treatment layer 480 is formed through electroless plating, and thus there is a limit to the plating thickness. And, if the thickness of the overlapping region exceeds 4.0 um, the surface treatment layer 480 may include only the first part 481 that fills only the first recess portion 461O, and as a result, the bonding area for improving bonding strength with solder may not be secured. Additionally, if the thickness of the overlapping region exceeds 4.0 um, a distance between a metal contact layer (IMC: Inter Metallic Contact) disposed on the surface treatment layer 480 and a corner portion (For example, the upper or lower part of the inner wall of the first recess portion) of the first portion 461 of the first protective layer 460 may be reduced. And, if the distance between the metal contact layer (IMC: Inter Metallic Contact) and the corner portion of the first portion 461 decreases, a stress occurring in the first protective layer 460 is directly transmitted to the metal contact layer (IMC: Inter Metallic Contact), and as a result, physical and electrical reliability problems may occur. The metal contact layer (IMC: Inter Metallic Contact) will be described in detail below.

Meanwhile, the first part 481 and the second part 482 of the surface treatment layer 480 are disposed in the first recess portion 461O and the second recess portion 462O of the first protective layer 460.

At this time, the thickness of the surface treatment layer 480 may range from 4 um to 10 um. For example, the thickness of the surface treatment layer 480 may range from 4.5 um to 9 um. For example, the thickness of the surface treatment layer 480 may range from 5.0 um to 8 um. If the thickness of the surface treatment layer 480 is less than 4 um, a distance between the metal bonding layer (IMC) formed on the surface treatment layer 480 and the corner portion of the first portion 461 of the first protective layer 460 is reduced, and as a result, reliability problems may occur as the stress of the first protective layer 460 is directly transferred to the metal bonding layer (IMC). In addition, when the thickness of the surface treatment layer 480 exceeds 10 μm, electroless plating process time may increase. In addition, if the thickness of the surface treatment layer 480 exceeds 10 μm, this may increase manufacturing costs. For example, when forming a surface treatment layer with a thickness exceeding 10 μm using electroless plating, a nickel plating layer must be divided into multiple processes, which may increase a process time. Additionally, if forming a surface treatment layer with a thickness exceeding 10 μm using electroless plating, there is a problem that the thickness of the palladium plating layer or the gold plating layer must be increased, and the manufacturing cost increases accordingly.

At this time, the thickness of the surface treatment layer 480 may mean an average thickness of an entire region of the surface treatment layer 480. Differently, the thickness of the surface treatment layer 480 may refer to any one of the maximum thickness, minimum thickness, and average thickness in a region that vertically overlaps the first circuit pattern layer 420 among all regions of the surface treatment layer 480.

At this time, the thickness of the surface treatment layer 480 may refer to a vertical distance from a lowermost end of the first part 481 of the surface treatment layer 480 to an uppermost end of the second part 482 of the surface treatment layer 480.

Meanwhile, the surface treatment layer 480 may be formed using an electroless nickel electroless palladium immersion gold (ENEPIG) method or an electroless nickel immersion gold (ENIG) method.

Accordingly, the surface treatment layer 480 may have a multiple layer structure. For example, when the surface treatment layer 480 is formed by the ENEPIG method, the surface treatment layer 480 may include a nickel metal layer, a palladium metal layer on the nickel metal layer, and a gold metal layer on the palladium metal layer. For example, when the surface treatment layer 480 is formed using the ENIG method, the surface treatment layer 480 may include a nickel metal layer and a gold metal layer on the nickel metal layer.

At this time, when the surface treatment layer 480 has a plurality of layer structure, the nickel metal layer may have a thickest thickness among the plurality of layers. For example, the thickness of the nickel metal layer may be 90% or more of a total thickness of the surface treatment layer 480. Accordingly, the first part 481 of the surface treatment layer 480 may include only a nickel metal layer, and the second part 482 of the surface treatment layer 480 may include a nickel metal layer, a palladium metal layer, and a gold metal layer. Alternatively, the second part 482 of the surface treatment layer 480 may include a nickel metal layer and a gold metal layer.

As described above, the thickness of the surface treatment layer 480 in the embodiment is 4 μm or more. This is to ensure that the thickness of the surface treatment layer 480 is greater than the depth of depression that occurs in the etching process of the first pad 420P1 performed before forming the surface treatment layer 480.

For example, in the comparative example, the surface treatment layer had a thickness of 3 μm or less. At this time, a length of the depression is generally about 3 um. At this time, when a thickness of the surface treatment layer is about 3 um as in the comparative example, the surface treatment layer may be formed to fill only the depression. For example, when the thickness of the surface treatment layer is about 3 um as in the comparative example, the surface treatment layer may not be formed in the recess portion of the first protective layer. At this time, the solder is disposed on the surface treatment layer. And, as the solder is disposed on the surface treatment layer, a metal contact layer (IMC) is formed at the interface between the solder and the surface treatment layer. At this time, when the thickness of the surface treatment layer is about 3 um as in the comparative example, the metal contact layer (IMC) has a height similar to the interface between the first portion of the first protective layer and the upper surface of the first pad. And, when the metal contact layer (IMC) has a height similar to the interface between the first portion of the first protective layer and the upper surface of the first pad, stress occurring in the first protective layer is directly transmitted to the metal bonding layer (IMC), resulting in electrical and physical reliability problems.

Accordingly, the surface treatment layer 480 in the embodiment has a thickness of at least 4 um. Accordingly, the surface treatment layer 480 includes a first part 481 and a second part 482 that fill the depression and the first recess portion 461O and the second recess portion 462O of the first protective layer 460.

Meanwhile, since the surface treatment layer 480 in the embodiment has a thickness of 4 μm or more, at least a portion of the upper surface of the surface treatment layer 480 may include a curved surface. For example, the upper surface of the second part 482 of the surface treatment layer 480 may include a curved surface. That is, the second part 482 of the surface treatment layer 480 includes a first region vertically overlapping with the first part 481 and a second region that does not vertically overlap the first part 481. And, during the plating process of the second part 482, plating is preferentially performed in the first region, and then extended plating is performed in the second region. Accordingly, the thickness of the first region of the second part 482 may be greater than the thickness of the second region. For example, the second part 482 may gradually decrease in thickness from the first region to the second region. Accordingly, the upper surface of the second part 482 may have a curved surface. Additionally, the second region of the second part 482 may include a second-first region vertically overlapping with the first pad 420P1 and a second-second region that does not vertically overlap the first pad 420P1. For example, the second part 481 may have a width as great as the width corresponding to the second-second region compared to the width of the first pad 420P1.

Additionally, as shown in FIG. 7C, a depression (not shown) is formed in the first pad 420P1. The depression includes a first depression portion formed on the upper surface of the first pad 420P1 vertically overlapping the first recess portion 461O and a second depression portion formed on the upper surface of the first pad 420P1 that extends from the first recessed portion and does not vertically overlap the first recess portion 461O. That is, the depression includes a first depression portion formed in a region that vertically overlaps a region exposed through the first recess portion 461O of the upper surface of the first pad 420P1. Additionally, the depression includes a second depression portion formed in a region that does not vertically overlap with the region exposed through the first recess portion 461O of the upper surface of the first pad 420P1.

Additionally, the surface treatment layer 480 may include a third part 480r formed to fill the depression of the first pad 420P1.

Additionally, in the embodiment, as described above, the surface treatment layer 480 has a thickness of 4 μm or more.

Accordingly, an uppermost surface of the surface treatment layer 480 (for example, the upper surface of the second part) in the embodiment may be spaced apart from the interface between the first portion 461 of the first protective layer 460 and the upper surface of the first pad 420P1. At this time, solder 490 is disposed on the surface treatment layer 480, and accordingly, a metal contact layer 495 is formed between the solder 490 and the surface treatment layer 480. And, according to the structure above, the embodiment may allow the metal contact layer 495 to be spaced far from the interface between the first portion 461 of the first protective layer 460 and the upper surface of the first pad 420P1, and accordingly, the reliability of the metal contact layer 495 can be improved.

FIG. 8 is a diagram showing a circuit board according to the sixth embodiment.

Referring to FIG. 8, the circuit board according to the embodiment includes a first insulating layer 511, and a first circuit pattern layer including a first pad 520P1, a second pad 520P2, and a trace 520T disposed on the first insulating layer 511. Additionally, a first protective layer 560 is formed on the first insulating layer 511.

The first protective layer 560 is disposed on the first insulating layer 511 and includes a first portion 561 including a first recess portion 561O. At this time, a width of the first recess portion 561O may be greater than a width of the first pad 520P1.

At this time, a thickness of the first portion 561 of the first protective layer 560 may be smaller than a thickness of the first pad 520P1. For example, an upper surface of the first portion 561 of the first protective layer 560 may be located lower than an upper surface of the first pad 520P1. At this time, when the upper surface of the first portion 561 of the first protective layer 560 is higher than the upper surface of the first pad 520P1, or the thickness of the first portion 561 of the first protective layer 560 is greater than the thickness of the first pad 520P1, the second part 582 may not be included in the surface treatment layer 580 described below, and as a result, the bonding area with the solder is not increased, and thus the bonding force with the solder may decrease.

Meanwhile, a second portion 562 is formed on the first portion 561 of the first protective layer 560. The second portion 562 may include a second recess portion 562O having a width greater than the width of the first recess portion 561O of the first portion 561 of the first protective layer 560.

Additionally, a surface treatment layer 580 is disposed on the first pad 520P1.

At this time, the surface treatment layer 580 may include a first part 581 filling the first recess portion 561O of the first portion 561 of the first protective layer 560, and a second part 582 that fills a portion of the second recess portion 562O of the second portion 562.

The first part 581 of the surface treatment layer 580 may be disposed within the first recess portion 561O. Accordingly, the first part 581 of the surface treatment layer 580 may be formed to surround a portion of a side surface of the first pad 520P1.

The second part 582 of the surface treatment layer 580 may be disposed within the second recess portion 562O. For example, the second part 582 of the surface treatment layer 580 may be disposed on the first part 581 of the surface treatment layer 580 and the first pad 520P1. For example, the second part 581 of the surface treatment layer 580 may include a second-first part formed on the upper surface of the first pad 520P1 and a second-second part extending from the second-first part in a longitudinal direction and/or a width direction and disposed on the side surface of the first pad 520P1.

For example, the width of the second recess portion 562O of the second portion 562 of the first protective layer 560 is greater than the width of the first pad 520P1 and the first recess portion 561O. Accordingly, the second part 582 of the surface treatment layer 580 may be disposed on the first pad 520P1 and have a shape that extends in the longitudinal or width direction. Additionally, corresponding to the surface treatment layer in the fifth embodiment, the upper surface of the second part 582 of the surface treatment layer 580 may include a curved surface. For example, a height of an upper surface of the second part 582 of the surface treatment layer 580 may decrease in a direction from a center to an edge.

FIG. 9A is a diagram showing a circuit board according to a seventh embodiment, FIG. 9B is a diagram specifically showing a shape of a first pad of FIG. 9A, and FIG. 9C is a diagram showing an optical micrograph of a shape of a first pad and a surface treatment layer according to FIG. 9B.

Referring to FIGS. 9A and 9C, the circuit board according to the seventh embodiment includes a first insulating layer 611, and a first circuit pattern layer including a first pad 620P1, a second pad 620P2 and a trace 620T disposed on the first insulating layer 611.

Additionally, a first protective layer 660 is formed on the first insulating layer 611.

The first protective layer 660 is disposed on the first insulating layer 611 and includes a first portion 661 including a first recess portion 661O. At this time, a width of the first recess portion 661O may correspond to a width of the first pad 620P1. For example, the first recess portion 661O may have the same width as the first pad 620P1. At this time, the first recess portion 661O is not artificially formed in the first protective layer 660. That is, the first recess portion 661O is not formed through the exposure and development process of the first protective layer 660. For example, a first protective layer 660 is formed on the first insulating layer 611 in a state in which the first pad 620P1 is formed. Accordingly, the first recess portion 661O of the first portion 661 may mean a through hole through which the first pad 620P1 passes. For example, the first recess portion 661O of the first portion 661 may mean a region in which the first portion 661 is not disposed among the upper regions of the first insulating layer 611, specifically, a region vertically overlapping with the first pad 620P1.

At this time, a thickness of the first portion 661 of the first protective layer 660 may be smaller than a thickness of the first pad 620P1. For example, an upper surface of the first portion 661 of the first protective layer 660 may be located lower than an upper surface of the first pad 620P1. At this time, if the upper surface of the first portion 661 of the first protective layer 660 is higher than the upper surface of the first pad 620P1, or the thickness of the first portion 661 of the first protective layer 660 is greater than the thickness of the first pad 620P1, a surface treatment layer 680 described below may not include the second part 682, and as a result, the bonding area with the solder does not increase, and thus the bonding force with the solder may decrease.

Meanwhile, a second portion 662 is formed on the first portion 661 of the first protective layer 660. The second portion 662 may include a second recess portion 662O having a width greater than the width of the first pad 620P1 and the first recess portion 661O of the first portion 661 of the first protective layer 660.

Additionally, a surface treatment layer 680 is disposed on the first pad 620P1.

At this time, the surface treatment layer 680 may be formed to fill a portion of the second recess portion 661O. That is, the width of the first recess portion 661O is the same as the width of the pad 620P1, and accordingly, the surface treatment layer 580 may not include parts disposed within the first recess portion 661O.

The surface treatment layer 680 may be disposed within the second recess portion 662O. For example, the surface treatment layer 680 may be disposed on the first pad 620P1 and extend or expand in a longitudinal or width direction from the side of the first pad 620P1.

Additionally, an upper surface of the surface treatment layer 680 may include a curved surface. For example, a height of the upper surface of the surface treatment layer 680 may decrease in direction from the center to the edge.

For example, the surface treatment layer 680 includes a first region that vertically overlaps the first pad 620P1 and a second region that does not vertically overlap the first pad 620P1. Additionally, a height of the upper surface of the surface treatment layer 680 may decrease from the first region to the second region.

At this time, in FIG. 9A, the surface treatment layer 680 is shown to be formed filling only the second recess portion 661O of the first protective layer 660. For example, in FIG. 9A, there is no separation space between the first recess portion 661O of the first protective layer 660 and the first pad 620P1, and accordingly, the surface treatment layer 680 is shown as including only the second part.

Alternatively, referring to FIG. 9B, as described in the previous embodiment, an etching process of the first pad 620P1 to remove debris from the first protective layer 660 is performed after the recess portion is formed in the first protective layer 660.

Accordingly, an upper surface 620P1T of the first pad 620P1 may have a curved surface as it is removed in the etching process. Additionally, at least a portion of a side surface of the first pad 620P1 horizontally overlaps the second recess portion 662O, and thus may be removed together in the etching process. At this time, as described in the previous embodiment, a portion of the side surface of the first pad 620P1 covered by the first portion 661 of the first protective layer 660 is etched as the etchant penetrates in the etching process. Accordingly, a depression is formed on the side surface 620P1S of the first pad 620P1. For example, a depression is formed on a side surface of the first pad 620P1 that horizontally overlaps the first portion 661 of the first protective layer 660. Additionally, the first portion 661 of the first protective layer 660 and the side surface of the first pad 620P1 may be spaced apart at a certain distance due to the depression.

For example, the first portion 661 of the first protective layer 660 may include a first-first portion 661a adjacent to the upper surface of the first insulating layer 611 and covering a side surface of the first pad 620P1. At this time, the first-first portion 661a may not overlap horizontally with the depression formed in the first pad 620P1.

Additionally, the first portion 661 of the first protective layer 660 may include a first-second portion 661b spaced apart from the side surface of the first pad 620P1. For example, the first-second portion 661b of the first protective layer 660 may horizontally overlap the depression of the first pad 620P1. Additionally, a width of the first pad 620P1 in a region where the depression is formed may be smaller than the width of the first recess portion 661O of the first portion 661 of the first protective layer 660.

In addition, the surface treatment layer 680 may include a first part 680r that fills the first recess portion 661O of the first-second portion 661b of the first protective layer 660 corresponding to the depression.

At this time, in the comparative example, the thickness of the surface treatment layer was about 3 um, and accordingly, the surface treatment layer was formed to fill only the depression formed in the first pad. Accordingly, in the comparative example, the metal contact layer, which is a bonding layer with solder formed on the surface treatment layer, and an upper edge of the first portion of the first protective layer had substantially the same height, and as a result, there were problems with the physical and electrical reliability of the metal bonding layer.

Unlike this, in the embodiment, the surface treatment layer 680 has a thickness of at least 4 um, so that the surface treatment layer 680 fills the depression and has a shape that expands in upper and side directions. Accordingly, in the embodiment, the distance between the upper edge portion of the first portion of the first protective layer and the metal bonding layer may be further apart compared to the comparative example, and accordingly, the physical and electrical reliability of the metal bonding layer can be improved.

The circuit board according to the embodiment includes a first protective layer having a recess portion including a step, and a second metal layer disposed in the recess portion. For example, the recess portion includes a first recess portion that vertically overlaps the pad, which is the first metal layer, and has a first width, and a second recess portion formed on the first recess portion and having a second width greater than the first width. At this time, the second metal layer may be a bump or, alternatively, may be a surface treatment layer. In addition, the second metal layer includes a first part disposed in the first recess portion and a second part disposed in the second recess portion. At this time, the second part has a width greater than a width of the first part. Accordingly, the embodiment may form a metal layer including the first part and the second part as described above using the recess portion of the first protective layer having the step. According to the embodiment, the recess portion may include only a second recess portion, and the second metal layer may include only the second part disposed in the second recess portion. Through this, the embodiment can increase a bonding area with a solder for bonding to a chip or an external board, and thus improve bonding properties. Specifically, the first protective layer in the comparative example does not include a step and therefore includes only the first recess portion. Accordingly, the second metal layer (e.g., bump) in the comparative example includes only the first part having a width corresponding to the first recess portion, as a result, the bonding area with the solder decreases, causing a problem in that bonding properties deteriorate. On the other hand, compared to the comparative example, the embodiment can improve the bonding area with the solder by the difference in width between the first part and the second part, and thus improve bonding properties.

Meanwhile, a comparative example has a structure in which the second metal layer includes the second part. However, the second part of the comparative example has a structure that protrudes on an upper surface of the first protective layer. That is, the second part of the second metal layer in the comparative example has a structure disposed on the upper surface of the first protective layer. Accordingly, when the second metal layer includes a second part, the comparative example has a problem in that the overall thickness of the circuit board increases by the thickness corresponding to the second part. In contrast, the embodiment may use a first protective layer having a step to form the second part of the second metal layer within the first protective layer. Accordingly, the embodiment can improve adhesion with the solder without affecting the overall thickness of the circuit board, and thus improve product satisfaction.

Additionally, the embodiment allows various designs of the second metal layer through changes in the width of the first recess portion. For example, the first recess portion may be smaller, alternatively greater, or alternatively same as a width of the pad. Furthermore, the first recess portion may partially have a width equal to the width of the pad and partially have a width greater than the width of the pad. Accordingly, the embodiment can be applied to various types that the recess portion of the first protective layer must have, and thus the degree of freedom in product design can be improved.

Additionally, in an embodiment, a depression is formed on the pad. The depression may be formed in an etching process to remove debris on the pad after the recess portion of the first protective layer is formed. And, the second metal layer may be formed to fill the depression. Accordingly, the embodiment allows the second metal layer to be formed filling the depression, thus improving the electrical reliability of the pad, which is the first metal layer.

Meanwhile, when the metal layer is a surface treatment layer, the surface treatment layer has a thickness of at least 4 $\mu$m. For example, the surface treatment layer may have a plurality of layer structures (e.g., nickel-palladium-gold or nickel-gold) depending on a surface treatment method. In addition, a total thickness of the surface treatment layer having the plurality of layers may be 4 $\mu$m or more. Accordingly, the embodiment allows the surface treatment layer to stably fill the depression, thereby improving electrical reliability. Specifically, a depth of the depression is at the level of 3 $\mu$m. When the surface treatment layer has a thickness of 3 $\mu$m or less, a problem may occur in which the depression is not completely filled by the surface treatment layer, and as a result, problems may occur in the signal transmission characteristics of the pad. On the other hand, in the embodiment, the surface treatment layer has a thickness of 4 $\mu$m or more, so that the depression is completely filled by the surface treatment layer, thereby improving signal transmission characteristics.

Furthermore, in the embodiment, the surface treatment layer has a thickness of 4 $\mu$m or more, and accordingly, an interface between the first protective layer and the pad and an upper surface of the surface treatment layer can be spaced a certain distance apart. Through this, the embodiment can improve the electrical reliability and physical reliability of a metal contact layer formed as the solder is disposed on the surface treatment layer. Specifically, when the surface treatment layer has a thickness of 3 $\mu$m or less as in the comparative example, the upper surface of the surface treatment layer is formed at a height substantially equal as a height of the interface, and accordingly, the metal contact layer may also be located at a height equal as a height of the interface. At this time, in an environment in which the circuit board is used, expansion and contraction of the first protective layer may occur, and resulting stress may occur. At this time, in the comparative example, since the interface and the metal contact layer are formed at the same height, the stress is directly transmitted to the metal contact layer, and as a result, the physical and electrical reliability of the metal contact layer may deteriorate. In contrast, in the embodiment, the surface treatment layer is formed to have a thickness of 4 $\mu$m or more, so that the interface and the metal contact layer can be spaced a certain distance apart, and accordingly, the stress can be prevented from being transmitted to the metal contact layer. Through this, the embodiment can improve the electrical reliability and physical reliability of metal contact layer, and further improve product reliability.

Before describing the package substrate of the present application, the circuit board of the embodiment may have any one of the structures shown in FIGS. 3A to 9B.

Additionally, the circuit board of the embodiment may have a combined structure in which structures included in at least two of the structures in FIGS. 3A to 9B are combined. For example, a bump according to any one of the first to fourth embodiments may be formed on at least one first pad among the plurality of pads of the first circuit pattern layer of the circuit board, and a bump having a different structure from the bump formed on the first pad may be formed on the other second pad. For example, a surface treatment layer according to any one of the fifth to seventh embodiments may be formed on at least one first pad among the plurality of pads of the first circuit pattern layer of the circuit board, and a surface treatment layer having a different structure from the surface treatment layer formed on the first pad may be formed on the other second pad. For example, a bump according to any one of the first to fourth embodiments may be formed on at least one first pad among the plurality of pads of the first circuit pattern layer of the circuit board, and a surface treatment layer according to any one of the fifth to seventh embodiments may be formed on the other second pad.

However, hereinafter, for convenience of explanation, the first package substrate formed using the circuit board shown in FIG. 3A and the second package substrate formed using the circuit board shown in FIG. 7A will be described.

—Package Substrate—

Hereinafter, a package substrate according to an embodiment will be described.

FIG. 10 is a diagram showing a package substrate according to a first embodiment, and FIG. 11 is a diagram showing a package substrate according to a second embodiment.

Referring to FIG. 10, the first package substrate may have a structure in which at least one chip is mounted on the circuit board of the first embodiment.

At this time, the first package substrate may include a surface treatment layer 190. The surface treatment layer 190 may be disposed on the upper surface of the bump 180 included in the circuit board. As described above, the surface treatment layer 190 may have a thickness of 4 um or more, and accordingly its upper surface may have a curved surface. However, the surface treatment layer 190 disposed on the bump 180 may not be required to have a thickness of 4 um or more, and therefore may have a thickness of 3 um or less as in the comparative example.

The first package substrate may include a first connection part 710 formed on the surface treatment layer 190. The first connection part 710 may have a spherical shape. For example, a cross section of the first connection part 710 may include a circular shape or a semicircular shape. For example, a cross section of the first connection part 710 may include a partially or entirely rounded shape. The cross-sectional shape of the first connection part 710 may be flat on one side and curved on the other side. The first connection part 710 may be a solder ball.

A chip 720 may be disposed on the first connection part 710. The chip 720 may be a processor chip. For example, the chip 720 may be an application processor (AP) chip of any one of a central processor (e.g., CPU), graphics processor (e.g., GPU), digital signal processor, cryptographic processor, microprocessor, and microcontroller.

At this time, a terminal 725 may be included on the lower surface of the chip 720, and the terminal 725 may be electrically connected to the first circuit pattern layer 120 of the circuit board through the first connection part 710.

Meanwhile, the package substrate of the embodiment may allow a plurality of chips to be arranged at a certain distance from each other on one circuit board. For example, the chip 720 may include a first chip and a second chip that are spaced apart from each other.

Also, the first chip and the second chip may be different types of application processor (AP) chips.

Meanwhile, the first chip and the second chip may be spaced apart from each other at a certain distance on the circuit board. For example, the distance between the first chip and the second chip may be 150 μm or less. For example, the distance between the first chip and the second chip may be 120 μm or less. For example, the distance between the first chip and the second chip may be 100 μm or less.

Preferably, for example, the distance between the first chip and the second chip may range from 60 um to 150 um. For example, the distance between the first chip and the second chip may range from 70 μm to 120 μm. For example, the distance between the first chip and the second chip may range from 80 um to 110 um. For example, if the distance between the first chip and the second chip is less than 60 um, interference between the first chip and the second chip may cause problems with the operational reliability of the first chip or the second chip. For example, if the distance between the first chip and the second chip is greater than 150 um, signal transmission loss may increase as the distance between the first chip and the second chip increases.

The package substrate may include a molding layer 730. The molding layer 730 may be disposed to cover the chip 720. For example, the molding layer 730 may be EMC (Epoxy Mold Compound) formed to protect the mounted chip 720, but is not limited thereto.

At this time, the molding layer 730 may have a low dielectric constant to increase heat dissipation characteristics. For example, the dielectric constant (Dk) of the molding layer 730 may be 0.2 to 10. For example, the dielectric constant (Dk) of the molding layer 730 may be 0.5 to 8. For example, the dielectric constant (Dk) of the molding layer 730 may be 0.8 to 5. Accordingly, the embodiment allows the molding layer 730 to have a low dielectric constant, thereby improving heat dissipation characteristics for heat generated from the chip 720.

Meanwhile, the package substrate may include a second connection part 740 disposed on a lowermost side of the circuit board. The second connection part 740 may be for bonding between the package substrate and an external substrate (e.g., a main board of an external device).

Referring to FIG. 11, the second package substrate may have a structure in which at least one chip is mounted on the circuit board of the fifth embodiment.

At this time, the second package substrate may include a first connection part 810 formed on the surface treatment layer 480.

A chip 820 may be placed on the first connection part 810. The chip 820 may be a processor chip. For example, the chip 820 may be an application processor (AP) chip of any one of a central processor (e.g., CPU), graphics processor (e.g., GPU), digital signal processor, cryptographic processor, microprocessor, and microcontroller.

At this time, a terminal 825 may be included on a lower surface of the chip 820, and the terminal 825 can be electrically connected to the first circuit pattern layer 420 of the circuit board through the first connection part 810.

The package substrate may include a molding layer 830. The molding layer 830 may be disposed to cover the chip 820.

Meanwhile, the package substrate may include a second connection part 840 disposed on a lowermost side of the circuit board. The second connection part 840 may be for bonding between the package substrate and an external substrate (e.g., a main board of an external device).

—Manufacturing Method—

Hereinafter, a method of manufacturing a circuit board according to an embodiment will be described. For example, hereinafter, a method of manufacturing a circuit board for some of the first to seventh embodiments will be described.

FIGS. 12A to 12I are diagrams showing a circuit board manufacturing method according to an embodiment in order of processes, and FIGS. 13A to 13D are diagrams showing a circuit board manufacturing method according to another embodiment in order of processes. At this time, the circuit board of another embodiment not described below can be easily manufactured by controlling the conditions of the exposure and development process in a process of forming the recess portion of the first protective layer and changing the shape of the recess portion. In addition, the following description will focus on the manufacturing method of the outermost layer of the circuit board.

Referring to FIG. 12A, the embodiment proceeds with a process of disposing the first insulating layer 111 and a process of forming the first circuit pattern layer 120 on the first insulating layer 111. At this time, the first circuit pattern layer 120 may include at least one pad and a trace connected to the pad.

Next, referring to FIG. 12B, the embodiment proceeds with a process of forming a first protective layer 160 on the first insulating layer 111. At this time, the first protective layer 160 may be disposed on the first insulating layer 111 and the first circuit pattern layer 120.

Specifically, the first protective layer 160 may be formed to entirely cover an upper surface of the first insulating layer 111 and an upper surface of the first circuit pattern layer 120. For example, the first protective layer 160 may not include a recess portion.

Next, as shown in FIG. 12C, the embodiment may proceed with a process of primary exposing the first protective layer 160 using an exposure mask (not shown). The primary exposure process may be performed based on a region of the entire region of the first protective layer 160 that vertically overlaps the pad of the first circuit pattern layer 120. For example, the primary exposure process may be performed on a region of the entire region of the first protective layer 160 that does not vertically overlap a region where the second recess portion 162O will be formed. Accordingly, the region vertically overlapping the pad of the first circuit pattern layer 120 is exposed through the primary exposure process, and a region where the second recess portion 162O will be formed may not be exposed. Specifically, remaining regions of the entire region of the first protective layer 160 excluding the region 160E1 where the second recess portion 162O will be formed may be exposed and cured through the primary exposure process. At this time, a portion that receives light through the primary exposure process (for example, the remaining regions excluding the region 160E1) is cured, and accordingly, thinning is not performed in a subsequent development process.

Next, as in FIG. 12D, the embodiment may proceed with a process of forming a second recess portion 162O that opens the region 160E1 by performing the first development process to develop the region 160E1. The first development process may include a process of thinning the region (160E1) where the exposure and curing have not occurred, using organic alkaline compounds containing tetramethylammonium hydroxide (TMAH) or trimethyl-2-hydroxyethylammonium hydroxide (choline). At this time, the embodiment may adjust the depth of the second recess portion 162O by adjusting conditions such as the development process time. For example, the embodiment does not develop the entire region 160E1, but may proceed with the process of forming a second recess portion 162O that opens a portion of the region 160E1 by adjusting development conditions.

Next, as shown in FIG. 12E, the embodiment may proceed with a secondary exposure process. That is, in the primary exposure, the region 160E1 was not exposed and thus thinning occurred in the first development process. And, in the embodiment, a secondary exposure process is performed on the region (160E1). For example, the embodiment may proceed with a process of exposing and developing the remaining regions of the region 160E1 except for the region 160E2 where the first recess portion 161O will be formed.

Next, as shown in FIG. 12F, the embodiment may proceed with a secondary development process. The secondary development process may include a process of thinning a region (160E2) that has not been exposed or cured in the secondary exposure process using organic alkaline compounds containing tetramethylammonium hydroxide (TMAH) or trimethyl-2-hydroxyethylammonium hydroxide (choline). Accordingly, a first recess portion 161O that vertically overlaps the second recess portion 162O may be formed in the first insulating layer 111 through the secondary development process. Also, the first recess portion 161O is smaller than the width of the second recess portion 162O. Through this, the recess portion formed in the first protective layer 160 may have a stepped structure.

Next, as shown in FIG. 12G, the embodiment may proceed with a process of etching the upper surface of the first circuit pattern layer 120 that vertically overlaps the recess portion of the first protective layer 160. For example, a region of the upper surface of the first circuit pattern layer 120 that overlaps vertically with the first recess portion 161O of the first protective layer 160 is a region where bumps or surface treatment layers are placed. At this time, debris may exist on the upper surface of the first circuit pattern layer 120 vertically overlapping the first recess portion 161O due to the first protective layer 160 not being completely removed. In addition, the embodiment proceeds with a process of etching the upper surface of the first circuit pattern layer 120 vertically overlapping the first recess portion 161O, so that the debris can be removed.

At this time, a depression 120r is formed on the upper surface of the first circuit pattern layer 120 vertically overlapping the first recess portion 161O by the etching process. The etching process may be performed by chemical etching or physical etching, but is not limited thereto.

At this time, when the upper surface of the first circuit pattern layer 120 vertically overlapping the first recess portion 161O is etched using an etchant, the etchant may penetrate into the upper surface of the first circuit pattern layer 120 that does not vertically overlap the first recess portion 161O. For example, the etchant may penetrate between the first protective layer 160 and the upper surface of the first circuit pattern layer 120, and accordingly, the depression 120r may also be formed on the upper surface of the first circuit pattern layer 120 that does not vertically overlap the first recess portion 161O.

Next, as shown in FIG. 12H, the embodiment may proceed with a process of forming bumps 180 that fill the first recess portion 161O and the second recess portion 162O of the first protective layer 160. For this purpose, the embodiment may proceed with a process of forming a seed layer (not shown) on the upper surface of the first protective layer 160 and the inner walls of the recess portions, and a process of forming an electrolytic plating layer that fills the first recess portion 161O and the second recess portion 162O of the first protective layer 160 by performing electrolytic plating on the seed layer. Accordingly, the bump 180 may include a first part 181 filling the first recess portion 161O of the first protective layer 160 and a second part 182 that fills the second recess portion 162O. Additionally, the bump 180 may further include a third part 180r that fills the depression 120r formed on the upper surface of the first circuit pattern layer 120. The third part 180r may include a third-first part 180r1 vertically overlapping with the first part 181 and a third-second part 180r2 that does not vertically overlap the first part 181.

Meanwhile, a process of forming the surface treatment layer 480 may be performed instead of the process of forming the bumps 180 after performing the process as shown in FIGS. 12A to 12G. The surface treatment layer 480 is formed to fill the depression 120r, and the surface treatment layer 480 is formed to have a thickness of 4 um or more, and accordingly, the surface treatment layer may be formed to fill the depression 120r and the recess portions of the protective layer.

Additionally, in the manufacturing process, a circuit board having a structure corresponding to various embodiments of the present disclosure may be manufactured through adjustment of the exposure region in the primary exposure process and the secondary exposure process.

Meanwhile, referring to FIG. 13A, the embodiment may proceed with a process of forming the first circuit pattern layer 620 on the first insulating layer 611 and a process of forming the first protective layer 660 on the first insulating layer 611 and the first circuit pattern layer 620. Next, the embodiment may proceed with the process of primary exposure of the first protective layer 660. That is, the embodiment may proceed with a process of exposing and curing the remaining regions except the region 660E where the second recess portion 662O will be formed.

Next, referring to FIG. 13B, the embodiment may proceed with a process of developing the region 660E to form a second recess portion 662O. At this time, a bottom surface of the second recess portion 662O may be located lower than the first circuit pattern layer 620.

Next, referring to FIG. 13C, the embodiment may proceed with a process of etching the surface of the first circuit pattern layer 620 vertically overlapping the second recess portion 662O. And, a depression is formed on the side surface 620P1S of the first circuit pattern layer 620 through the etching process. For example, the depression formed on the side surface 620P1S may horizontally overlap the first recess portion 661O of the first protective layer 660.

Next, referring to FIG. 13D, the embodiment may proceed with the process of forming the surface treatment layer 680. The surface treatment layer 680 may fill the first part 680r disposed between the depression and the first recess portion 661O of the first protective layer 660. Furthermore, the surface treatment layer may be horizontally expanded and disposed on the first part 680r to fill a portion of the second recess portion 662O of the first protective layer 660.

The characteristics, structures and effects described in the embodiments above are included in at least one embodiment but are not limited to one embodiment. Furthermore, the characteristics, structures, and effects and the like illustrated in each of the embodiments may be combined or modified even with respect to other embodiments by those of ordinary skill in the art to which the embodiments pertain. Thus, it should be construed that contents related to such a combination and such a modification are included in the scope of the embodiment.

The above description has been focused on the embodiment, but it is merely illustrative and does not limit the embodiment. A person skilled in the art to which the embodiment pertains may appreciate that various modifications and applications not illustrated above are possible without departing from the essential features of the embodiment. For example, each component particularly represented in the embodiment may be modified and implemented. In addition, it should be construed that differences related to such changes and applications are included in the scope of the embodiment defined in the appended claims.

The invention claimed is:

1. A circuit board comprising:
an insulating layer;
a circuit pattern layer including a first metal layer disposed on the insulating layer;
a protective layer disposed on the insulating layer, vertically overlapping the first metal layer, and including a recess portion having a step in a horizontal direction; and
a second metal layer disposed in the recess portion of the protective layer,
wherein the recess portion includes a portion having a width greater than a width of the first metal layer, and
wherein the second metal layer is disposed in the portion of the recess portion with a width greater than the width of the first metal layer,
wherein the first metal layer includes a depression vertically overlapping the recess portion and concave toward the insulating layer, and
wherein at least a portion of the second metal layer is disposed in the depression of the first metal layer.

2. The circuit board of claim 1, wherein the recess portion includes:
a first recess portion located adjacent to the first metal layer and having a first width, and
a second recess portion disposed on the first recess portion and having a width greater than the first width and the width of the first metal layer,
wherein the second metal layer includes:
a first part disposed in the first recess portion, and
a second part disposed in the second recess portion and having a width greater than widths of the first part and the first metal layer.

3. The circuit board of claim 2, wherein the first recess portion has a width equal to or smaller than the width of the first metal layer.

4. The circuit board of claim 2,
wherein the second metal layer includes a third part disposed in the depression of the first metal layer.

5. The circuit board of claim 4, wherein the third part of the second metal layer includes:
a third-first part vertically overlapping a region exposed through the recess portion of the first metal layer; and
a third-second part vertically non-overlapping with a region exposed through the recess portion of the first metal layer.

6. The circuit board of claim 2, wherein the first metal layer is a pad,
wherein the first circuit pattern layer includes a trace disposed adjacent to the pad, and
wherein the second part of the second metal layer includes an overlapping region that vertically overlaps the trace.

7. The circuit board of claim 2, wherein the first recess portion includes a bottom surface having a width greater than the width of the first metal layer and positioned lower than an upper surface of the first metal layer, wherein the protective layer is spaced apart from the first metal layer, and wherein the first part of the second metal layer contacts at least a portion of a side surface of the first metal layer.

8. The circuit board of claim 7, wherein the bottom surface of the first recess portion is positioned higher than an upper surface of the insulating layer.

9. The circuit board of claim 1, wherein the first metal layer is a pad, and wherein the second metal layer is a bump or surface treatment layer disposed on the pad.

10. A circuit board comprising:

an insulating layer;

a circuit pattern layer including a pad disposed on the insulating layer;

a protective layer disposed on the insulating layer, vertically overlapping the pad and including a recess portion having different widths along a vertical direction; and a surface treatment layer disposed in the recess portion of the protective layer, wherein an upper surface of the surface treatment layer includes a region whose height decreases from a center of the recess portion toward an edge of the recess portion, and wherein at least a portion of a lower surface of the surface treatment layer is located lower than an upper surface of the pad.

11. The circuit board of claim 10, wherein the surface treatment layer has a width greater than a width of the pad, wherein the surface treatment layer includes an overlapping region that overlaps vertically with the pad and a non-overlapping region that do not overlap vertically with the pad.

12. The circuit board of claim 10, wherein the protective layer includes:

a first recess portion provided adjacent to the pad and vertically overlapping the pad; and, a second recess portion disposed on the first recess portion, vertically overlapping the first recess portion and the pad, and having a width greater than a width of the first recess portion, wherein the surface treatment layer includes:

a first part disposed in the first recess portion, and a second part disposed in the second recess portion and having a width greater than a width of the first part.

13. The circuit board of claim 12, wherein the first recess portion has a width smaller than the width of the pad, wherein the second recess portion has a width greater than the width of each of the first recess portion and the pad.

14. The circuit board of claim 12, wherein the pad includes a depression vertically overlapping the first recess portion and concave toward the insulating layer, and wherein the surface treatment layer includes a third part disposed in the depression of the pad.

15. The circuit board of claim 14, wherein the third part of the surface treatment layer includes:

a third-first part vertically overlapping with the first part; and a third-second part that does not vertically overlap the first part.

16. The circuit board of claim 12, wherein the first recess portion has a width greater than the width of the pad, wherein the first portion of the protective layer is spaced apart from the pad, and wherein the first part of the surface treatment layer contacts at least a portion of a side surface of the pad.

17. The circuit board of claim 12, wherein an upper surface of the first portion of the protective layer is located lower than the upper surface of the pad, wherein the first recess portion has a width equal to the width of the pad, wherein the pad includes a depression that overlaps horizontally with the first recess portion and is formed in the inner direction of the pad, and wherein the first part of the surface treatment layer is disposed in the depression.

18. The circuit board of claim 11, wherein the surface treatment layer has a thickness of 4 μm or more, wherein at least a portion of an upper surface of the surface treatment layer includes a curved surface, and wherein a thickness of the surface treatment layer is at least one of a minimum thickness, maximum thickness and average thickness in the overlapping region of the surface treatment layer.

19. A semiconductor package comprising:

an insulating layer;

a circuit pattern layer including a pad disposed on the insulating layer;

a protective layer disposed on the insulating layer to overlap the pad in a vertical direction and including a recess portion having a step of different widths along the vertical direction;

a metal layer disposed in the recess portion of the protective layer and having a step corresponding to the step of the recess portion;

a connection part disposed on the metal layer;

a chip mounted on the connection part; and a molding layer for molding the chip, wherein the recess portion includes:

a first recess portion vertically overlapping the pad and having a first width; and a second recess portion vertically overlapping the first recess portion and having a second width greater than the first width, wherein the metal layer includes a first part disposed in the first recess portion and a second part disposed in the second recess portion, and wherein at least a portion of a lower surface of the metal layer is located lower than at least a portion of an upper surface of the pad.

20. The semiconductor package of claim 19, wherein the chip include a first chip and a second chip that are spaced apart from each other in a width direction or arranged in the vertical direction.

* * * * *